(12) United States Patent
Asano

(10) Patent No.: US 7,514,727 B2
(45) Date of Patent: Apr. 7, 2009

(54) ACTIVE ELEMENT AND SWITCHING CIRCUIT DEVICE

(75) Inventor: Tetsuro Asano, Gunma (JP)

(73) Assignee: SANYO Electric Co., Ltd., Osaka (JP)

( * ) Notice: Subject to any disclaimer, the term of this patent is extended or adjusted under 35 U.S.C. 154(b) by 73 days.

(21) Appl. No.: 11/390,434

(22) Filed: Mar. 28, 2006

(65) Prior Publication Data

US 2006/0249752 A1 Nov. 9, 2006

(30) Foreign Application Priority Data

| Mar. 28, 2005 | (JP) | ............................ 2005-092869 |
| Mar. 28, 2005 | (JP) | ............................ 2005-092874 |
| Mar. 28, 2005 | (JP) | ............................ 2005-092875 |
| Jan. 19, 2006 | (JP) | ............................ 2006-011310 |

(51) Int. Cl.
*H01L 29/737* (2006.01)

(52) U.S. Cl. ............... 257/197; 257/378; 257/E29.188

(58) Field of Classification Search ................ 257/133, 257/134, 192, 194, 195, 197, 198, 273, 378, 257/E29.188
See application file for complete search history.

(56) References Cited

U.S. PATENT DOCUMENTS

| 4,396,932 | A | * | 8/1983 | Alonas et al. ............... 257/110 |
| 5,012,318 | A | * | 4/1991 | Honjo ........................ 257/195 |
| 5,250,826 | A | * | 10/1993 | Chang et al. ................ 257/273 |
| 6,063,655 | A | * | 5/2000 | Shealy et al. ............... 438/170 |
| 2005/0045911 | A1 | * | 3/2005 | Hill et al. .................... 257/192 |
| 2005/0174178 | A1 | * | 8/2005 | Yamazaki et al. ............ 330/298 |

FOREIGN PATENT DOCUMENTS

| JP | 8-213891 | 8/1996 |
| JP | 2000-260782 | 9/2000 |

* cited by examiner

*Primary Examiner*—Evan Pert
*Assistant Examiner*—W. Wendy Kuo
(74) *Attorney, Agent, or Firm*—Morrison & Foerster LLP

(57) ABSTRACT

A unit HBT and a unit FET are arranged to be adjacent to each other through an isolation region and a base electrode of the unit HBT is connected to a source electrode of the unit FET to form a unit element, and a plurality of unit elements are connected to form an active element. This makes it possible to implement the active element in which a current is not likely to concentrate on the unit element and no destruction is generated by the second breakdown. Moreover, although a buried gate electrode structure is used to ensure a withstand pressure in the unit FET, a buried portion is structured not to be diffused to an InGaP layer, and thereby it is possible to prevent Pt from being abnormally diffused. Furthermore, a selection etching can be used for a formation of an emitter mesa, that of a base mesa, that of a ledge in the unit HBT, and a gate recess etching in the unit FET, and a good reproducibility can be obtained.

12 Claims, 26 Drawing Sheets

Gain : $h_{FE} \times gm$

On-resistance Ron at Forward transistor $= \Delta V_{CE}/\Delta I_C$
On-resistance Ron' at Reverse transistor $= \Delta V_{CE}'/\Delta I_C'$ Prior Art

ACTIVE ELEMENT AND SWITCHING CIRCUIT DEVICE

BACKGROUND OF THE INVENTION

1. Field of the Invention

The present invention relates to an active element having a heterojunction bipolar transistor and a switching circuit device, and particularly relates to a temperature-compensation active element and a switching circuit device.

2. Background of the Related Art

A heterojunction bipolar transistor (hereinafter referred to as HBT) has a higher emitter efficiency and a higher current amplification factor $h_{FE}$ as compared with a general homojunction bipolar transistor, and thereby it is possible to largely increase a base impurity density and equalize a transistor operation over an entirety of the base. As a result, as compared with a GaAs MESFET (Metal Semiconductor Field Effect Transistor), a GaAs JFET (Junction FET), and a HEMT (High Electron Mobility Transistor), a current density is high and an on-resistance is low to offer excellent results in an efficiency, a gain characteristic and a distortion characteristic.

A small-sized high frequency switching element with a high-efficiency is indispensable for mobile communication equipment such as a cellular phone or the like. Then, as illustrated in FIGS. 26A and 26B, there has been known a switching circuit using a bidirectional HBT as a switching element.

FIGS. 26A and 26B illustrate an example of a switching circuit using the HBT as the switching element. FIG. 26A is a circuit diagram, and FIG. 26B is a cross-sectional view illustrating a structure of the HBT.

As illustrated in FIG. 26A, this circuit includes a first HBT 320 where an emitter is connected to an antenna ANT and a second HBT 321 where a collector is connected to the antenna ANT, and a collector of the first HBT 320 is connected to a transmitting circuit Tx. Moreover, an emitter of the second HBT 321 is connected to a receiving circuit Rx, bases of the HBTs 320 and 321 are connected to a transmitting control terminal CtrlTx and a receiving control terminal CtrlRx through a resistor 322, respectively.

As illustrated in FIG. 26B, an n type GaAs subcollector layer 311 is formed on a semi-insulating GaAs substrate 310, an n type AlGaAs collector layer 312, a p type GaAs base layer 313, an n type AlGaAs emitter layer 314, and an n type GaAs emitter contact layer 315 are grown on the subcollector layer 311 in a mesa shape.

On a surface of the subcollector layer 311, a collector electrode 316 is placed at a position where the collector layer 312 is interposed therebetween. On a surface of the base layer 313, a base electrode 317 is placed at a position where the emitter layer 314 is interposed therebetween. An emitter electrode 318 is arranged on an upper portion of the emitter contact layer 315. The HBT of a minimum unit illustrated in the FIG. 26B is used as a unit element 320' (321') and these elements are connected in parallel to form the first HBT 320 (second HBT 321) as the active element. This technology is described for instance in Japanese Patent Application Publication No. 2000-260782

The emitter electrode 318, the base electrode 317 and the collector electrode 316 of the HBT are formed in a comb-tooth shape. Then, the structure shown in FIG. 26B is used as one unit element, and a plurality of unit elements are connected in parallel to form an active element such as a switching element.

In the HBT, since a current between the base and the emitter has a positive temperature coefficient, a collector current also has a positive temperature coefficient. Accordingly, when a base current is increased to improve a current density, the current concentrates on one unit element of the plurality of unit elements of the HBT connected in parallel to cause a secondary breakdown and easily lead to destruction of the HBT.

Conventionally, there was a problem in which the current density could not be sufficiently improved to avoid occurrence of a reliability problem.

Moreover, in general, measures in which an emitter ballast resistor or a base ballast resistor is inserted into the comb-tooth like unit element 320' of the HBT 320 are always taken in order to solve this problem. However, the insertion of the emitter ballast resistor or the base ballast resistor causes a new problem in which a high frequency characteristic is degraded accordingly.

SUMMARY OF THE INVENTION

The present invention provides an active element that includes a compound semiconductor substrate, a stack of first, second and third semiconductor layers disposed on the substrate, a plurality of unit elements connected in parallel, each of the unit elements comprising a first transistor and a second transistor, the first transistor comprising a collector formed of the first semiconductor layer, a base formed of the second semiconductor layer and an emitter formed of the third semiconductor layer, the second and third semiconductor layers forming a heterojunction, the second transistor formed of the semiconductor layers and comprising a gate, a source and a drain, the first and second transistors being isolated by a isolation region, the base of the first transistor being connected with the source of the second transistor, and the drain of the second transistor being connected with a power supply potential.

The present invention also provides a switching circuit device that includes a compound semiconductor substrate, a stack of first, second and third semiconductor layers disposed on the substrate, a first switching element comprising a plurality of unit elements connected in parallel, a second switching element comprising a plurality of the unit elements connected in parallel, a first RF port connected with the first and second switching elements, a second RF port connected with the first switching element, and a third RF port connected with the second switching element, wherein each of the unit elements comprises a first transistor and a second transistor, the first transistor comprises a collector formed of the first semiconductor layer, a base formed of the second semiconductor layer and an emitter formed of the third semiconductor layer, the second and third semiconductor layers form a heterojunction, the second transistor is formed of the semiconductor layers and comprises a gate, a source and a drain, the first and second transistors are isolated by a isolation region, the base of the first transistor is connected with the source of the second transistor, and the drain of the second transistor is connected with a power supply potential, and the first RF port is connected to all of the collectors or all of the emitters, the second RF port is connected to the collectors or the emitters of the first switching element that are not connected with the first RF port, and the third RF port is connected with the collectors or the emitters of the second switching element that are not connected with the first RF port.

DETAILED DESCRIPTION OF THE PREFERRED EMBODIMENTS

The following will specifically explain embodiments of the present invention using FIGS. 1A to 25B.

Figure 1A:
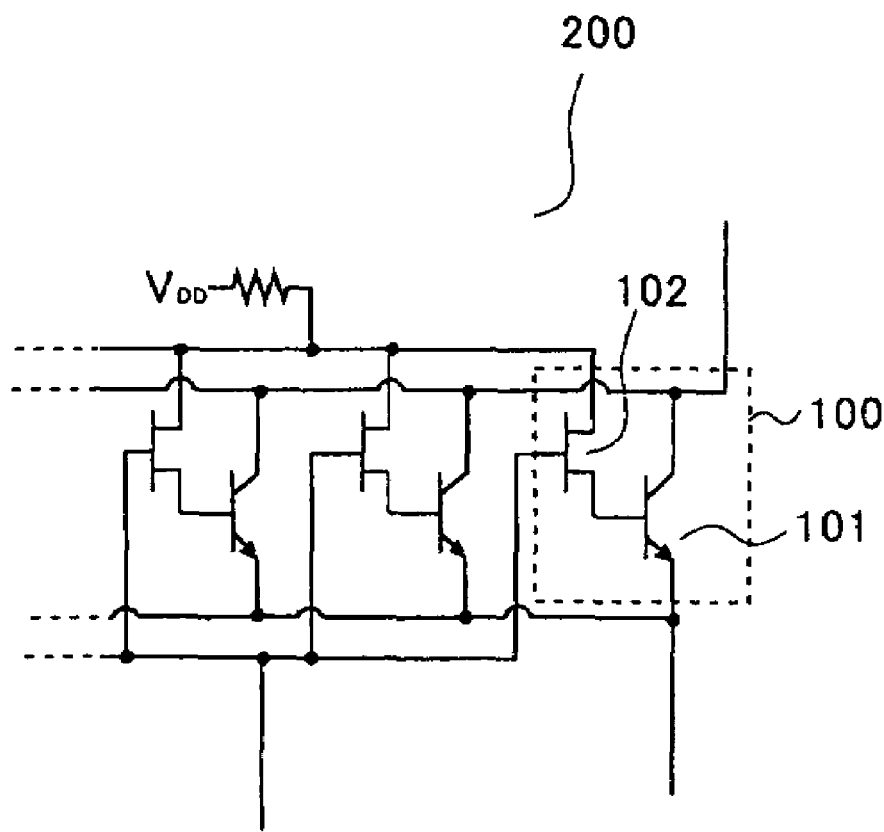
FIGS. 1A and 1B are circuit diagrams for explaining a first embodiment of the present invention.
Figure 1B:
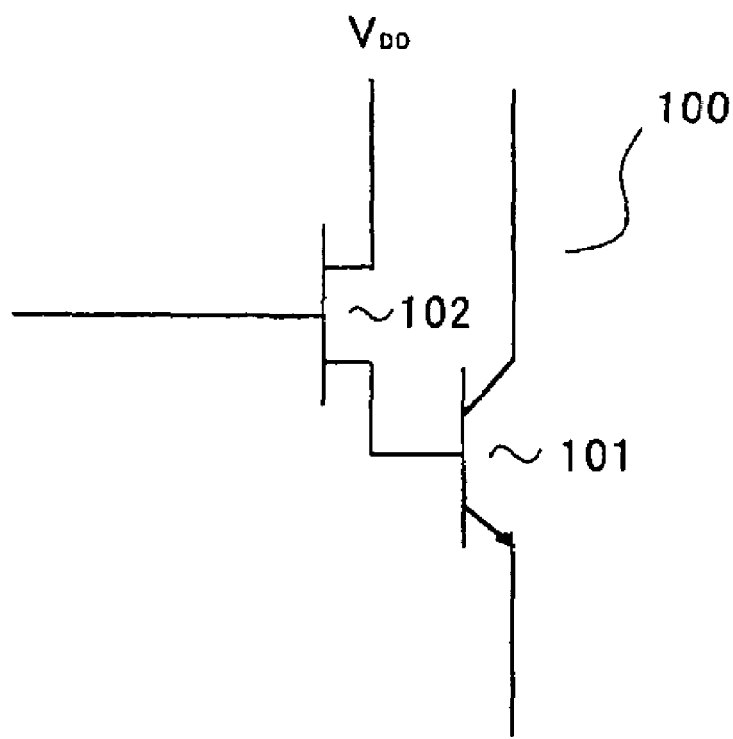

First, an active element of a first embodiment of the present invention will be explained with reference to FIGS. 1A to 5B. FIG. 1A is a circuit diagram of the active element and FIG. 1B is a circuit diagram of a unit element that forms the active element.

As illustrated in FIG. 1A, an active element 200 is one that is formed by connecting a plurality of unit elements 100 (broken line) in parallel. A unit element 100 has a first transistor 101 and a second transistor 102. A substrate is a compound semiconductor substrate. The compound semiconductor substrate is formed by growing a plurality of semiconductor layers on a semi-insulating compound semiconductor substrate to form at least one heterojunction. The first transistor 101 is an HBT in which semiconductor layers, serving as a collector layer, a base layer and an emitter layer, are grown on the semi-insulating compound semiconductor substrate to form at least one heterojunction and a collector electrode, a base electrode and an emitter electrode, each of which is connected to each semiconductor layer, are provided. The HBT has a mesa structure and the first transistor, which is formed in the mesa structure of a minimum unit, is hereinafter referred to as a unit HBT 101 in the present embodiment.

The second transistor 102 is a MESFET (Metal Semiconductor Field Effect Transistor), which is provided on the same substrate as that of the unit HBT 101, uses two semiconductor layers as channel layers, and has a gate electrode, a source electrode and a drain electrode. The second transistor 102, which is formed in a minimum unit of the respective electrodes, is hereinafter referred to as a unit FET 102 in the present embodiment. The unit FET 102 is a driving transistor for supplying a base current to the unit HBT 101.

The unit HBT 101 and the unit FET 102 composing a pair is provided to be adjacent to each other interposing an isolation region to be described later, and a base of the unit HBT 101 and a source of the unit FET 102 are connected to each other to form one unit element 100 (broken line).

The plurality of unit elements 100 are connected in parallel to form the active element 200. More specifically, an emitter and a collector of the unit HBT 101 and a drain and a gate of the unit FET 102 of one unit element 100 are connected to an emitter, a collector, a drain, and a gate of one of other unit elements 100, respectively.

In each unit element 100, the drain of the unit FET 102 is connected to a power supply terminal $V_{DD}$. Then, a current between the collector and the emitter of the unit HBT 101 is changed by a voltage signal applied to the gate of the unit FET 102.

Referring to FIG. 1B, the unit HBT 101 and the unit FET 102 of the unit element 100 are provided to be adjacent to each other interposing the isolation region (to be described later), and the base of the unit HBT 101 and the source of the unit FET 102 are connected to each other. Although the unit elements 100 are connected in parallel, the base and the source of one unit element 100 are not connected to the base and the source of one of other unit elements 100.

Figure 2:
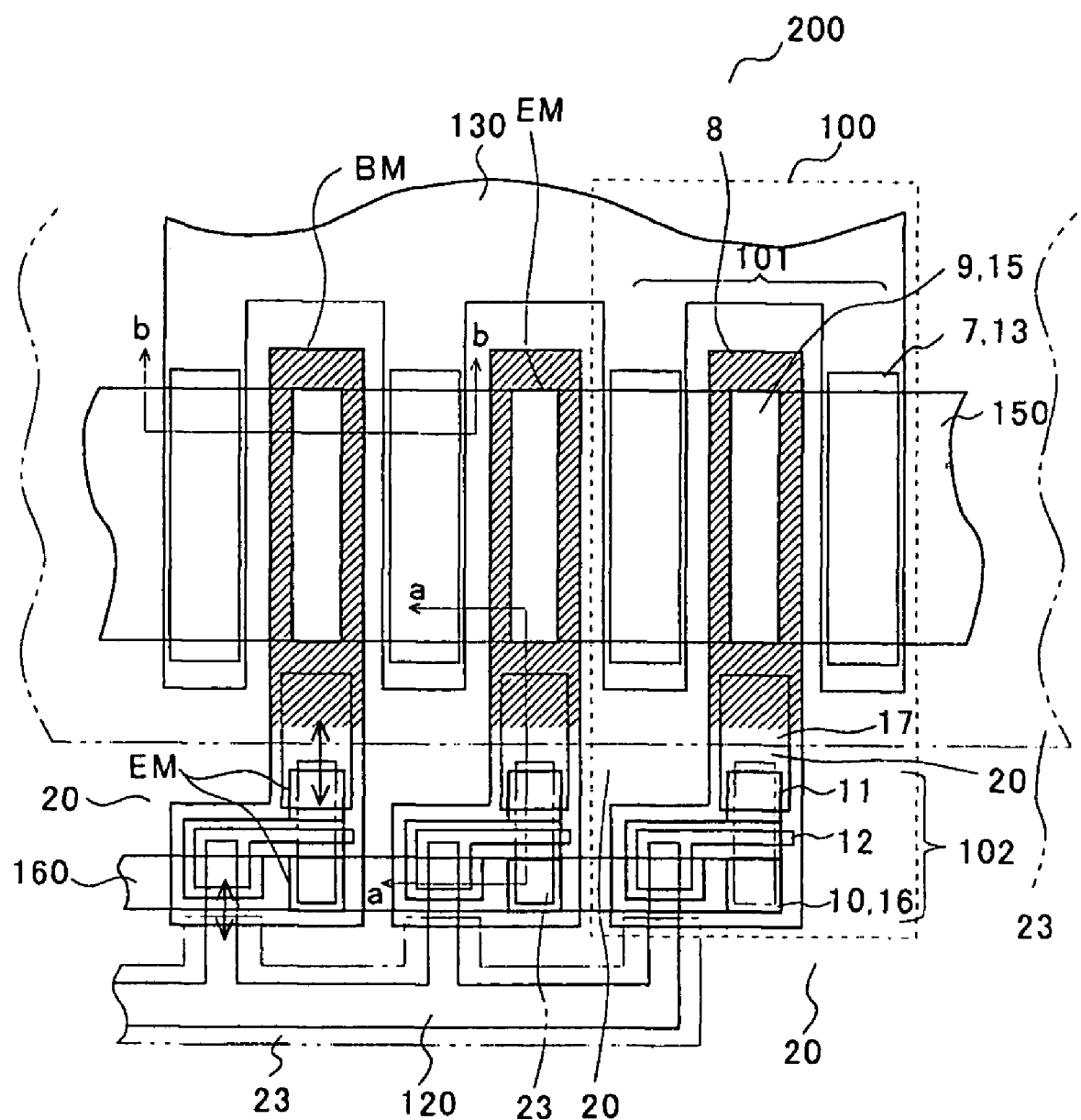
FIG. 2 is a plane view for explaining the first embodiment of the present invention.

FIG. 2 illustrates a plane view of the active element 200.

In this way, the unit HBT 101 is patterned, for example, in a comb-tooth shape in the plane view. Then, the unit FET 102 is connected to each unit HBT 101. Namely, the unit elements 100 of the present embodiment are formed in a comb-tooth shape and the respective comb-teeth are connected in parallel to form the active element 200.

The plurality of semiconductor layers are grown on the semi-insulating compound semiconductor substrate to form the unit HBT 101 and the unit FET 102.

In the unit HBT 101, each semiconductor layer is mesa-etched with a predetermined pattern to form the respective semiconductor layers, serving as the emitter layer and the base layer, in a mesa shape to be described later.

An emitter electrode 9 and a collector electrode 7 of a first metal layer, which are connected to an emitter layer and a subcollector layer, respectively, are formed of ohmic metal layers (AuGe/Ni/Au) and a base electrode 8, which is connected to a base layer, is formed of an ohmic metal layer (Pt/Ti/Pt/Au). The emitter electrode 9 and the collector electrode 7 are formed in a comb-tooth shape. The base electrode 8 is arranged to surround the emitter electrode 9 as a center as illustrated by hatching. Then, on the subcollector layer outside of the base electrode 8, two collector electrodes 7 that sandwich the base electrode 8 are arranged.

On the emitter electrode 9 and the collector electrode 7 of the first metal layer, an emitter electrode 15 and a collector electrode 13 of a second metal layer are formed of wiring metal layers (Ti/Pt/Au) that are superimposed on these electrodes. The emitter electrode 15 of the second metal layer is formed in the same comb shape as that of the first metal layer. The collector electrode 13 of the second metal layer is continuous to a collector wiring 130. The base electrode 8 is one layer-structure of only the ohmic metal layer. Moreover, on the emitter electrode 15 of the second metal layer, an emitter wiring 150 is formed of a gold-plated layer.

The unit FET 102 is provided on the same substrate and semiconductor layers as those of the unit HBT 101. The semiconductor layers are mesa-etched with a desired pattern to form the respective semiconductor layers, serving as a contact layer and channel layers, in a mesa shape.

A drain electrode 10 and a source electrode 11 of the first metal layer, which come in contact with the contact layers, respectively, are formed of ohmic metal layers (AuGe/Ni/Au). On a surface of the channel layer between the drain electrode 10 and the source electrode 11, a gate electrode 12 is formed of a gate metal layer (Pt/Mo). The gate electrode 12 extends in a direction orthogonal to an extending direction of each electrode of the comb-tooth like unit HBT 101 at a portion between the island-shape source electrode 11 and the drain electrode 10.

An operation region of the unit FET 102 where the drain electrode 10, the source electrode 11, and the gate electrode 12 are arranged is formed on a conductive region 23, which is formed by isolating the semiconductor layers by an isolation region 20. Since the isolation region 20 is an insulating region by an ion implantation such as B+ and the like, a region excepting the isolation region 20, namely, a region surrounded by a chain double-dashed line, is the conductive region 23 in the present embodiment. The conductive region 23 is an impurity region containing, for example, n type impurities.

On the drain electrode 10 of the first metal layer, a drain electrode 16 of the second metal layer is formed of the wiring metal layer (Ti/Pt/Au). Moreover, on the drain electrode 16 of the second metal layer, a drain wiring 160 is formed of the gold-plated layer.

The gate electrode 12 extends outside of the operation region and is connected to a gate wiring 120 of the wiring metal layer. The gate wiring 120 connects the gate electrodes 12 each other to be connected to a terminal to which a voltage signal is input. The isolation region 20 is provided around the gate wiring 120.

A connection wiring 17 of the wiring metal layer is provided on the source electrode 11 of the first metal layer. The connection wiring 17 connects the source electrode 11 of the unit FET 102 to the base electrode 8 of the unit HBT 101.

Although the unit FET 102 and the unit HBT 101 are provided on the same substrate (the same semiconductor layers), some of the semiconductor layers are formed in a mesa shape and isolated by a space. A region, which is not mesa-etched, is isolated by the isolation region 20 using the ion implantation. Namely, the unit HBT 101 and the unit FET 102 are arranged to be adjacent to each other interposing the isolation region 20 formed on the same substrate, and the electrode 8 of the unit HBT 101 and the source electrode 11 of the unit FET 102 are connected to each other by the connection wiring 17. Furthermore, in the present embodiment, the base layer and the collector layer of the unit HBT 101 are geometrically continuous to the corresponding semiconductor layers of the unit FET 102, respectively. Namely at least partially the collector layer of the unit HBT 101 should be geometrically continuous to the corresponding semiconductor layer of the unit FET 102 because of heat conductivity.

In the present embodiment, as illustrated by the broken line, the mesa-structured unit HBT 101 of the minimum unit, which includes the emitter electrodes 9, 15, the base electrode 8, the collector electrodes 7 and 13, is connected to the unit FET 102, which includes the source electrode 11, the gate electrode 12, the drain electrode 10 and 16, and thereby one unit element 100 is formed.

The active element 200 is formed by connecting the plurality of unit elements 100 in parallel. In other words, the collector electrodes 13 and 7 of the respective unit HBTs 101 are connected to each other by the collector wiring 130 and the emitter electrodes 15 and 9 of the respective unit HBTs 101 are connected to each other by the emitter wiring 150. Additionally, the collector electrodes 7 and 13 are shared by the unit elements 100 adjacent to each other. Furthermore, the gate electrodes 12 of the respective unit FETs 102 are connected to each other by the gate wiring 120 of the unit FET 102.

Here, the base electrode 8 of the unit HBT 101 and the source electrode 11 of the unit FET 102 are connected to each other by the connection wiring 17 in one unit element 100. However, in a layout where the plurality of unit elements 100 are arranged in a comb-tooth shape, the base electrodes 8 of the unit HBTs 101 are not directly connected to each other, and the source electrodes 11 of the unit FETs 102 are not directly connected to each other.

The drain electrodes 16 of the unit FETs 102 are connected to each other by the drain wiring 160 of the gold-plated layer and the drain wiring 160 is connected to the power supply terminal $V_{DD}$. Then, the gate wiring 120 of the unit FET 102 is connected to the terminal to which the voltage signal is input.

Figure 3A:
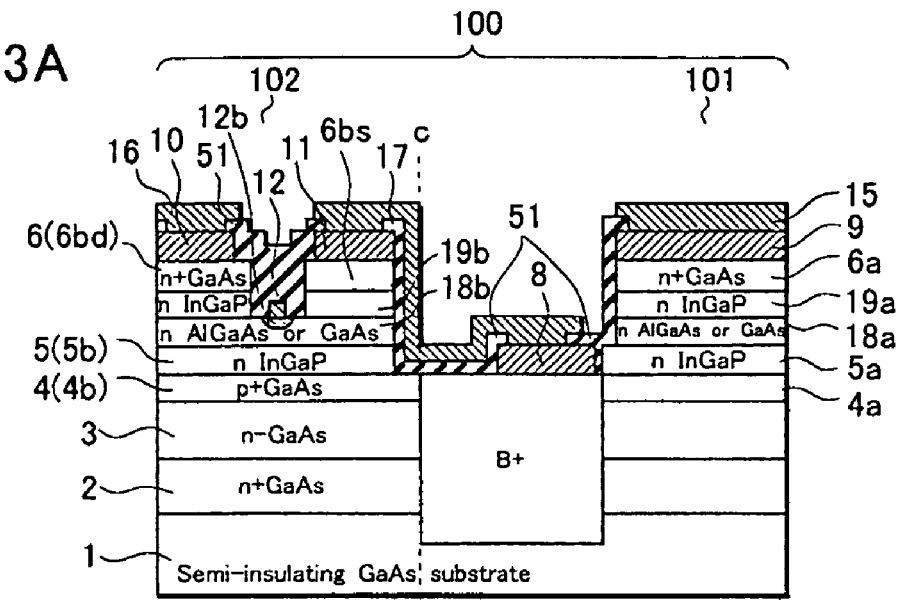
FIG. 3A is a cross-sectional view for explaining the first embodiment of the present invention.
Figure 3B:
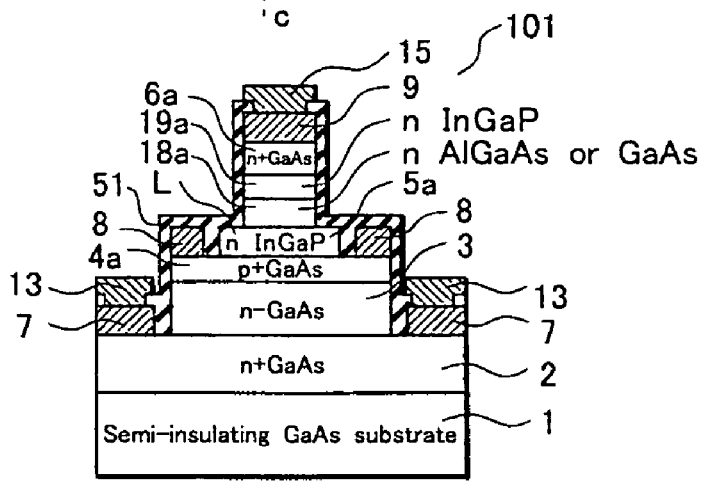
FIG. 3B is a cross-sectional view for explaining the same.
Figure 3C:
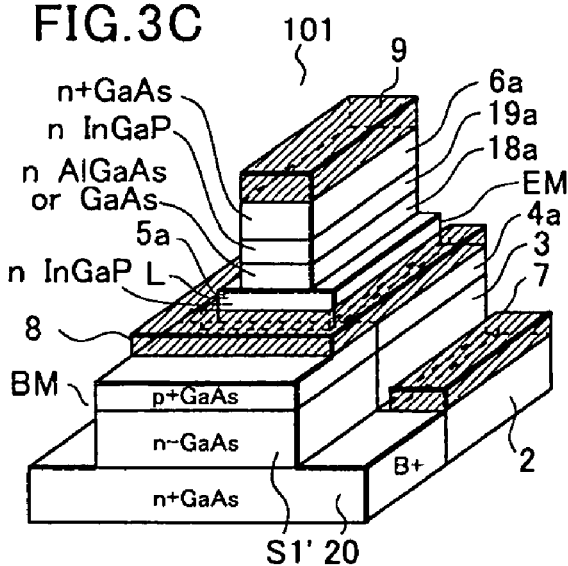
FIG. 3C is a perspective view for explaining the same.
Figure 3D:
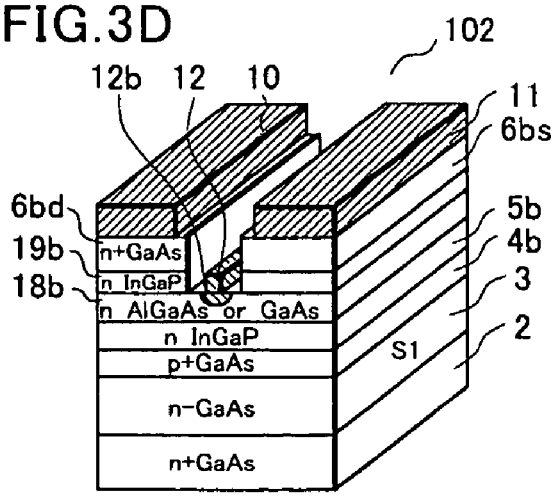
FIG. 3D is a perspective view for explaining the same.

FIGS. 3A to 3D are views illustrating the unit element 100, FIG. 3A is a cross-sectional view taken along the line a-a of FIG. 2, and FIG. 3B is a cross-sectional view of the unit HBT 101 taken along the line b-b of FIG. 2. Moreover, FIG. 3C is a perspective view of the unit HBT 101 when the unit element is cut into two regions at a cross section shown by the line c-c of FIG. 3A, and FIG. 3D is a perspective view of the unit FET 102. It is noted that the connection electrode 17 is omitted in FIGS. 3B, 3C, and 3D. Also, electrodes of second or more layers are omitted in FIGS. 3C and 3D.

Additionally, in all embodiments of the present invention, the circuit diagram (FIG. 1A) and the plane view (FIG. 2) of the unit element 100 and the active element 200 are the same. However, the respective semiconductor layers, which form the unit element 100 (the active element 200), are appropriately selected based on the use of the active element 200. Accordingly, the first embodiment (FIGS. 3A to 3D) shows and explains the unit element 100 that forms the active element 200 for an amplifier as an example.

As illustrated in FIG. 3A, the substrate is the compound semiconductor substrate where a plurality of semiconductor layers, that is, an n+ type GaAs layer 2, an n− type GaAs layer 3, a p+ type GaAs layer 4, an n type InGaP layer 5, an n type AlGaAs layer 18, an n type InGaP layer 19, and an n+ type GaAs layer 6 are grown on a semi-insulating GaAs substrate 1 (Resistivity thereof is 1E7 Ωcm or more and 1E9 Ωcm or less. On the other hand the resistivity of insulator like glass, ceramics or gum is 1E10 Ωcm or more.). It is noted that an n type GaAs layer may be used for the n type AlGaAs layer 18, however, this is explained as the n type AlGaAs layer 18 in the present embodiment.

Some of the semiconductor layers are removed by etching and formed in a mesa shape. Moreover, the isolation region 20, which reaches the GaAs substrate 1, is formed. The isolation region is the insulating region 20 (Resistivity thereof is 1E7 Ωcm or more and 1E9 Ωcm or less. On the other hand the resistivity of insulator like glass, ceramics or gum is 1E10 Ωcm or more.) formed by the ion-implantation such as B+ and the like.

The unit element 100 is isolated into two regions by the mesa-shaped semiconductor layers and the insulating region 20, and the unit HBT 101 is formed in one region and the unit FET 102 is formed in the other region.

As illustrated in FIGS. 3B and 3C, the subcollector layer 2 of the unit HBT 101 is an n+ type GaAs layer, which is formed on the GaAs substrate 1 by an epitaxial growth method and is silicon (Si)-doped to a relatively high impurity concentration of $3E18\ cm^{-3}$ to $6E18\ cm^{-3}$. The thickness is several thousands Å. The collector layer 3 is an n− type GaAs layer, which is formed on a partial region of the subcollector layer 2 and is silicon-doped to an impurity concentration of about $1E16\ cm^{-3}$ to $10E16\ cm^{-3}$. The thickness is several thousands Å. A base layer 4a is a p+ type GaAs layer, which is formed on the collector layer 3 and carbon (C)-doped to an impurity concentration of about $1E18\ cm^{-3}$ ~ $50E18\ cm^{-3}$. The thickness is several hundreds to 2000 Å. An emitter layer 5a is an n type InGaP layer, which is formed in a mesa shape on a partial region of the base layer 4a (emitter mesa EM) and silicon-doped to an impurity concentration of about $1E17\ cm^{-3}$ to $5E17\ cm^{-3}$. The thickness is several hundreds to one thousand and several hundreds Å. On the emitter layer 5a, there is grown an n type AlGaAs layer 18a, which is silicon-doped to an impurity concentration of about $1E17\ cm^{-3}$ to $5E17\ cm^{-3}$ and has a thickness of several hundreds to several thousands Å. The emitter layer 5a is lattice matched to the AlGaAs layers and the GaAs layers of the upper and lower layers. Moreover, on the n type AlGaAs layer 18a, there is grown an n type InGaP layer 19a, which is silicon-doped to an impurity concentration of about $1E17\ cm^{-3}$ to $60E17\ cm^{-3}$ and has a thickness of several hundreds to several thousands Å.

Here, the n type InGaP layer 5 forms the emitter layer 5a of the unit HBT 101 and a part of the channel layer of the unit FET 102 and forms a ledge L in the vicinity of a side surface of the emitter layer 5a. As described in details later, the thickness of the n type InGaP layer 5 is thinned to have a thickness of several hundreds to one thousand and several hundreds Å, thereby, the ledge portion L is completely depleted by a surface depletion layer to prevent a flow of a recombination current between the emitter and the base on the surface of the base layer 4a. The n type AlGaAs layer 18 forms a part of the channel layer of the unit FET 102 together with the n type InGaP layer 5. Namely, the gate electrode of the unit FET 102 is formed on the surface of the n type AlGaAs layer 18 and a thickness of the n type AlGaAs layer 18 is set to such a thickness that the unit FET 102 can obtain a predetermined pinch-off voltage Vp. The n type InGaP layer 19 is an etching stop layer when the n+ type GaAs layer 6 is etched in a process for exposing the surface of the n type AlGaAs layer 18 in order to form the gate electrode of the unit FET 102.

There are two kinds of cases in connection with the impurity concentration of the n type InGaP layer 19. A first case is one in which the n type InGaP layer 19 is silicon-doped to the impurity concentration of about $1E17\ cm^{-3}$ to $5E17\ cm^{-3}$. When a reverse bias is applied between the emitter and the base, the depletion layer expands to the emitter layer 5a and the n type AlGaAs layer 18 from an emitter-base heterojunction. In order that the emitter-base junction obtains a predetermined breakdown voltage, a distance where the depletion layer is extended must be sufficiently ensured. However, there is a case in which the distance where the depletion layer is extended is insufficient depending on a total thickness of the emitter layer 5a and the n type AlGaAs layer 18.

In such a case, the n type InGaP layer 19 is also used as a part of the region where the depletion layer is extended to obtain a predetermined breakdown voltage between the emitter and the base. Namely, in the first case, the impurity concentration of the n type InGaP layer 19 is set to about $1E17\ cm^{-3}$ to $5E17\ cm^{-3}$ and the depletion layer is expanded to three layers of the emitter layer 5a, the n type AlGaAs layer 18 and the n type InGaP layer 19, thereby the predetermined breakdown voltage between the emitter and the base is ensured.

A second case is one in which the n type InGaP layer 19 is silicon-doped to an impurity concentration of about $20E17\ cm^{-3}$ to $60E17\ cm^{-3}$. As mentioned above, when the reverse bias is applied between the emitter and the base, the depletion layer is expanded to the emitter layer 5a and the n type AlGaAs layer 18 to ensure the predetermined breakdown voltage between the emitter and the base. The second case is a case in which only the total thickness of the emitter layer 5a and the n type AlGaAs layer 18 is sufficient for the distance where the depletion layer is spread and extended. In this case, the impurity concentration of the n type InGaP layer 19 is set to a high concentration of about $20E17\ cm^{-3}$ to $60E17\ cm^{-3}$, and thereby an emitter parasitic resistance component of the unit HBT 101 and a source (drain) parasitic resistance component of the unit FET 102 are reduced.

In the first case, if the impurity concentration of the n type InGaP layer 19 is set to the high concentration of about $20E17\ cm^{-3}$ to $60E17\ cm^{-3}$ and when the reverse bias is applied between the emitter and the base, the depletion layer will reach the n type InGaP layer 19 by a reverse bias voltage of less than the predetermined breakdown voltage between the emitter and the base. Then, even if the reverse bias voltage higher than the above is applied, the depletion layer is hardly extended into the n type InGaP layer 19, so that a breakdown will occur between the emitter and the base by the reverse bias voltage of less than the predetermined breakdown voltage.

Additionally, in the second case, the impurity concentration of the n type InGaP layer 19 is set to the high concentration (n+) of about $20E17\ cm^{-3}$ to $60E17\ cm^{-3}$, however, the first and the second cases are herein generically described as the n type InGaP layer 19.

The n type AlGaAs layer 18 and the n type InGaP layer 19 are spatially separated into n type AlGaAs layers 18a, 18b and n type InGaP layers 19a, 19b, respectively, by mesa-etching.

An emitter contact layer 6a is an n+ type GaAs layer, which is formed on the n type InGaP layer 19a and silicon-doped to an impurity concentration of about 3E18 cm$^{-3}$ to 6E18 cm$^{-3}$ and its thickness is several thousands Å.

The base layer 4a and the collector layer 3 are also formed in a mesa shape (base mesa BM). Moreover, the insulating region 20 for isolation is provided in the vicinity of a surface S1' at lower layers than the emitter layer 5a.

On a surface of the subcollector layer 2, the first metal layer collector electrode 7 formed of the ohmic metal layer (AuGe/Ni/Au) is arranged at a position where the collector layer 3 is interposed therebetween. On a surface of the base layer 4a, there is formed the base electrode 8 of the ohmic metal layer (Pt/Ti/Pt/Au) with a pattern that surrounds the emitter layer 5a. On an upper portion of the emitter contact layer 6a, the first metal layer emitter electrode 9 formed of the ohmic metal layer (AuGe/Ni/Au) is arranged. The collector electrode 7 and the emitter electrode 9 of the first metal layer and the base electrode 8 are covered with a nitride film 51. The collector electrode 7 and the emitter electrode 9 of the first metal layer come in contact with the collector electrode 13 and the emitter electrode 15 of the second metal layer, both of which are formed of the wiring metal layer (Ti/Pt/Au), respectively, through a contact hole formed on the nitride film 51.

Here, as illustrated in FIGS. 3A and 3B, the emitter layer 5a serves as the ledge L projected to the base electrode 8 provided at both sides of the emitter layer 5a. Any semiconductor layer is not provided at an upper portion of the ledge L and the surface depletion layer extends from the surface of the ledge L. Moreover, the thickness of the ledge L, that is, the thickness of the emitter layer 5a is designed to have a thickness smaller than a thickness where the surface depletion layer extends. Accordingly, the ledge L is completely depleted by the surface depletion layer. This prevents a flow of a recombination current between the emitter and the base on the surface of the base layer 4a of the lower portion of the ledge L.

For example, as explained in another embodiment later, there is a case in which the emitter layer 5a, which is thicker than the ledge L, and the n+ type GaAs layer 6 are grown so as to directly come in contact with each other as the HBT structure. In this case, the ledge L needs to be depleted completely as mentioned above, and the ledge L is formed by photo-etching the emitter layer 5a.

However, in this method, there is a problem in which the ledge L having a predetermined thickness cannot be formed with a high reproducibility since a wet etching is difficult to be controlled. Namely, when the ledge L is too thick, the surface depletion layer, which extends to an interior of the ledge L from the surface of the ledge L, does not reach the base layer 4a. In this case, since the ledge L is not completely depleted, the recombination current between the emitter and the base flows on the surface of the base layer 4a to reduce a current amplification factor of the HBT. Moreover, when the n type InGaP layer 5 is etched excessively to form the ledge L, the ledge L itself will be eliminated. Furthermore, an increase in an accuracy of the wet etching needs a reduction in an etching rate, and therefore, there is a problem in which an etching time is increased.

Accordingly, in the present embodiment, the n type AlGaAs layer 18a is added onto the emitter layer (n type InGaP layer) 5a in such a way that the unit FET 102 can obtain a channel layer thickness large enough to obtain a predetermined pinch-off voltage Vp. Namely, as described later, the channel layer thickness of the unit FET 102 corresponds to a total thickness of the n type InGaP layer 5 and the n type AlGaAs layer 18. A wet etching selection ratio between the AlGaAs layer and the InGaP layer is high. Accordingly, the emitter layer 5a is provided to have a suitable predetermined thickness of the ledge L and only the n type AlGaAs layer 18a is selectively etched without etching the n type InGaP layer 5a to form the ledge L. This makes it possible to form the ledge L with a predetermined thickness and a good reproducibility for a short time.

Moreover, as mentioned above, when the reverse bias is applied between the emitter and the base, a design is made in such a way that the depletion layer is extended to the n type InGaP layer 19a and the emitter-base junction of the unit HBT 101 can ensure a predetermined breakdown voltage in some cases. When the total thickness of the emitter layer 5a and the n type AlGaAs layer 18a is insufficient for the distance where the depletion layer is extended on the emitter side, the impurity concentration of the n type InGaP layer 19a formed on the n type AlGaAs layer 18a is set to 1E17 cm$^{-3}$ to 5E17 cm$^{-3}$. This causes the depletion layer to be extended to the n type InGaP layer 19a.

FIG. 3D is a perspective view of the unit FET 102 when the unit element is cut at a cross section shown by the line c-c of FIG. 3A. In the unit FET 102, the n type InGaP layer 5 and the n type AlGaAs layer 18 function as channel layers. The InGaP layer 5 is used as a channel lower layer 5b and the n type AlGaAs layer 18 is used as a channel upper layer 18b. Also, the n+ type GaAs layer 6 is used as contact layers 6bs and 6bd. The contact layers 6bd and 6bs serve as a drain region and a source region of the unit FET 102, respectively, and the drain electrode 10 and the source electrode 11 of the first metal layer are formed of the ohmic metal layer on the contact layers 6bd and 6bs.

The contact layers 6bd and 6bs and an n type InGaP layer 19b thereunder are formed in a mesa shape and the n type AlGaAs layer 18b under the n type InGaP layer 19b is exposed therebetween. The gate electrode 12 is provided on the exposed n type AlGaAs layer 18b.

In the unit FET 102 a depth from a bottom portion of the channel lower layer 5b (n type InGaP), serving as a part of the channel layer, up to a bottom portion of the gate electrode 12 is designed to obtain a predetermined pinch-off voltage Vp. In other words, a position (depth) where the gate electrode 12 is formed is decided according to the above. For this reason, a desired semiconductor layer is recess-etched up to a predetermined depth according to the desired pinch-off voltage Vp to form the gate electrode 12 on the exposed surface. At this time, variations in the recess etching cause variations in the pinch-off voltage Vp to degrade reproducibility of a characteristic of the unit FET 102.

Accordingly, in the present embodiment, the channel lower layer 5a (n type InGaP), the channel upper layer 18b (n type AlGaAs), the n type InGaP layer 19b, and the n+ type GaAs layer 6 are grown. Then, in the recess etching process for forming the gate electrode, the n+ type GaAs layer 6 is etched to be separated into the contact layers 6bd and 6bs by the selection etching of the n+ type GaAs layer 6 and the n type InGaP layer 19b. Next, the n type InGaP layer 19b is etched to expose a surface of the n type AlGaAs layer 18b to form the gate electrode, by the selection etching of the n type InGaP layer 19b and the n type AlGaAs layer 18b. The n type AlGaAs layer 18b is set to have a thickness according to a predetermined pinch-off voltage Vp, and thereby it is possible to perform the recess etching for forming the gate electrode 12 with a good reproducibility.

As mentioned above, in the unit FET 102, the n type AlGaAs layer 18b and the n type InGaP layer 19b are provided to make it possible to perform the selection etching in the recess etching to expose the surface on which the gate electrode 12 is formed, and this also provides an advantage in ensuring the breakdown voltage of the gate electrode 12.

In the present embodiment, the gate electrode 12 of the unit FET 102 is provided on the n type AlGaAs layer 18b. Then, there is used a buried gate electrode structure where a part of an undermost layer metal of the gate metal layer (metal multilayer film), which forms the gate electrode 12, is buried in the n type AlGaAs layer 18b.

Figure 4A:
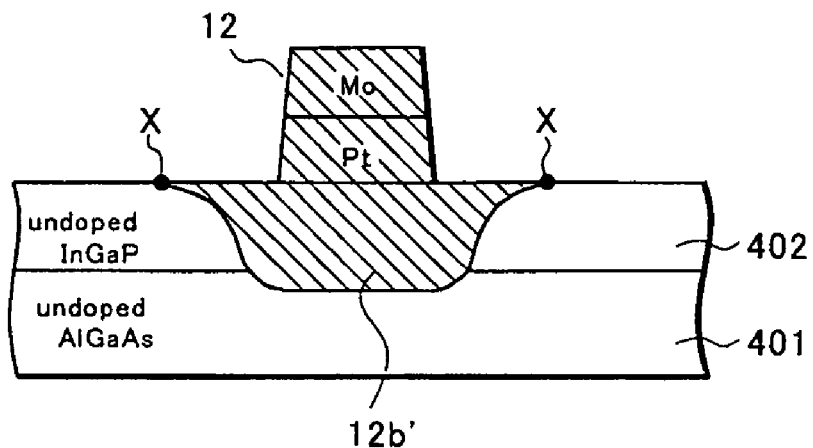
FIG. 4A to 4C are cross-sectional views for explaining the first embodiment of the present invention.
Figure 4B:
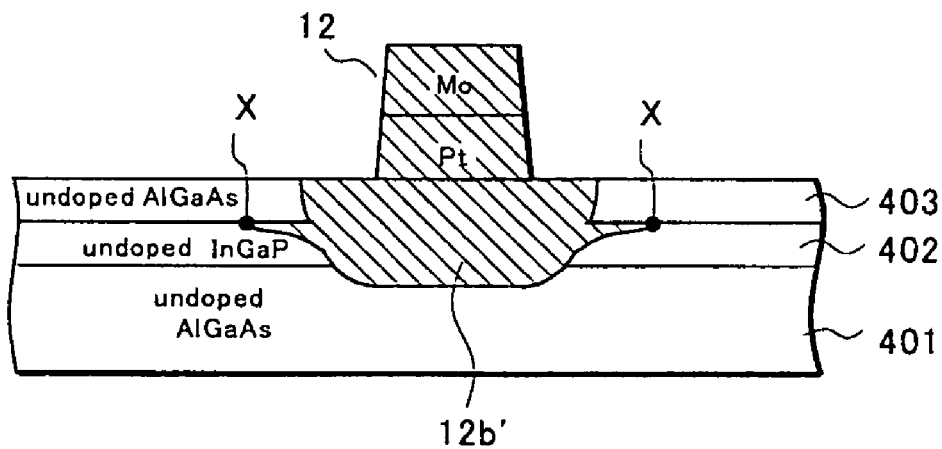
Figure 4C:
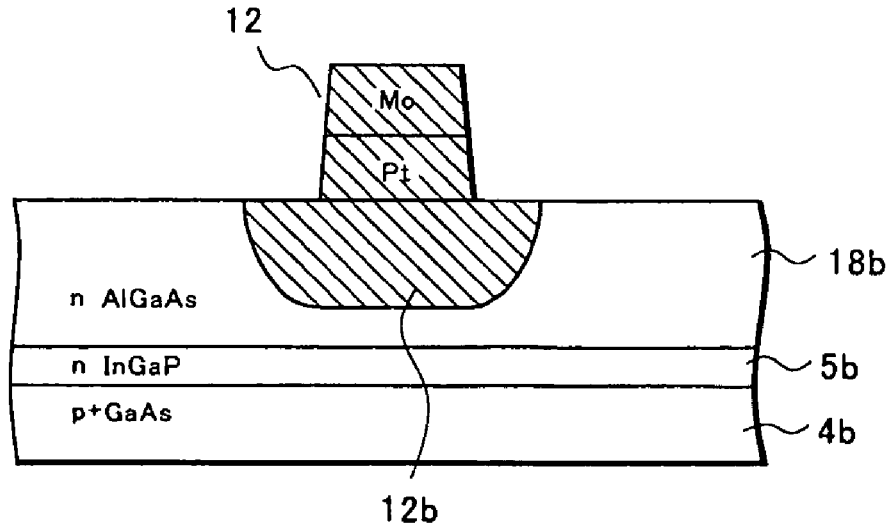

An enlarged cross-sectional view of the buried gate electrode structure is herein shown by FIG. 4A to 4C. When the buried gate electrode structure is adopted, the gate electrode 12 is formed of the metal multilayer film (for example, Pt/Mo) using Pt as the undermost layer metal. Then, the metal multilayer film is evaporated on the semiconductor layer and thereafter a part of Pt as the undermost layer metal is diffused to the semiconductor layer to form a buried portion 12b. The buried portion 12b is a diffusion region and is originally formed to be curved from the edge of the metal multilayer film as evaporated toward an outside with a predetermined curvature, allowing a contribution to an improvement in the breakdown voltage.

FIGS. 4A and 4B show cases in which Pt is diffused to the InGaP layer. For example, in FIG. 4A, an undoped InGaP layer 402 is grown on an undoped AlGaAs layer 401 to form the gate electrode 12 on a surface of the InGaP layer 402. This results in that the layer, which is exposed at both sides of the gate electrode 12, is the InGaP layer 402. There is an advantage in which the InGaP layer 402 is not likely to be oxidized and is chemically stable, and is used as a passivation layer for an operation region on both sides of the gate electrode 12. A buried portion 12b' functions as a part of the gate electrode 12 so that a position (diffusion depth) of a bottom of the buried portion 12b' is decided according to the desired pinch-off voltage Vp.

However, as a result of an actual observation of a portion obtained by diffusing the Pt of the gate electrode 12 onto the surface of the InGaP layer 402, it was shown as FIG. 4A that Pt was abnormally diffused on the surface of the InGaP layer 402 in a horizontal direction and had a shape where end portions (points X) were sharp-pointed. In other words, the shape of the buried portion 12b' for improving the breakdown voltage is not actually curved toward the outside with the predetermined curvature, and it is not possible to obtain a shape which is advantageous for improving the breakdown voltage.

Moreover, FIG. 4B shows a structure in which the undoped AlGaAs layers 401, 403 and the undoped InGaP layer 402 are alternately grown to form the gate electrode 12 on the surface of the AlGaAs layer 403. Even in a case where no gate electrode 12 is formed on the surface of the InGaP layer 402 as mentioned above, when the Pt, which penetrates the AlGaAs layer 403 and is diffused, reaches the InGaP layer 402, the abnormal diffusion occurs on the surface of the InGaP layer 402 in the horizontal direction.

Additionally although, in FIGS. 4A and 4B, all semiconductor layers are shown as the undoped layers, the same holds true for the layer (doped InGaP layer or doped AlGaAs layer) where the InGaP layer (or AlGaAs layer) contains impurities in connection with the abnormal diffusion of Pt.

As mentioned above, since the Pt is abnormally diffused on the surface of the InGaP layer 402, an electrical field concentration occurs at points X in any case, thereby, it is not possible to ensure a high breakdown voltage which the buried gate electrode originally has. In other words, the breakdown voltage at this time maintains the same level as that of a case where no gate electrode is buried.

FIG. 4C illustrates the gate electrode 12 and the buried portion 12b of the present embodiment. As illustrated in FIG. 4C, in the present embodiment, a channel upper layer (n type AlGaAs layer) 18b is provided on a channel lower layer (n type InGaP layer) 5b, and the gate electrode 12 is formed on the surface thereof. Then, a bottom of the buried portion 12b is positioned in the n type AlGaAs layer 18b. This makes it possible to prevent the abnormal diffusion of Pt on the surface of the InGaP layer 5b and the shape of the buried portion 12b is curved toward the outside with the predetermined curvature to make it possible to improve the breakdown voltage.

Moreover, a target pinch-off voltage Vp is decided by a distance between the bottom portion of the gate electrode 12 (bottom portion of the buried portion 12) and the bottom portion of the channel lower layer 5b and impurity concentrations of the channel lower layer 5b and the channel upper layer 18b. Here, the depth of the buried portion 12b is proportional to an evaporated film thickness (depth of the buried portion 12b=Pt evaporated film thickness×2.4) if the Pt evaporated film thickness of the undermost layer of the gate metal layer is 110 Å or less. In other words, the depth of the buried portion 12b makes it possible to perform control with a good reproducibility based on the Pt evaporated film thickness. Moreover, since the impurity concentration is an impurity concentration at a time of forming an epitaxial layer by a MOCVD device, an extremely precise control can be performed.

On the other hand, the channel layer, which is from the bottom portion of the buried portion 12b to the surface of the channel lower layer 5b, is formed of the channel upper layer (n type AlGaAs) 18b. In the present embodiment, first, the impurity concentrations of the channel lower layer (n type InGaP) 5b and the channel upper layer (n type AlGaAs) 18b are set in such a way that the unit FET 102 can obtain a predetermined breakdown voltage and an on-resistance. Next, the channel lower layer (n type InGaP) 5b is set to have such a thickness that the ledge L of the unit HBT 101 normally functions namely the thickness of the channel lower (n type InGaP) layer 5b is the same thickness as that of the ledge L of the unit HBT 101. Finally, the thickness of the channel upper layer (n type AlGaAs) 18b is set to have such a thickness that the unit FET 102 can obtain a predetermined pinch-off voltage Vp. The n type InGaP layer 19b is grown on the channel upper layer (n type AlGaAs) 18b. Then, only the n type InGaP layer 19b is selectively etched without etching the n type AlGaAs layer 18b to expose the surface of the n type AlGaAs layer 18b. In the conventional method in which the n type AlGaAs layer 18 having a sufficient thickness is prepared and wet etching is performed up to a predetermined depth to expose the surface on which the gate electrode is formed, the etching reproducibility is poor and the pinch-off voltage Vp largely varies. However, according to the present embodiment, the surface of the n type AlGaAs layer 18b, on which the gate electrode is formed, can be exposed with a good reproducibility.

The channel lower layer 5b is arranged as the lower layer of the channel upper layer (n type AlGaAs) 18b, and a p+ type buffer layer 4b is arranged as the lower layer of the channel lower layer 5b. The p+ type buffer layer 4b is a p+ type GaAs layer and this layer can prevent a carrier from being leaked to the substrate from the channel.

Additionally, the lower layers than the p+ type GaAs layer 4 may be designed in such a way that the characteristic of the unit HBT 101 is optimized since they have no influence upon the operation as the unit FET 102.

Reference is made to FIGS. 3A to 3D again. As illustrated in FIG. 3A, the unit element 100 is a structure in which a surface S1' of the unit HBT 101 shown in FIGS. 3B and 3C is abutted on a surface S1 of the unit FET 102 shown in FIG. 3D. An abutted surface is a surface taken along the line c-c of FIG. 3A. Then, on the source electrode 11 of the unit FET 102, the connection wiring 17 is formed of the wiring metal layer (Ti/Pt/Au). The connection wiring 17 passes the insulating region 20 along the mesa of the unit FET 102 and extends up to the base electrode 8 of the unit HBT 101.

Here, the following will explain the mesa shape and the wiring direction.

When the wet etching is used to mesa-etching GaAs, a crystal surface affects the mesa shape. In connection with a relationship between a crystal orientation and the mesa shape, the mesa shape, which is in case of tracing an etching stepped surface in a direction parallel to a direction of [01 bar 1 bar] (hereinafter referred to as [01-1-]), is a forward mesa shape (trapezium shape). Moreover, the mesa shape, which is in case of tracing the etching stepped surface in a direction perpendicular to the direction of [01-1-], is a reverse mesa shape (overhang shape).

In other words, for example, when the wiring metal layer moves up and down a mesa stepped portion (the etching stepped surface), a step coverage problem occurs depending on the mesa shape or an extending direction of the wiring metal layer.

When the metal layer extends in the direction parallel to the direction of [01-1-] and moves up and down the mesa stepped portion, no step coverage problem occurs since the shape is the forward mesa shape. However, when the wiring extends in a direction perpendicular to the direction of [01-1-] and moves up and down the mesa stepped portion, the step coverage problem occurs since the shape is a reverse mesa shape.

In the present embodiment, a mesa is also formed in the region of the unit FET 102 concurrently by the mesa etching for forming the emitter contact layer 6a, the n type InGaP layer 19a, the n type AlGaAs layer 18a and the emitter layer 5a of the unit HBT 101. In other words, this is the mesa in which the emitter mesa EM is concurrently formed in FIG. 2.

Moreover, a mesa is also formed in the region of the unit FET 102 concurrently by the mesa etching for forming the base layer 4a and the collector layer 3. In other words, this is the mesa in which the base mesa BM is concurrently formed in FIG. 2.

Accordingly, the connection wiring 17, which connects the source electrode 11 of the unit FET 102 and the base electrode 8 of the unit HBT 101 to each other, moves up and down the emitter mesa EM, and the gate wiring 120 moves up and down the base mesa BM.

Here, in the present embodiment, the connection wiring 17 and the gate wiring 120 are extended in the direction (direction shown by an arrow in FIG. 2) parallel to the direction of [01-1-] with aligning the directions where the connection wiring 17 and the gate wiring 120 move up and down the mesa.

As mentioned above, the n+ type GaAs layer 6, the n type InGaP layer 19, the n type AlGaAs layer 18 and the n type InGaP layer 5 are formed in a mesa shape and separated by the space. On the other hand, the lower layers than the p+ type GaAs layer 4 are isolated by the isolation region (insulating region) 20. Namely, although the base layer 4a, the collector layer 3, and the subcollector layer 2 of the unit HBT 101 are eclectically isolated from the buffer layer 4b, the n- type GaAs layer 3, and the n+ type GaAs layer 2 of the unit FET 102, these layers are continuous to one another in terms of the structure. Here at least partially the collector layer of the unit HBT 101 should be geometrically continuous to the corresponding semiconductor layer of the unit FET 102 because of heat conductivity. The unit HBT 101 and the unit FET 102 are provided to be adjacent to each other interposing the isolation region 20.

In the present embodiment, the unit FET 102 and the unit HBT 101 are connected to be adjacent to each other for each unit element 100. Then, the layered structures of the semiconductor layers of both the unit HBT 101 and the unit FET 102 are the same, and the base layer 4a, the collector layer 3 and the subcollector layer 2 of the unit HBT 101 are geometrically continuous to the p+ type GaAs layer 4b, the n- type GaAs layer 3 and the n+ layer GaAs layer 2 of the FET 102, respectively. Accordingly, heat generated by the operation of the unit HBT 101 can be transmitted to the unit FET 102. Since a drain current of the unit FET 102 has a negative temperature coefficient, a base current of the unit HBT 101 has also a negative temperature coefficient. Accordingly, the heat generated by the unit HBT 101 reduces a collector current of the unit HBT 101.

Figure 26A:
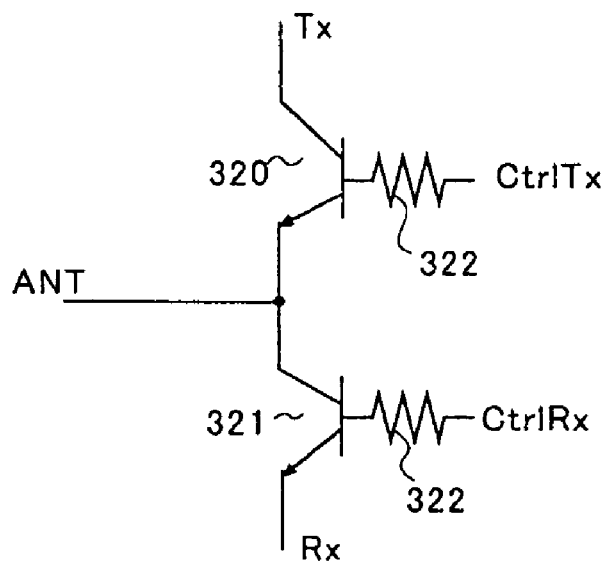
FIG. 26A is a circuit diagram for explaining a conventional technique.
Figure 26B:
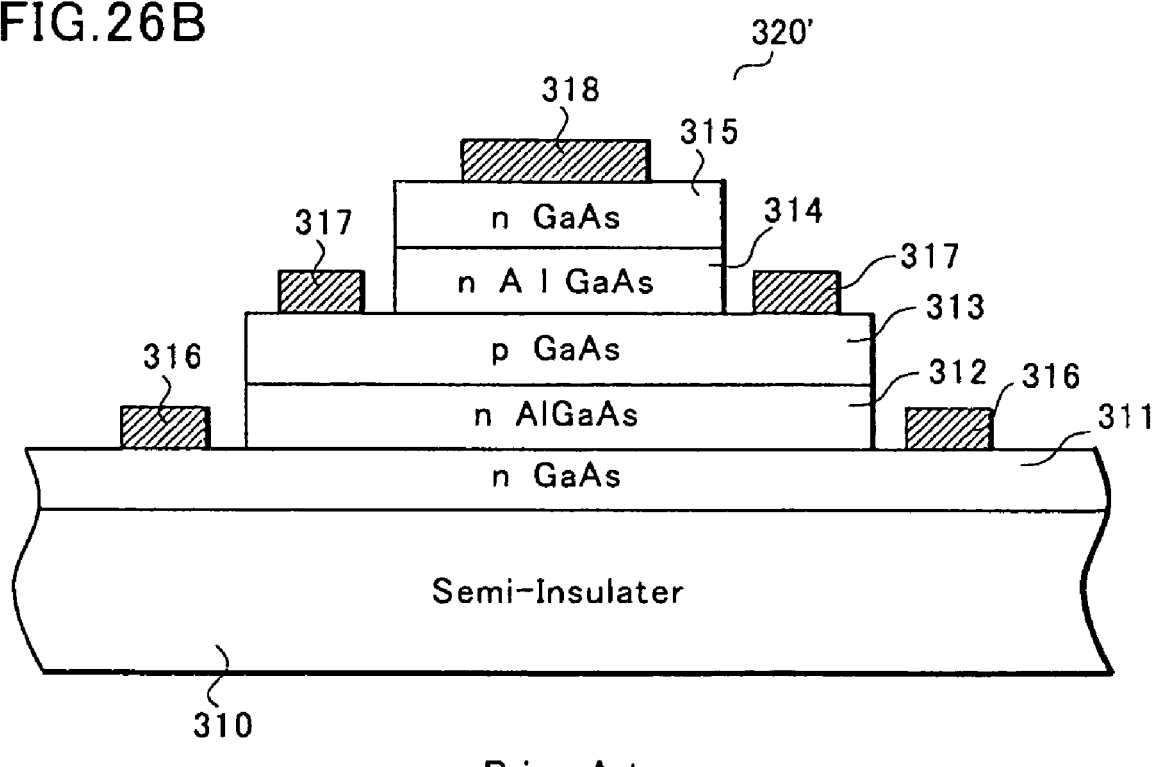
FIG. 26B is a cross-sectional view for explaining the same.

In the active element 200 formed by connecting the plurality of unit elements 100 in parallel, the operation current among the unit elements 100 becomes unequal in some cases. A conventional HBT 320 (or 321) is an active element in which an HBT of a minimum unit shown in FIG. 26 is used as a unit element 320' and a plurality of unit elements 320' are connected in parallel. In this case, a current density, which is potentially extremely higher than the HEMT in general, is obtained, so that a considerably low on-resistance Ron can be obtained. However, the HBT 320 has a problem in which a current concentrates on one unit element by a positive feedback function due to a temperature to cause a destruction of the unit element by a secondary breakdown. This makes it impossible to sufficiently increase the current density in actual. Moreover, in general, measures in which an emitter ballast resistor or a base ballast resistor is inserted into the comb-tooth unit element 320' of the HBT 320 are always taken in order to solve this problem. However, the insertion of the emitter ballast resistor or the base ballast resistor causes a new problem in which a high frequency characteristic is degraded accordingly.

Since a characteristic of a base-emitter voltage $V_{BE}$ to a base current of the HBT 320 has a positive coefficient to the temperature, there is a case in which a base-emitter voltage $V_{BE}$ bias is applied to one unit element 320' a little more largely than the other unit element 320' for some reason of design nonuniformity. As a result, the base current and the collector current flow largely to increase the temperature, so that much more base current and collector current are made to flow. This is a general secondary breakdown process.

However, in the unit element 100 of the present embodiment, the secondary breakdown process is not actually started. It is the unit FET 102 that supplies the base current of the unit HBT 101 of the unit element 100, but the unit FET 102 has the negative temperature coefficient to the temperature, unlike the unit HBT 101. Moreover, since the unit HBT 101 and the unit FET 102 are close to each other, the generated heat of the unit HBT 101 is transmitted to the adjacent unit FET 102 to reduce the source current of the unit FET 102. Since the source and the base are connected, the source current of the unit FET 102 serves as the base current for the unit HBT 101. Namely, the heat generated by the unit HBT 101 reduces the source current of the unit FET 102, so that the base current of the unit HBT 101 is decreased. This reduces the collector current of the unit HBT 101 and the unit HBT 101 is cooled reversely. In other words, the secondary breakdown can be resultantly prevented from being generated.

Namely, in the present embodiment, the unit FET 102 is connected to the unit HBT 101 to be adjacent to each other to implement the temperature-compensation active element 200, and thereby, it is possible to largely improve the current density as compared with the conventional active element to perform the operation. In other words, since the secondary breakdown can be prevented without adding any factor that degrades a high frequency characteristic such as the emitter ballast resistor, the base ballast resistor, so that the current density can be largely improved as compared with the conventional active element.

Figure 5A:
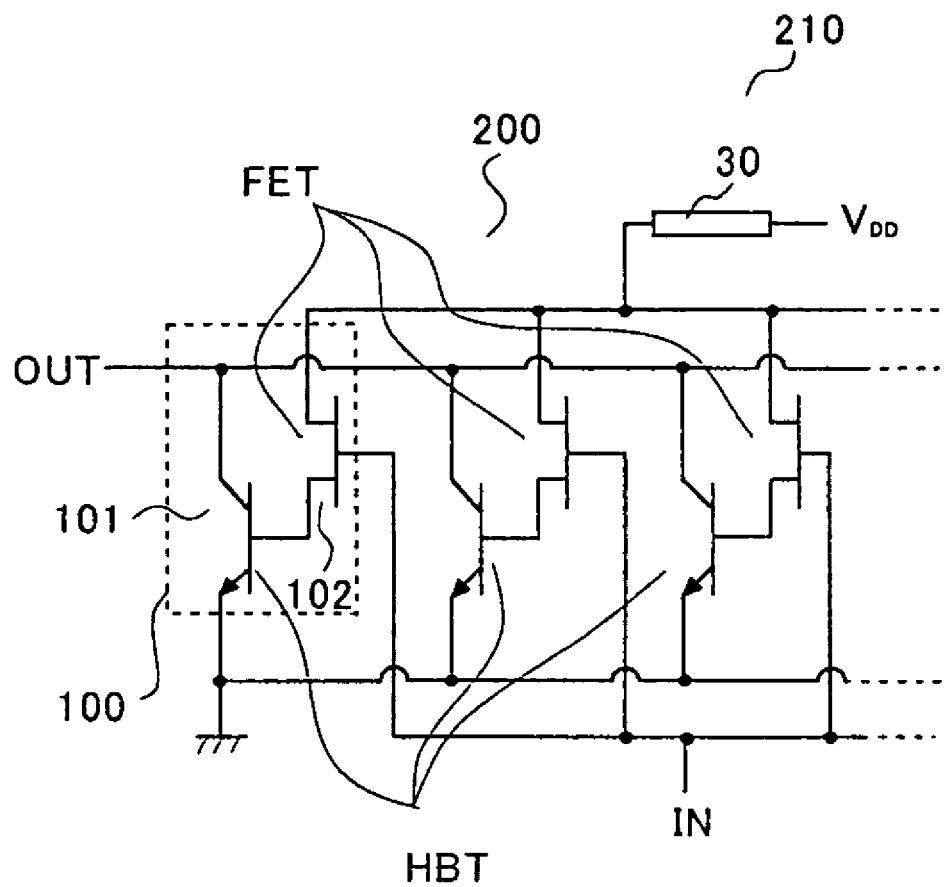
FIG. 5A is a circuit diagram for explaining the first embodiment of the present invention.
Figure 5B:
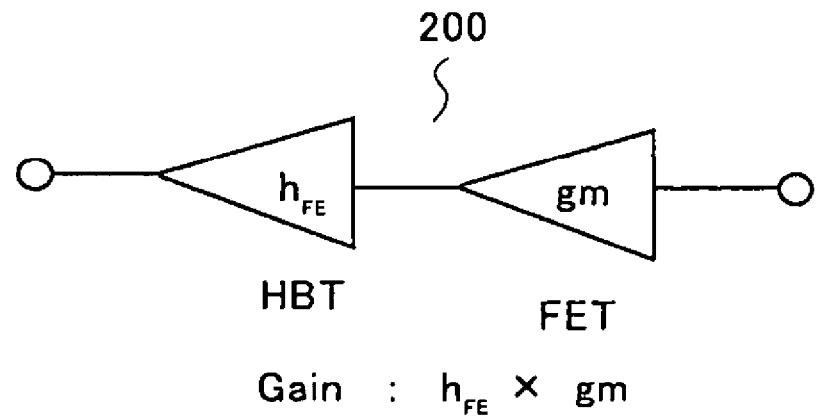
FIG. 5B is a circuit block diagram for explaining the same.

FIG. 5 illustrates a power amplifier circuit device 210 using the active element 200 for an amplifier in FIGS. 3A to 3D. FIG. 5A is a circuit diagram and FIG. 5B is a circuit block diagram.

A main use for the HBT in the current market is a power amplifier (high output amplifier) for a cellular phone. In the power amplifier for the cellular phone, it is technically the biggest key as to how many communication lines can be ensured in a limited frequency band particularly from the third generation onward, and a high density communication system such as a CDMA has been adopted. With an increase in density of the communication system, a power amplifier device having a higher linearity has been demanded. The HEMT is also used in the power amplifier for the cellular phone, but a use ratio of the HBT having a higher current density and a higher linearity than those of the HEMT has been increased from the third generation onward. The HEMT is a unipolar device, while the HBT is a bipolar device that can overwhelmingly increase the current density.

According to the present embodiment, it is possible to provide the power circuit device 210 that avoids the secondary breakdown without inserting the emitter ballast resistor or the base ballast resistor into the respective unit elements of the active element 200 as an amplifier element.

As illustrated in FIG. 5A, the power amplifier device 210 includes the active element 200 where the unit elements 100 are connected in parallel. The power amplifier circuit device 210 is one in which the active element 200 as the amplifier device and passive elements for bias and matching are integrated.

An input signal is input into the amplifier element 200, which forms the power amplifier circuit device 210, from the gate of the unit FET 102, and an output single is output from the collector of the unit HBT 101, which forms each unit element 100. The drain of the unit FET 102 is connected to the power supply terminal $V_{DD}$ through an isolation element (inductor) 30 that prevents a high frequency signal from being leaked. The power supply terminal $V_{DD}$ supplies a current to the unit FET 102. Moreover, the emitter is connected to a GND. The unit element 100 of the present embodiment is a structure in which the unit FET 102 is connected to the unit HBT 101. In other words, the unit FET 102, serving as the amplifier element, is connected to a front stage of the unit HBT 101 serving as the amplifier element.

That is, as illustrated in FIG. 5B, when the power amplifier device 210 includes the amplifier element 200 where the unit elements 100 are connected in parallel, this power amplifier circuit functions as a two-stage amplifier element where the HBT, serving as a second stage amplifier element, is continuous to a subsequent stage of the FET, serving as a first stage amplifier element.

More specifically, a mutual conductance gm of the FET is added to the current amplification factor $h_{FE}$ of the HBT, so that an amplification performance of one amplifier element 200 results in a multiplication value of the mutual conductance gm and the current amplification factor $h_{FE}$. Namely, mutual conductance gm of the amplifier element 200 indicates a multiplication value of the mutual conductance gm of the FET and the current amplification factor $h_{FE}$ of the HBT. This amplification performance largely improves a gain as the amplifier element as compared with the case in which the amplification performance of the amplifier element including only the HBT is only the current amplification factor $h_{FE}$.

FIGS. 6A to 7B illustrate another embodiment of a unit element 100 that forms an active element 200 for an amplifier as a second embodiment. In a case of the active element 200 for the amplifier, a structure of an epitaxial layer of each unit element 100 is basically the same structure as illustrated in FIGS. 3B and 3C but structures as illustrated in FIGS. 6A to 7B may be used. The second embodiment is one in which other semiconductor layers are added to the same unit element 100 as that of the first embodiment.

Figure 6A:
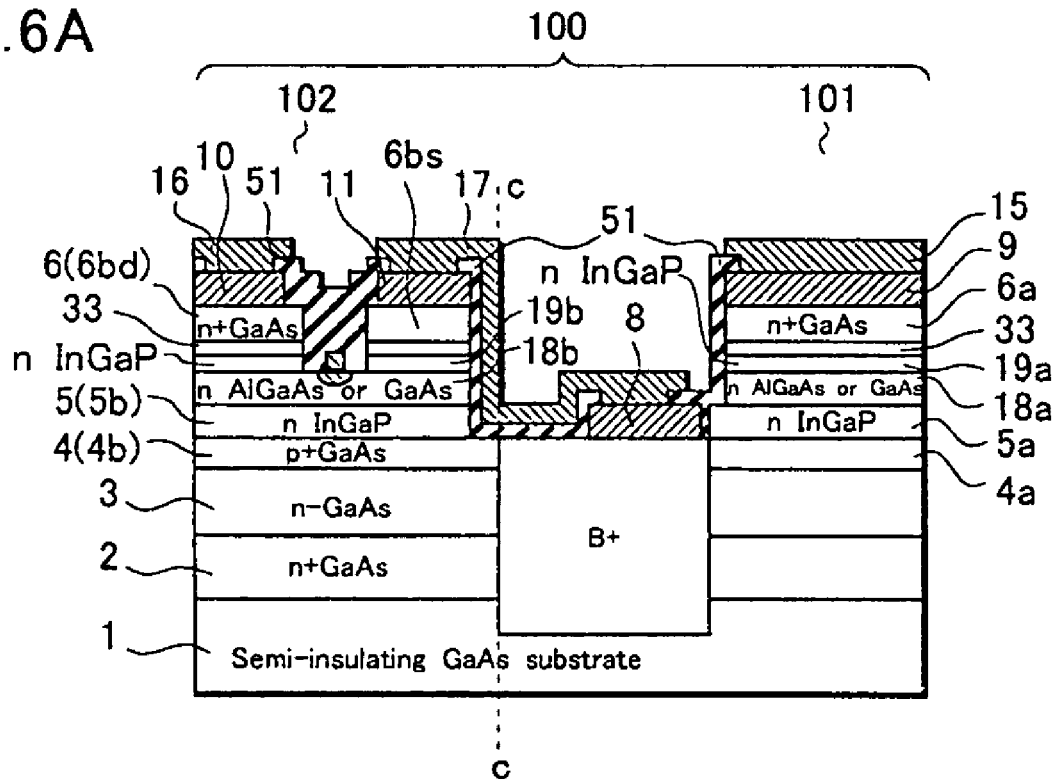
FIGS. 6A and 6B are cross-sectional views for explaining a second embodiment of the present invention.
Figure 6B:
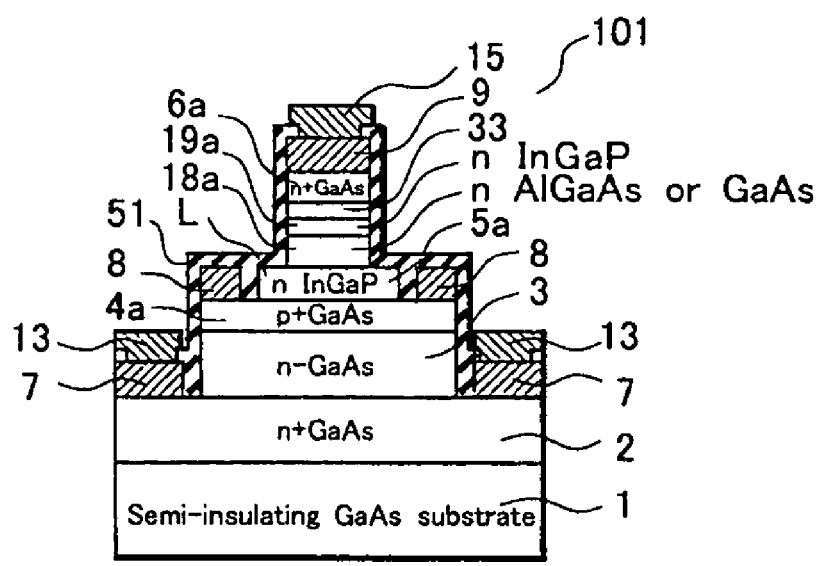

FIGS. 6A and 6B show a case in which a ballast resistor layer is provided in the same unit element 100 as that of the first embodiment. FIG. 6A is a cross-sectional view of the unit element 100 corresponding to the line a-a of FIG. 2, and FIG. 6B is a cross-sectional view of a unit HBT 101 corresponding to the line b-b of FIG. 2.

As mentioned above, according to the present embodiment, a secondary breakdown can be prevented from occurring even if the ballast resistor layer is not formed. However, there is a case in which the secondary breakdown cannot be fully prevented depending on the design of the unit FET 102 and the unit HBT 101 that form the unit element 100. Moreover, there is a difficulty in completely preventing the secondary breakdown from occurring when an extremely large current is made to flow to the unit HBT 101. In such a case, the ballast resistor layer is added to the epitaxial structure of the unit HBT 101, thereby measures against the secondary breakdown may be taken again.

In other words, an n– type GaAs layer 33, serving as the ballast resistor layer, is provided above an emitter layer 5a. The n– type GaAs layer 33 having a predetermined resistance value serves as the ballast resistor layer, and thereby, it is possible to prevent the secondary breakdown from occurring by a concentration of the current on the unit element 100.

The ballast resistor layer 33 may be formed of an undoped GaAs layer, an n– type InGaP layer, or an undoped InGaP layer. The other semiconductor layers are the same as those of FIG. 3B. As mentioned above, the ballast resistor of the HBT is provided for a temperature compensation. Namely, for example, when the ballast resistor is connected in series to the emitter of the unit element 320' of the HBT 320 shown in FIG. 26B and the current concentrates on one unit element 320' by a positive feedback function due to a temperature, an electric potential difference between both terminals of the ballast resistor of the unit element 320' is increased. As a result, a bias voltage, which is applied to an emitter-base junction of the unit element 320', is reduced, so that an amount of collector current of the unit element 320' is decreased. Resultantly, this makes it possible to prevent the unit element 320' from being destroyed by the secondary breakdown. However, in the conventional HBT 320, there is a problem in which a high frequency characteristic is degraded by the ballast resistor.

In the present embodiment, since the active element 200 includes the temperature-compensation unit elements 100, the same effect can be obtained with the ballast resistor having a lower resistance value than that of the conventional HBT 320 even in a case where the ballast resistor is provided. Accordingly, this makes it possible to reduce a degree of deterioration in the high frequency characteristic caused by providing the ballast resistor as compared with the conventional case.

In this case, as illustrated in FIG. 6A, although the n− type GaAs layer 33 is also provided in the unit FET 102, an amount of current flowing to the unit FET 102 is small and an influence exerted by providing the n− type GaAs layer 33 is small.

Figure 7A:
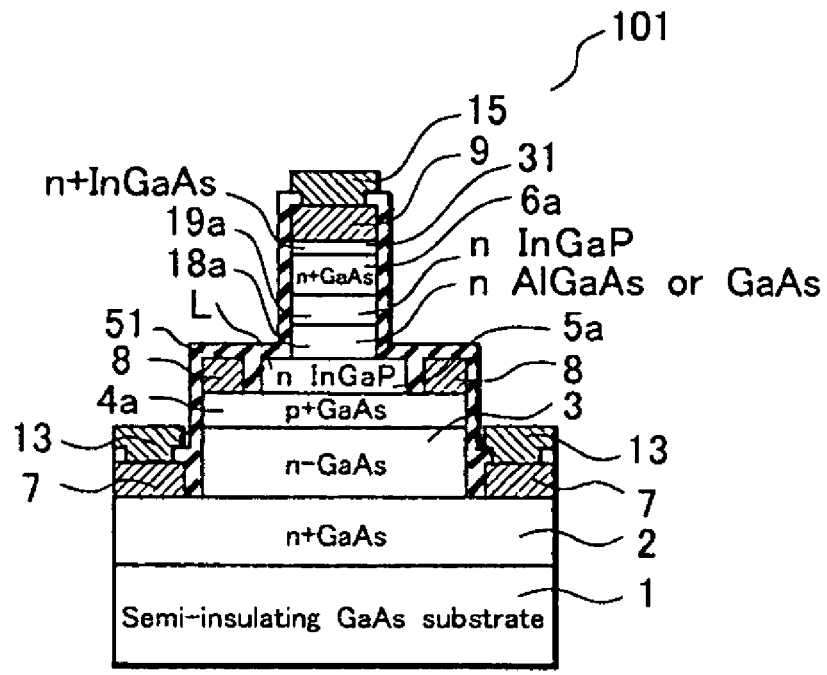
FIGS. 7A and 7B are cross-sectional views for explaining the second embodiment of the present invention.
Figure 7B:
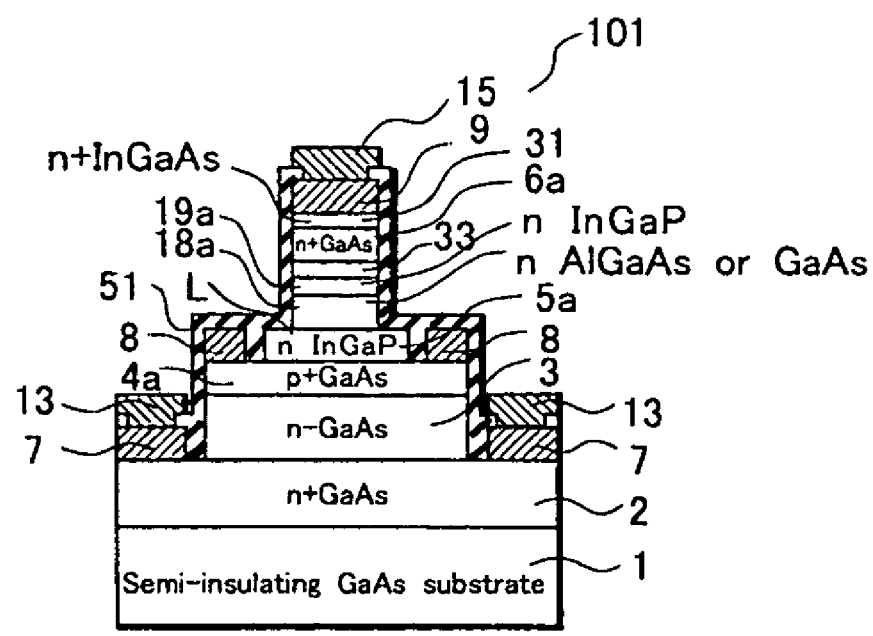

FIGS. 7A and 7B show a case in which a non-alloy ohmic layer 31 is provided and an emitter electrode is brought in contact with the non-alloy ohmic layer in the same unit HBT 101 as that of the first embodiment. FIG. 7A shows a case in which the non-alloy ohmic layer 31 is provided in the unit HBT 101 of FIGS. 3A to 3C, and FIG. 7B shows a case in which the non-alloy ohmic layer 31 is further provided in a structure having the ballast resistor layer of FIGS. 7A and 7B. Additionally, FIGS. 7A and 7B are cross-sectional views of the unit HBT 101 corresponding to the line b-b of FIG. 2. The non-alloy ohmic layer 31 is provided on the emitter contact layer 6a in order to reduce a contact resistance of the emitter contact layer 6a. The non-alloy ohmic layer 31 is an n+ type InGaAs layer. In this case, the emitter contact layer 6a is an n+ type GaAs layer and other semiconductor layers are the same as those of FIG. 3B. Although not illustrated, at this time, the non-alloy ohmic layer 31 is also concurrently provided on the contact layers 6bs and 6bd in the unit FET 102.

An explanation will be next given of a third embodiment of the present invention with reference to FIGS. 8A to 12C. The third embodiment shows a case in which a switching circuit device 220 includes an active element 200 for a switching element.

Figure 8A:
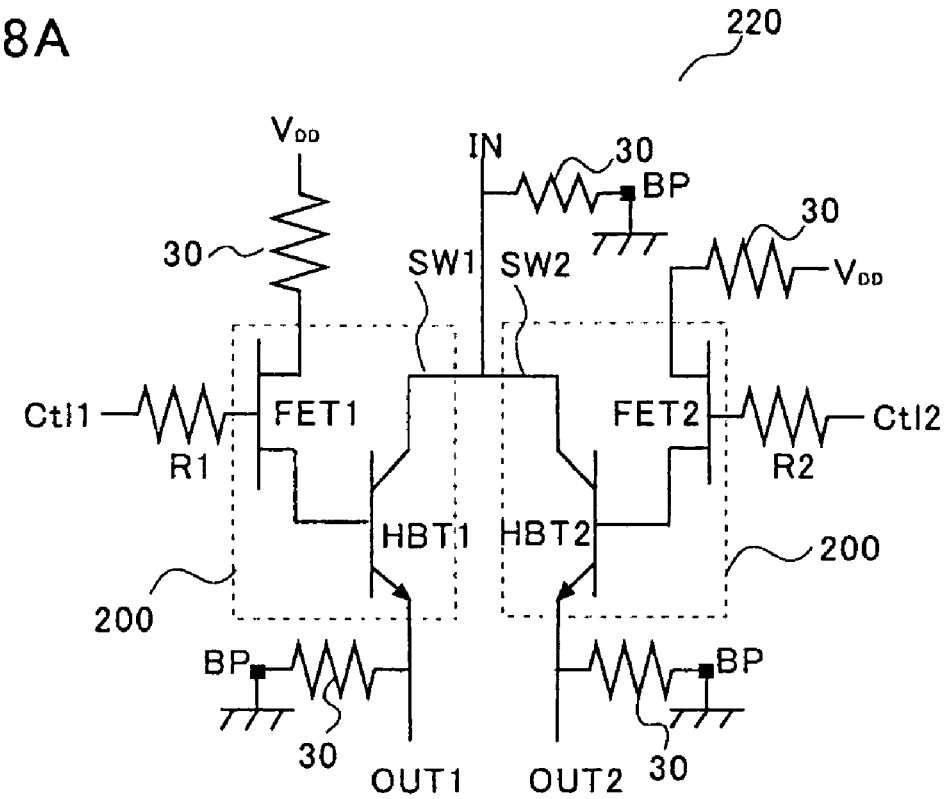
FIG. 8A is a circuit schematic diagram for explaining a third embodiment of the present invention.
Figure 8B:
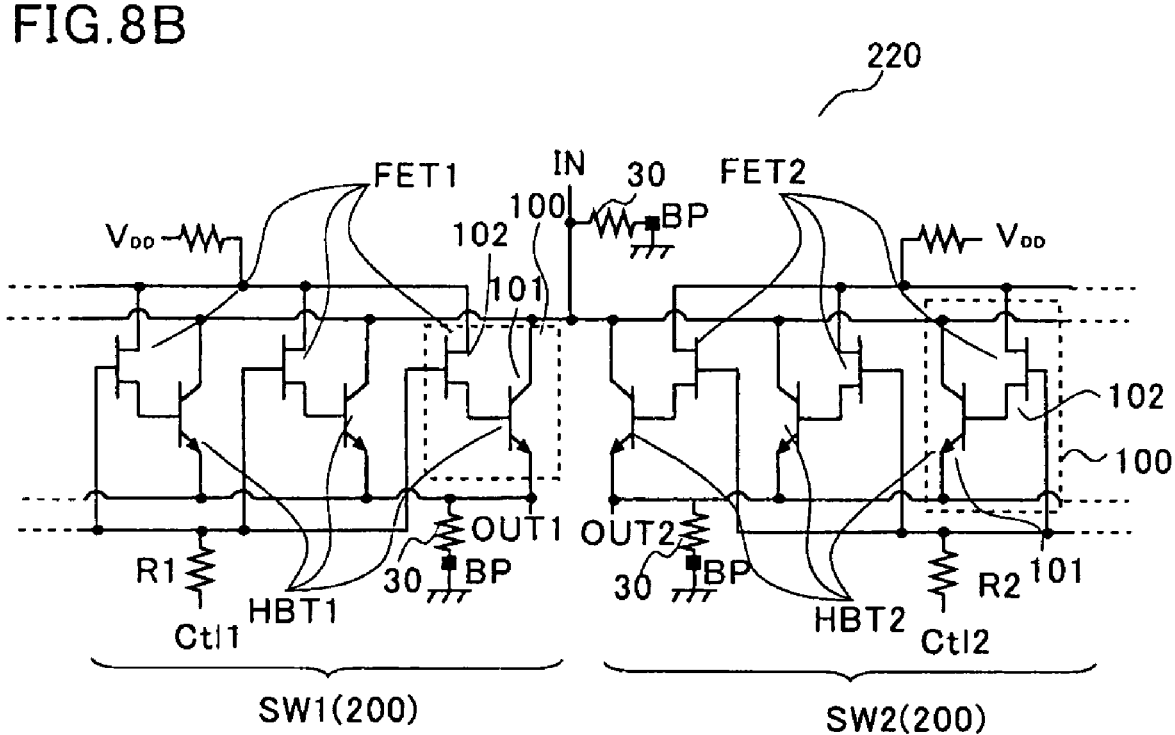
FIG. 8B is a circuit diagram for explaining the same.

First, referring to FIGS. 8A and 8B, a circuit diagram of the switching circuit device of the third embodiment is shown. FIG. 8A is a circuit schematic diagram and FIG. 8B is an actual circuit diagram.

The switching circuit device is, for example, an SPDT (Single Pole Double Throw) switch MMIC.

The SPDT switch MMIC has a first switching element SW1 and a second switching element SW2. The first switching element SW1 is the active element 200 in which unit elements are connected in parallel, and the second switching element SW2 is also the active element in which the unit elements are connected in parallel.

Similar to the first embodiment, the unit element includes a unit HBT and a unit FET. Here, in FIG. 8A, in order to show an outline of the switch circuit device 220, the unit HBTs of the respective active elements, serving as the first switching element SW1 and the second switching element SW2, are collectively illustrated by an HBT1 and an HBT2, and the unit FETs of the respective active elements are collectively illustrated by an FET1 and an FET2.

Additionally, the FET1 and the FET2 are MESFETs (Metal Semiconductor Field Effect Transistors), and driving transistors for supplying a base current to the HBT1 and the HBT2, respectively.

The first and the second switching elements SW1 and SW2, having a common collector of the HBT1 and the HBT2, are connected to a first RF (Radio Frequency) port. The first RF port is a common input terminal IN to be connected to, for example, an antenna.

Moreover, in the first and second switching elements SW1 and SW2, emitters of the HBT1 and the HBT2 are connected to a second RF (Radio Frequency) port, respectively. The second RF port is a first output terminal OUT1 to be connected to, for example, a transmitting circuit or the like, and a second output terminal OUT2 to be connected to a receiving side circuit or the like.

Bases of the HBT1 and the HBT2 are connected to a first control terminal Ctl1 and a second control terminal Ctl2, which are a transmitting control terminal and a receiving control terminal, respectively, through the FET1 and the FET2, respectively.

In the FET1 and the FET2, drains are connected to a power supply terminals $V_{DD}$, respectively and sources are connected to the bases of the HBT1 and the HBT2, respectively. Gates are connected to the first control terminal Ctl1 and the second control terminal Ctl2 through control resistors R1 and R2, respectively. The control resistors R1 and R2 are arranged in order to prevent the high frequency signal from being leaked through the gates with respect to direct current potentials of the control terminals Ctl1 and Ctl2 serving as AC grounds. Resistance values of the control resistors R1 and R2 are about 5 KΩ to 10 KΩ.

The following will explain a case in which a control signal, which is to be applied to each of the first control terminal Ctl1 and the second control terminal Ctl2, is a complementary signal. In this case, when the signal of the first control terminal Ctl1 is an H level (for example, 3 V), the signal of the second control terminal Ctl2 becomes an L level (for example, 0 V). Then, the FET to which the H level is applied is brought into conduction to drive either the HBT1 or the HBT2 by a current supplied form the FET. Then, one signal path is formed between the first and the second RF ports.

For example, when the H level is applied to the first control terminal Ctl1, the FET1 is driven into conduction between the source and drain. Thereby, the HBT1 operates using a base current $I_B$, which is supplied from the power supply terminal $V_{DD}$, as a base bias. At this time, since the L level signal is applied to the second control terminal Ctl2, the FET2 is not driven into conduction, and the HBT2 does not operate. Accordingly, one signal path is formed between the common input terminal IN and the first output terminal OUT1 and, for example, a high frequency analog signal input to the common input terminal IN is output from the first output terminal OUT1. On the other hand, when the H-level signal is applied to the second control terminal Ctl2, one signal path is formed between the common input terminal IN and the second output terminal OUT2.

A bias point BP is connected to each of the emitter and the collector of each of the HBT1 and HBT2. The bias point BP applies an equal bias potential (for example, a GND potential) to each of the emitter and the collector of each of the HBT1 and HBT2.

Then, an isolation element 30 for a high frequency signal is connected between the emitter of each of the HBT1 and the HBT2 and the bias point PB and between the collector of each of the HBT1 and the HBT2 and the bias point BP. The isolation element 30 is a resistor with a resistance value of, for example, 5 KΩ to 10 KΩ, and prevents the high frequency signal from being leaked to the bias potential (GND potential).

Furthermore, the isolation element 30 for the high frequency signal is also connected between the power supply terminal $V_{DD}$, which applies a drain bias, and the FET1 and between the power supply terminal $V_{DD}$ and the FET2.

The following will explain an operation of this circuit ON-voltages (base-emitter voltages $V_{BE}$) of the HBT1 and HBT2 are, for example, 2.0 V. Then, the FET1 and FET2 are depletion types and a pinch-off voltage Vp is −0.4 V.

Namely, the FET1 and HBT1 are finally turned on when the potential of an ON-side control terminal (for example, first control terminal Ctl1) is higher by 1.6 V (=2.0 V−0.4 V) and more than the potential of each of the emitter and the collector of the HBT1.

Here, the potentials of the emitters and the collectors of the HBT1 and HBT2 are a GND potential (0 V). Since 3 V is applied to the ON-side first control terminal Ctl1, a potential difference between the first control terminal Ctl1 and each of the emitter and the collector of the HBT1 is 3 V (=3 V−0 V). This is sufficiently higher than the potential (1.6V) by which both the FET1 and the HBT1 are turned on. Namely, even under consideration of a voltage drop by the isolation element 30 (resistor) connected to the bias point BP, the FET1 and the HBT1 are sufficiently turned on by the potential applied by the first control terminal Ctl1, so that the HBT1 is driven into conduction.

On the other hand, on an OFF-side, the second control terminal Ctl2 is 0 V with respect to the potential 0 V (GND) of the emitter and the collector of the HBT2. When the potential of the second control terminal Ctl2 is higher by 1.6 V or more than the potential of each of the emitter and the collector of the HBT2, the FET2 and the HBT2 are turned on, so that the OFF-side can be kept turned off against a power having an amplitude of 1.6 V.

The amplitude of 1.6 V corresponds to a power of 20.1 dBm and can be sufficiently used for a wireless LAN and a Bluetooth.

As mentioned above, for example, the first switching element SW1 is started to be turned on when the potential of the first control terminal Ctl1, which is based on the potentials of the emitter and the collector of the HBT1, exceeds a value, which is obtained by adding the ON-voltage of HBT1 and the pinch-off voltage Vp of the FET1 (the same holds true for the second switching element SW2). In the third embodiment, the potentials of the emitters and the collectors of the HBT1 and HBT2 are set to GND. Moreover, although not illustrated, a bias circuit such as a resistance division is provided, and thereby it is possible to freely set the potentials of the emitters and the collectors of the HBT1 and HBT2. Accordingly, the value, which is obtained by adding the ON-voltage of each of HBT1 and HBT2 and the pinch-off voltage Vp of each of the FET1 and the FET2, is not limited to the aforementioned example, and even when any value is used, the same characteristic as that of the third embodiment can be obtained by adjusting the bias circuit. In other words, the FET1 and FET2 may be any of an enhancement type and the depletion type.

FIG. 8B is a circuit diagram illustrating an actual connection between the HBT1 and the FET1 and an actual connection between the HBT2 and the FET2 shown in FIG. 8A. Regarding the actual patterns of the HBT1 and the HBT2 that form the first and second switching elements SW1 and SW2, the collector, the base, and the emitter are arranged in a comb-tooth shape. Regarding the FET1 and the FET2, the source, the drain, and the gate are also arranged in a comb-tooth shape. Then, a connection between the base of the HBT1 and the source of the FET1 and a connection between the base of the HBT2 and the source of the FET2 correspond to each other for each comb-tooth in actual.

FIG. 8B shows the HBT1 and the FET1 and the HBT2 and the FET2 for each comb-tooth, namely, unit element 100. As mentioned above, the switch circuit device 220 of the third embodiment includes the first switching SW1 and the second switching SW2, each of which is formed by connecting a plurality of unit elements 100 in parallel, each of which is formed by connecting a first transistor (unit HBT) 101 and a second transistor (unit FET) 102 to each other. The unit FET 102 is a driving transistor for supplying the base current to the unit HBT 101.

The circuit diagram illustrating the unit element 100, the unit HBT 101, and the unit FET 102 is the same as that of the first embodiment, and the detailed explanation of overlapped portions is omitted.

One pair of the unit HBT 101 and the unit FET 102 is provided to be adjacent to each other interposing the isolation region, and the base of the unit HBT 101 and the source of the unit FET 102 are connected to each other to form one unit element 100 (broken line).

Then, the unit elements 100 are connected in parallel to form the first switching element SW1 and the second switching element SW2. Although the unit elements 100 are connected in parallel, the base and the source of the unit element 100 are not connected to the base and the source of other unit elements 100, respectively.

More specifically, in the unit element 100, the emitter and the collector of the unit HBT 101 and the drain and the gate of the unit FET 102 are connected to the emitter and the collector of the other unit HBT 101 and the drain and the gate of the other unit FET 102, respectively.

In each unit element 100, the drain of the unit FET 102 is connected to the power supply terminal $V_{DD}$. Then, the collector-emitter voltage $V_{CE}$ of the unit HBT 101 is biased to 0 V and the complementary signal is applied to the first and the second control terminals Ctl1 and Ctl2. Accordingly, a predetermined base current is applied to the unit HBT 101 of either the first switching element SW1 or the second switching element SW2 to become in conduction between the collector and the emitter. Or, the base current is set to 0 to cut off the unit HBT 101. As a result, the signal path is formed between the common input terminal IN and the first output terminal OUT1 or between the common input terminal IN and the second output terminal OUT2.

FIG. 8A schematically shows the above and also a state that the HBT1 of the first switching element SW1 includes the unit HBT 101 and the FET1 of the first switching element SW1 includes the unit FET 102. Similarly, this also illustrates a state that the HBT2 of the second switching element SW2 shown in FIG. 8A includes the unit HBT 101 and the FET2 of the second switching element SW2 includes the unit FET 102.

The above has explained the case in which the control signal applied to the first control terminal Ctl1 and the second control terminal Ctl2 is the complementary signal and either the first switching element SW1 or the second switching element SW2 is driven into conduction in connection with the operation of the switching circuit device of the third embodiment.

However, there is a case in which the control signals applied to the first control terminal Ctl1 and the second control terminal Ctl2 are L-level and both the first switching element SW1 and the second switching element SW2 are cut off when both are L-level.

Figure 9:
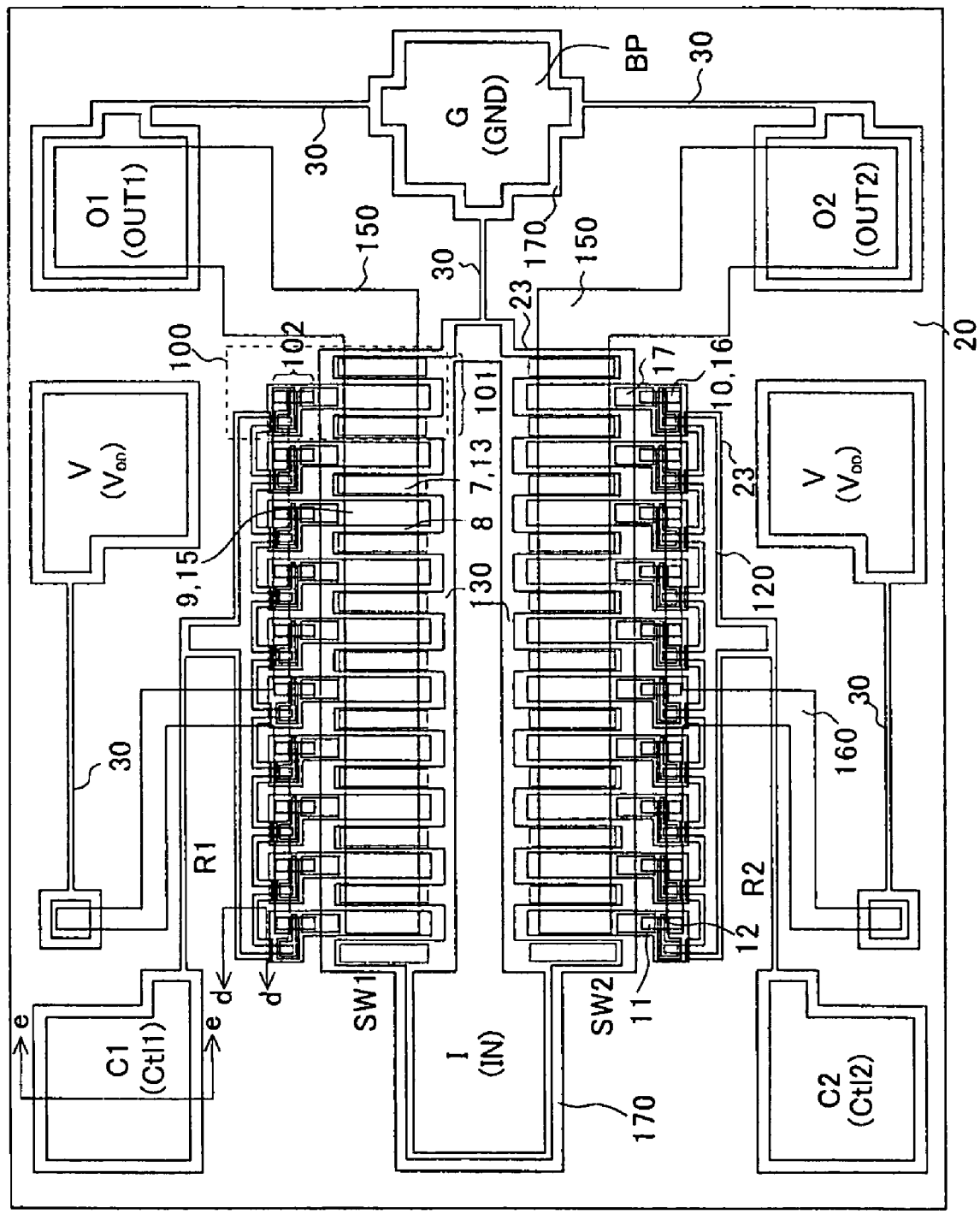
FIG. 9 is a plane view for explaining the third embodiment of the present invention.

FIG. 9 shows an example showing a pattern of a switch MMIC in which the circuit of FIG. 8B is integrated on a compound semiconductor substrate.

The first and the second switching elements SW1 and SW2 that perform switching are arranged on a substrate in which a plurality of semiconductor layers are grown on a semi-insulating GaAs substrate. Moreover, pads I、O1、O2、C1、C2、V 、G, which serve as a common input terminal IN, the first output terminal OUT1, the second output terminal output OUT2, the first control terminal Ctl1, the second control terminal Ctl2, a power supply terminal $V_{DD}$, and a ground terminal GND, are provided on a periphery of the substrate.

The first switching element SW1, the second switching element SW2 and the respective pads are arranged to be symmetric with respect to a center of a chip. Accordingly, although the following will explain the first switching element SW1, the same holds true for the second switching element SW2.

The switching element SW1 is formed by connecting a plurality of unit elements 100 in parallel and each unit element 100 includes the unit HBT 101 and the unit FET 102. The unit HBT 101 and the unit FET 102 are formed by etching a plurality of semiconductor layers on the semi-insulating GaAs substrate in a predetermined mesa shape. Moreover, other element, which forms the switch MMIC such as a resistor, is formed by a conductive region made of the semiconductor layer. Additionally, as described later, the conductive region of the present embodiment is an impurity region and isolated from the other region by an isolation region 20 reaching the substrate.

An emitter electrode 9, a base electrode 8, and a collector electrode 7 of the first metal layer of the unit HBT 101 are formed of ohmic metal layers in a comb-tooth shape. An emitter electrode 15 and a collector electrode 13 of the second metal layer are formed of wiring metal layers and the emitter electrode 15 is formed in the same comb-tooth shape as that of the emitter electrode 9 of the first metal layer. The collector electrode 13 of the second metal layer is connected to the collector electrode 13 of the other unit HBT 101 by a collector wiring 130 and further connected to the common input terminal pad I. An emitter wiring 150 is formed of a gold-plated layer on the emitter electrode 15 of the second metal layer and connected to the emitter electrode 15 of the other unit HBT 101 and further connected to the first output terminal padO1. Furthermore, the gold-plated layer is superimposed on the collector wiring 130.

The unit HBT 101 connects the emitter electrodes 9 and 15 and the collector electrodes 7 and 13 to the GND pad G serving as a bias point BP in order to lead the base current. The emitter electrode 15 is common-connected to the first output terminal padO1 by the emitter wiring 150. Accordingly, the connection between the output terminal padO1 and the GND pad G makes it possible to connect the emitter electrodes 9 and 15 to the bias point BP. Moreover, the collector electrode 13 is common-connected by the collector wiring 130. Accordingly, the connection between the collector wiring 130 and the GND pad G through the resistor as the isolation element 30 makes it possible to connect the collector electrodes 7 and 13 to the bias point BP. The bias point BP (the GND pad G) is placed at a portion, which is between the first output terminal pad O1 and the second output terminal padO2 and is opposite to the common input terminal pad I. This layout makes it possible to apply the bias potential to the emitter electrodes and the collector electrodes of the unit HBT 101 without ensuring a new space in particular.

A drain electrode 10, and a source electrode 11 of the first metal layer of the unit FET 102 are formed of the ohmic metal layer in an island shape. A drain electrode 16 of the second metal layer is formed of the wire metal layer in an island shape. On the drain electrode 16 of the second metal layer, a drain wiring 160 is formed of the gold-plated layer and connected to the drain electrode of the other unit FET 102 and further connected to the power supply terminal pad V.

The unit HBT 101 and the unit FET 102 are arranged to be adjacent to each other interposing the isolation region 20, the base electrode 8 of the unit HBT 101 and the source electrode 11 of the unit FET 102 are connected to each other by a connection wiring 17 formed of the wiring metal layer, and thereby the unit element 100 is formed.

On a conductive region (impurity region) 23 between the source electrode 11 and the drain electrode 10, a gate electrode 12 is formed of the gate metal layer. The gate electrode 12 is connected to the gate electrode 12 of the other unit FET 102 by a gate wiring 120 formed of the wiring metal layer, and further connected to the first control terminal pad C1 through the control resistor R1.

The resistor, serving as the isolation element 30, is connected between the first output terminal pad O1 and the ground terminal pad G. Furthermore, the resistor, serving as the isolation layer 30, is connected between the power supply terminal pad V and the drain wiring 160 and between the common input terminal pad I and the ground terminal pad G. The isolation element 30 prevents the high frequency signal from being leaked.

The control resistor R1 and the resistor (the isolation element 30) are the conductive region 23 isolated by the isolation region 20.

Moreover, a peripheral conductive region (impurity region) 170 is formed on a periphery of each pad and a periphery of the gate wiring 120, respectively, in order to improve the isolation.

An enlarged plane view of the unit element 100 is the same as FIG. 2. Referring to FIG. 2, each of the unit FET 102 is connected to each of the unit HBT 101 with the comb-tooth shape pattern to form the comb-tooth shape unit elements 100 are connected in parallel to form each of the first switching element SW1 and second switching element SW2 as the active element 200.

The first switching element SW 1 is one in which the unit elements 100 are connected in parallel. In other words, the collector electrodes 13 and 7 of the respective unit HBTs 101 are connected to one another by the collector wiring 130 and the emitter electrodes 15 and 9 of the unit HBTs 101 are connected to one another by the emitter wiring 150. Additionally, the collector electrodes 7 and 13 are shared by the adjacent unit elements 100. Furthermore, the gate electrodes 12 of the respective unit FETs 102 are connected to one another by the gate wiring 120 of the unit FET 102, and the gate wiring 120 of the unit FET 102 is connected to the first control terminal Ctl1. The drain electrodes 10 and 16 of the respective unit FETs 102 are connected to one another by the drain wiring 160 and connected to the power supply terminal $V_{DD}$.

Moreover, each gate electrode 12 of the unit FET 102 extends out of the operation region and is connected to the gate wiring 120 formed of the wiring metal layer. The gate wiring 120 connects the gate electrodes 12 to each other to be connected to the control terminal. The isolation region 20 is also provided around the gate wiring 120. It is noted that the same holds true for the second switching element SW2.

The other structural components are the same as those of the unit element 100 of FIG. 2 and the explanation is omitted.

Figure 10A:
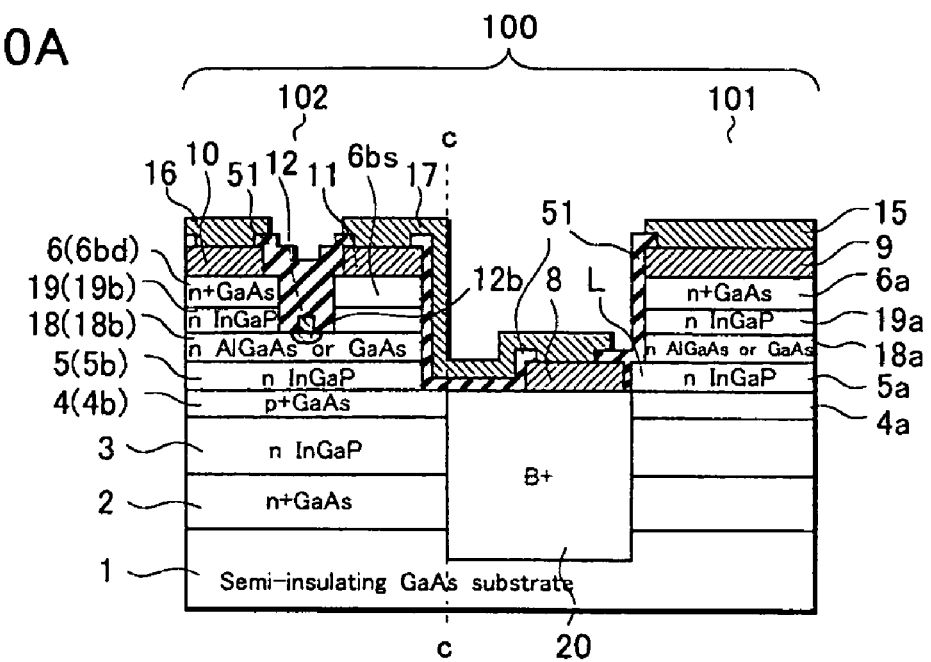
FIG. 10A is a cross-sectional view for explaining the third embodiment of the present invention.
Figure 10B:
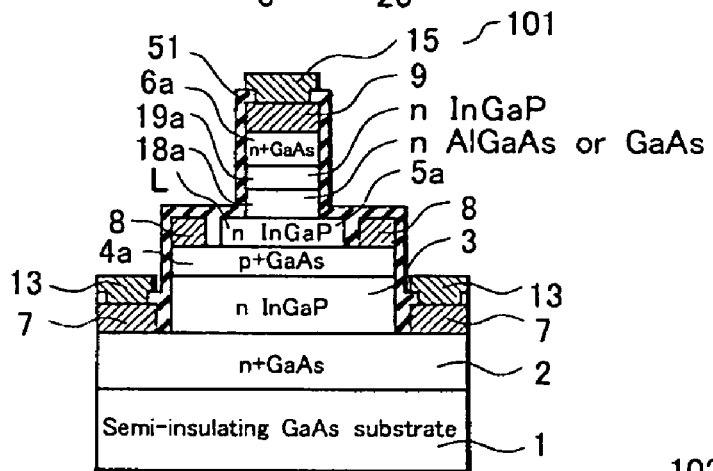
FIG. 10B is a cross-sectional view for explaining the same.
Figure 10C:
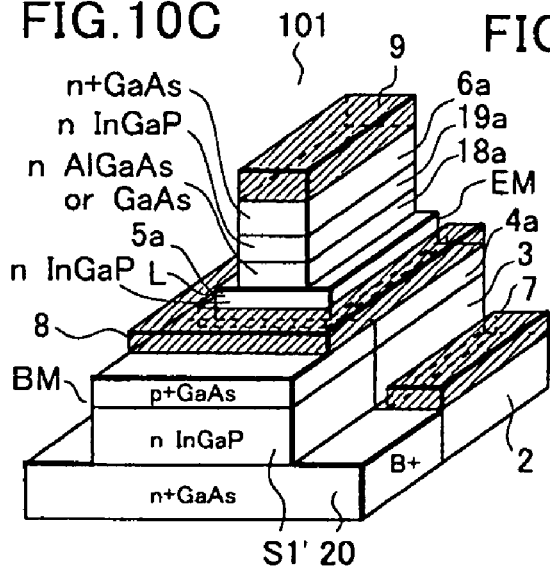
FIG. 10C is a perspective view for explaining the same.
Figure 10D:
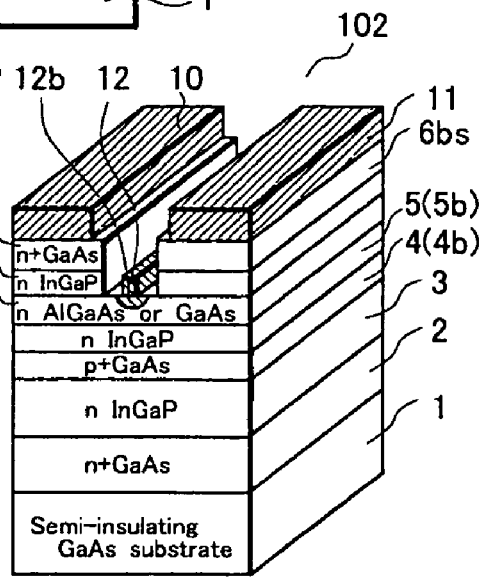
FIG. 10D is a perspective view for explaining the same.

FIGS. 10A to 10D are views illustrating the unit element 100 of the third embodiment, FIG. 10A is a cross sectional view taken along the line a-a of FIG. 2, FIG. 10B is a cross sectional view taken along the line b-b of FIG. 2, FIG. 10C is a perspective view of the unit HBT 101, and FIG. 10D is a perspective view of the unit FET 102. Additionally, in FIGS. 10C and 10D, electrodes of the second metal layer or more are omitted.

As mentioned above, the respective semiconductor layers, which form the unit element 100 (the active element 200), are appropriately selected based on the use of the active element 200. In the case of the active element 200 used in the switching circuit device, a collector layer 3 of the unit HBT 101 is the n type InGaP layer. The other structural components are the same as those of the unit element 100 of the first embodiment and the explanation is omitted.

In the third embodiment, only an n type AlGaAs layer (or n type GaAs layer) 18 is also selectively etched without etching an InGaP layer of an emitter layer 5a to form a thick ledge L having a predetermined thickness with a good reproducibility. Moreover, only the InGaP layer of the emitter layer 5a can be selectively etched without etching a p+ type GaAs layer of a base layer 4a.

Furthermore, an n type InGaP layer 19 is provided, thereby it is possible to expose a surface of the n type AlGaAs layer 18, on which the gate electrode of the unit FET 102 is formed, by the selection etching. Furthermore, the gate electrode 12 of the unit FET 102 is formed on the n type AlGaAs layer 18 and the buried portion 12b is placed in an n type AlGaAs layer 18b. This makes it possible to prevent the abnormal diffusion of Pt on the surface of the InGaP layer and ensure a predetermined breakdown voltage.

Also, in the present embodiment, the unit FET 102 and the unit HBT 101 are connected to be adjacent to each other for each unit element 100. Then, the layered structures of the semiconductor layers of both the unit HBT 101 and the unit FET 102 are the same, and the base layer 4a, the collector layer 3 and the subcollector layer 2 of the unit HBT 101 are geometrically continuous to the corresponding semiconductor layers of the FET 102, respectively. Accordingly, heat generated by the operation of the unit HBT 101 can be transmitted to the unit FET 102. Namely at least partially the collector layer of the unit HBT 101 should be geometrically continuous to the corresponding semiconductor layer of the unit FET 102 because of heat conductivity. Since a drain current of the unit FET 102 has a negative temperature coefficient, a base current of the unit HBT 101 has also a negative temperature coefficient. Accordingly, the heat generated by the unit HBT 101 results in a reduction in the collector current of the unit HBT 101.

The use of such a mechanism can prevent the occurrence of the secondary breakdown without adding any factor that degrades the high frequency characteristic such as the emitter ballast resistor, the base ballast resistor, so that the current density of the HBT can be largely improved as compared with the conventional case. As a result, on-resistances Ron of the first and second switching elements SW1 and SW2 can be considerably reduced to make it possible to extremely lessen an insertion loss of the switch MMIC.

As illustrated in FIGS. 10A to 10D, in the case of the unit element 100 used in the switching circuit device 220, the unit HBT 101 forms the InGaP/GaAs heterojunction with the emitter layer 5a and the base layer 4a. In addition to this, the InGaP/GaAs heterojunction is formed with the collector layer 3 and the base layer 4b. Then, parameters in the structure are designed in such a way that the transistor characteristics are substantially the same at the time of a transistor operation in a forward direction where the emitter layer 5a operates as the emitter (hereinafter referred to as a forward transistor operation time) and at the time of a transistor operation in a reverse direction where the emitter layer 5a operates as the collector (hereinafter referred to as a reverse transistor operation time), the operation is performed at a bias where the voltage between the collector and the emitter is around 0 V and the current between the collector and the emitter is around 0 A. In the present embodiment, as mentioned above, there is adopted the HBT (hereinafter referred to as symmetrical HBT) where the emitter and the collector are symmetric to each other with reference to the base.

The HEMT, which is generally used in the switch MMIC, is a unipolar device, while the HBT is a bipolar device to make it possible to overwhelmingly highly increase the current density and extremely reduce the on-resistance Ron. Moreover, the use of the symmetrical HBT as the unit HBT 101 allows an energy saving operation since a consumption current between the collector and the emitter is set to 0 A. The reason is that the voltage between the collector and the emitter can be biased to 0 V in the symmetrical HBT in the same way that the voltage between the drain and the source is biased to 0 V in the HEMT.

An explanation will be given of the symmetrical HBT with reference to characteristic views of FIGS. 11A and 11B. This figure shows a V-I curve between a collector-emitter voltage $V_{CE}$ and a collector current Ic in connection with a predetermined base current $I_B$ of the symmetrical HBT.

A transistor, where the collector-emitter voltage $V_{CE}$ and the collector current Ic show a positive (+) value, is referred to as a forward transistor and a transistor, where the collector-emitter voltage $V_{CE}$ and the collector current Ic show a negative (−) value, is referred to as a reverse transistor in connection with a predetermined base current $I_B$.

Figure 11A:
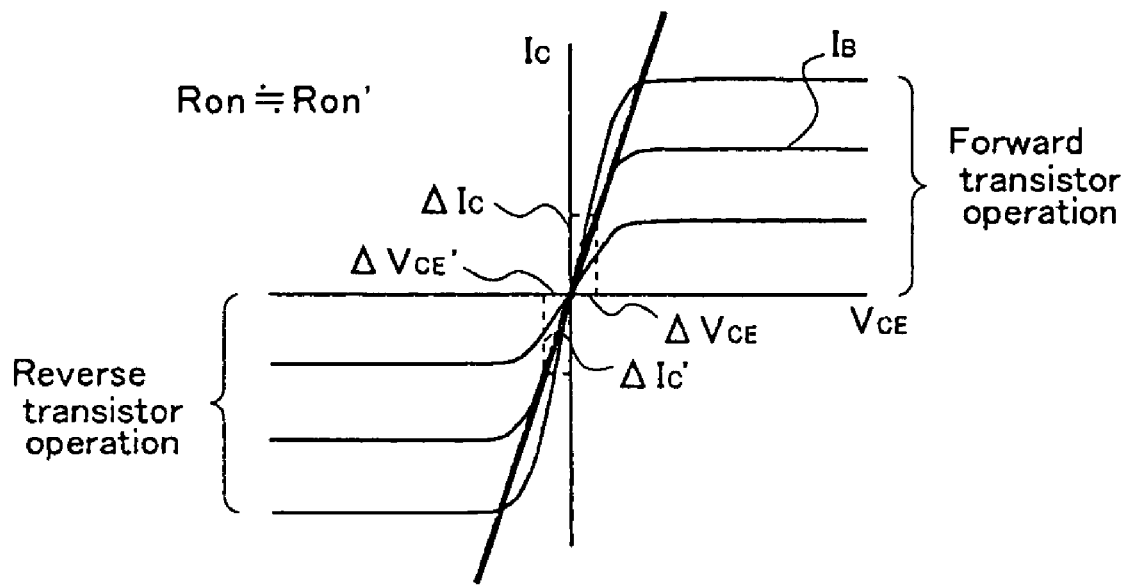
FIGS. 11A and 11B are characteristic views for explaining the third embodiment of the present invention.

As illustrated in FIG. 11A, the symmetrical HBT is a HBT which is formed in such a manner that the on-resistance Ron $(=\Delta V_{CE}/\Delta Ic)$ at the forward transistor operation time and an on-resistance Ron' $(=\Delta V_{CE}'/\Delta Ic')$ at the reverse transistor operation time are substantially equal to each other as shown by a thick line. In order to implement this, the emitter layer 5a and the collector 3 have basically the same structure. For example, when the InGaP layer is used as the emitter layer 5a, the InGaP layer is also used as the collector layer 3. Then, when the InGaP layer is used as the emitter layer 5a and the collector layer 3, each is lattice matched to the AlGaAs layers or the GaAs layers (the base layer 4a, subcollector layer 2 and n type AlGaAs layer 18a). Moreover, when the AlGaAs layer is used as the emitter layer 5a and the collector layer 3, a mole ratio of Al is set to the same.

Then, the impurity concentration of the emitter layer 5a and that of the collector layer 3 are set to be substantially the same value. As a result, although the base-collector breakdown voltage is reduced as compared with the general HBT, 7 to 8 V of the base-collector breakdown voltage is sufficient for the switching circuit device.

The symmetrical HBT is operated at the bias where the voltage between the collector and the emitter is 0 V, and thereby it is possible to basically set a consumption current between the collector and the emitter to 0 A.

Figure 11B:
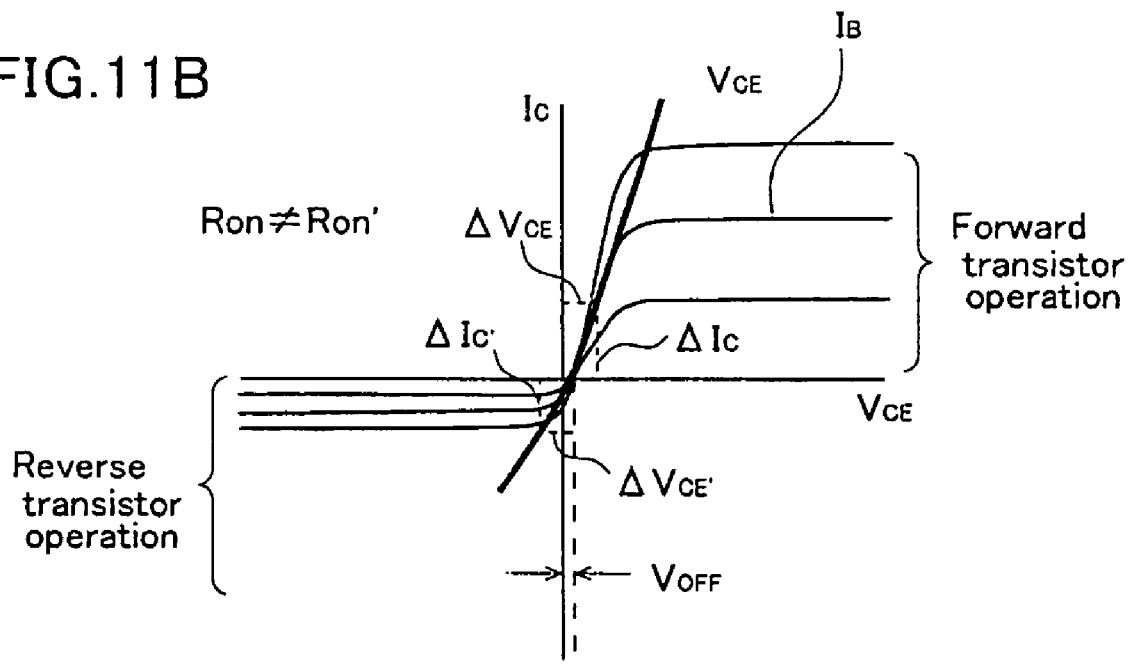

FIG. 11B shows a characteristic of an asymmetrical HBT. In the asymmetrical HBT, a turn-on voltage of the forward transistor is not 0 V, and an offset voltage $V_{OFF}$ of about a hundred to several hundreds mV is formed as the turn-on voltage. In this case, when the collector-emitter voltage $V_{CE}$ is biased to 0 V, some consumption current will be generated between the collector and the emitter. Moreover, since the emitter and the collector are different from each other in the structure, the on-resistance Ron at the forward transistor operation time is largely different from the on-resistance Ron' at the reverse transistor operation time as illustrated by a thick line.

Here, the thick line indicates a load line of the operation and a half of the operation is the operation of the reverse transistor. In other words, when the collector-emitter voltage $V_{CE}$ is biased to 0 V, the load line of the operation is bent in the vicinity of the bias point to considerably degrade a distortion level. Moreover, since an amount of current of the reverse transistor is extremely smaller than that of the forward transistor, power, which can be passed, is small. Furthermore, since the on-resistance Ron' at the reverse transistor operation time is extremely large, the insertion loss is considerably increased.

On the other hand, in the symmetrical HBT, the emitter and the collector have substantially the same structures (the same compound semiconductor and substantially the same impurity concentration). Accordingly, as illustrated in FIG. 11A, in the symmetrical HBT, the offset voltage is almost 0 V. Therefore, when the collector-emitter voltage $V_{CE}$ is biased to 0 V, the consumption current between the collector and the emitter can be set to 0 A. Moreover, since the load line of the operation is not bent at the bias point, the distortion level can be maintained well. Furthermore, since the current of the reverse transistor and that of the forward transistor are the same, power, which can be passed, can be increased. Still furthermore, since the on-resistance Ron' at the reverse transistor operation time is small similar to the on-resistance Ron at the forward transistor operation time, the insertion loss can be reduced.

Figure 12A:
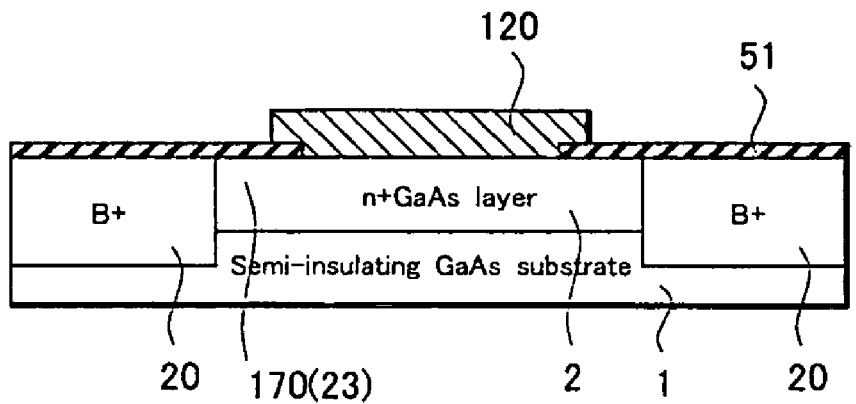
FIGS. 12A to 12C are cross-sectional views for explaining the third embodiment of the present invention.
Figure 12B:
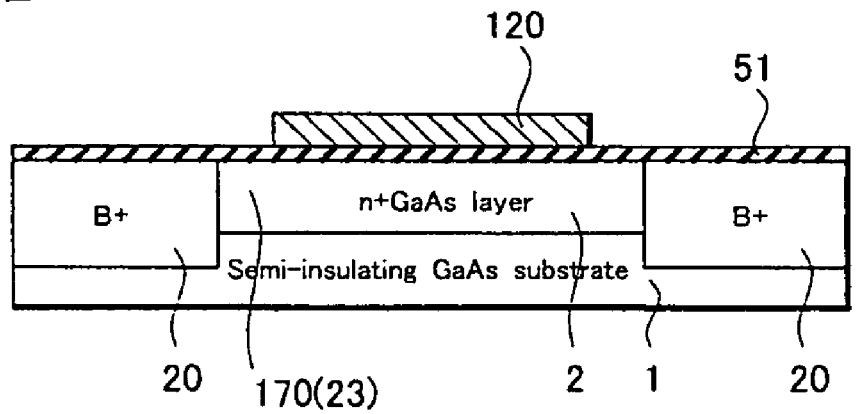
Figure 12C:
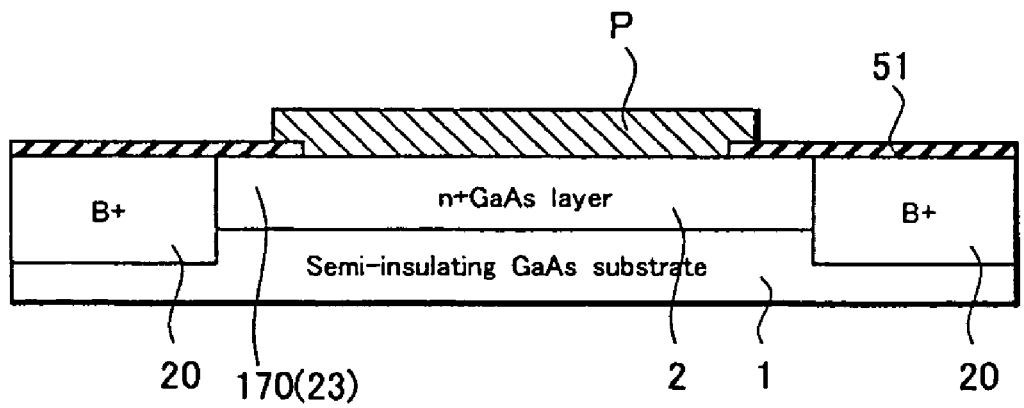

FIGS. 12A to 12C are cross sectional views showing the pads and the wiring. FIG. 12A and FIG. 12B are cross sectional views each being taken along the line d-d of FIG. 9, and FIG. 12C is a cross sectional view taken along the line e-e of FIG. 9.

As illustrated in FIG. 12A to 12C, on the subcollector layer (n+ type GaAs layer), there are formed pads D, which serve as the common input terminal pad I, the first output terminal pad O1, the first control terminal pad C1 (the same holds true for the second switching element SW2), the power supply terminal pad V, and the ground terminals pad G, and the gate wiring 120. The pads P and the gate wiring 120 are formed on the subcollector layer 2 through a nitride film 51 (FIG. 12B), or directly formed on the subcollector layer 2 to form a Schottky junction with the surface of the subcollector 2 (FIGS. 12A and 12C).

Here, in order to increase the isolation of the pads P and the gate wiring 120, the peripheral conductive region 170 is provided around the pads P and the gate wiring 120. As mentioned above, the peripheral conductive region 170 is the conductive region 23, which is isolated from the other region by the insulating region 20.

FIGS. 13A to 14B illustrate the other embodiments of a unit element 100 that forms an active element 200 for a switching element as a fourth embodiment. In the case for the switching element, a structure of an epitaxial layer of each unit element 100 is basically the same structure as illustrated in FIG. 10, but the structure described below may be used.

Figure 13A:
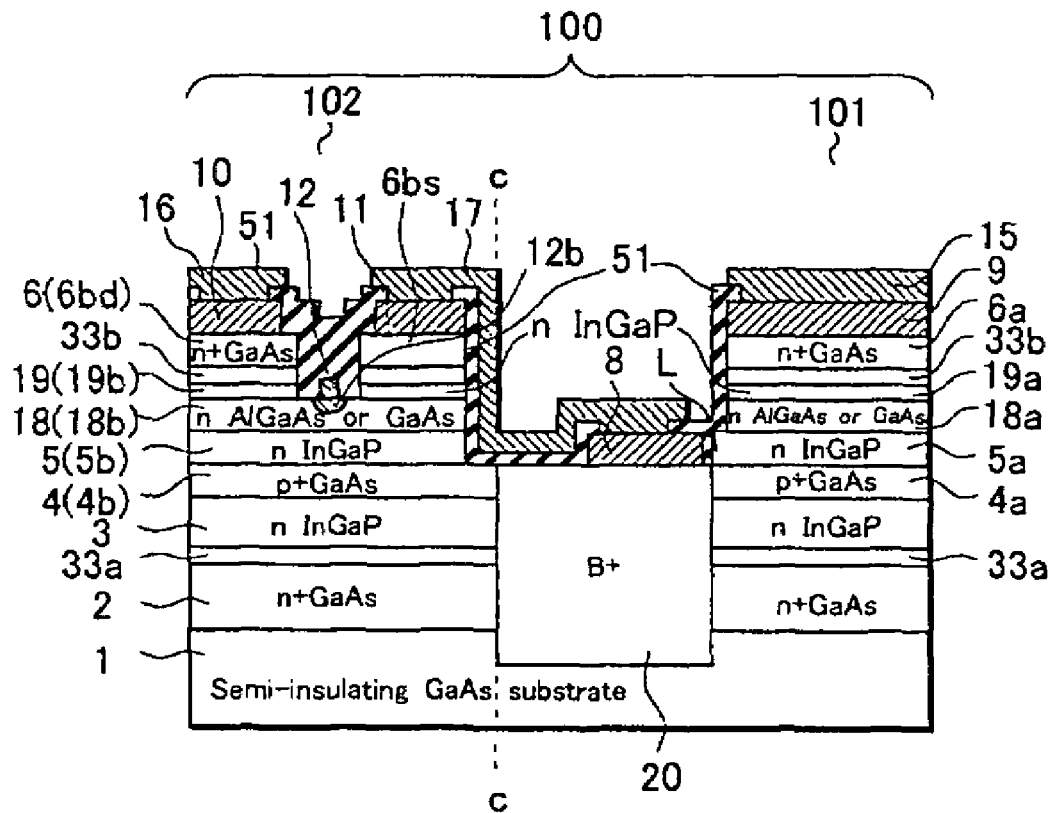
FIGS. 13A and 13B are cross-sectional views for explaining a fourth embodiment of the present invention.
Figure 13B:
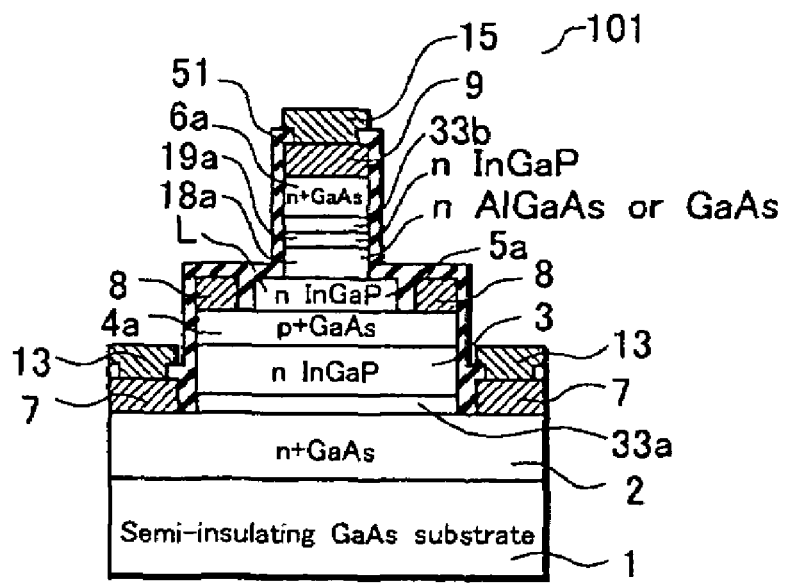

FIG. 13A is a cross-sectional view of the unit element 100 corresponding to a cross section taken along the line a-a of FIG. 2, and FIG. 13B is a cross-sectional view of a unit HBT 101 corresponding to a cross section taken along the line b-b of FIG. 2.

As mentioned above, according to the present embodiment, a secondary breakdown can be prevented from occurring even if a ballast resistor layer is not provided. However, there is a case in which the secondary breakdown cannot be fully prevented depending on the design of a unit FET 102 and the unit HBT 101 that form the unit element 100. Moreover, there is a difficulty in completely preventing the secondary breakdown from occurring when an extremely large current is made to flow to the unit HBT 101. In such a case, the ballast resistor layer is added to the epitaxial structure of the unit HBT 101, thereby measures against the secondary breakdown may be taken again.

In other words, an n– type GaAs layer 33b, serving as the ballast resistor layer, is formed above an emitter layer 5a. Moreover, in the case of a switching circuit device 220, since the emitter and the collector of the unit HBT 101 symmetrically operates with respect to the base, an n– type GaAs layer 33a, serving as the ballast resistor layer, is also formed under the collector layer 3. The n– type GaAs layers 33a and 33b, each having a predetermined resistance value, serve as the ballast resistor layers, and thereby it is possible to prevent the secondary breakdown from occurring by the concentration of the current on one of the unit elements 100.

The ballast resistor layers 33a and 33b may be formed of an undoped GaAs layer, an n– type InGaP layer or an undoped InGaP layer. The other semiconductor layers are the same as those of FIG. 10B. In the conventional HBT 320', the provision of the ballast resistor degrades the high frequency characteristic. However, in the present embodiment, since the active element 200 includes the temperature-compensation unit elements 100, the same effect can be obtained with the ballast resistor having a lower resistance value than that of the conventional HBT even in a case where the ballast resistor is provided. Accordingly, this makes it possible to reduce a degree of deterioration in a high frequency characteristic caused by providing the ballast resistor as compared with the conventional case.

In this case, as illustrated in FIG. 13A, although an n– type GaAs layer 33 is also provided in the unit FET 102, the amount of current flowing to the unit FET 102 is small and the influence exerted by the provision of the n– type GaAs layer 33 is small.

Figure 14A:
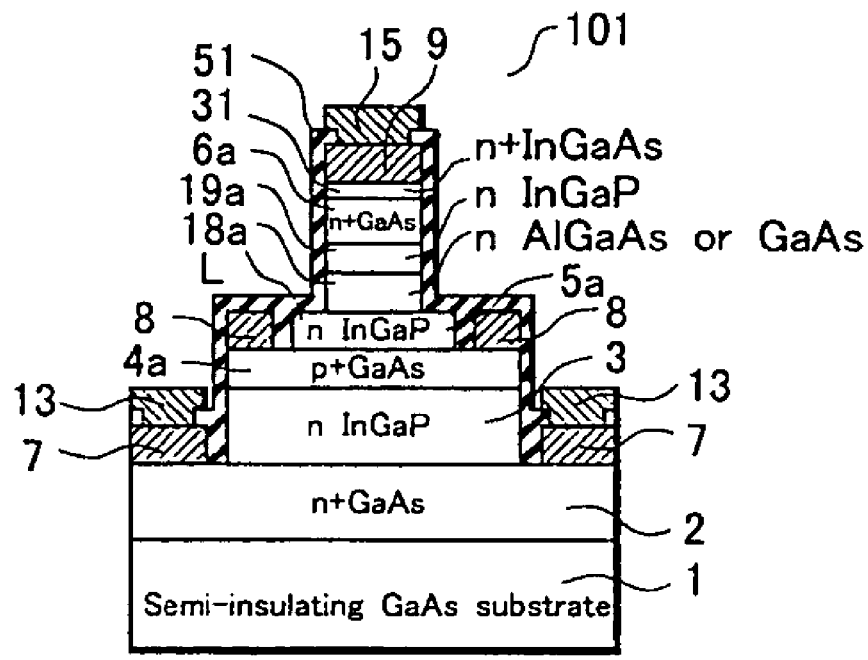
FIGS. 14A and 14B are cross-sectional views for explaining the fourth embodiment of the present invention.
Figure 14B:
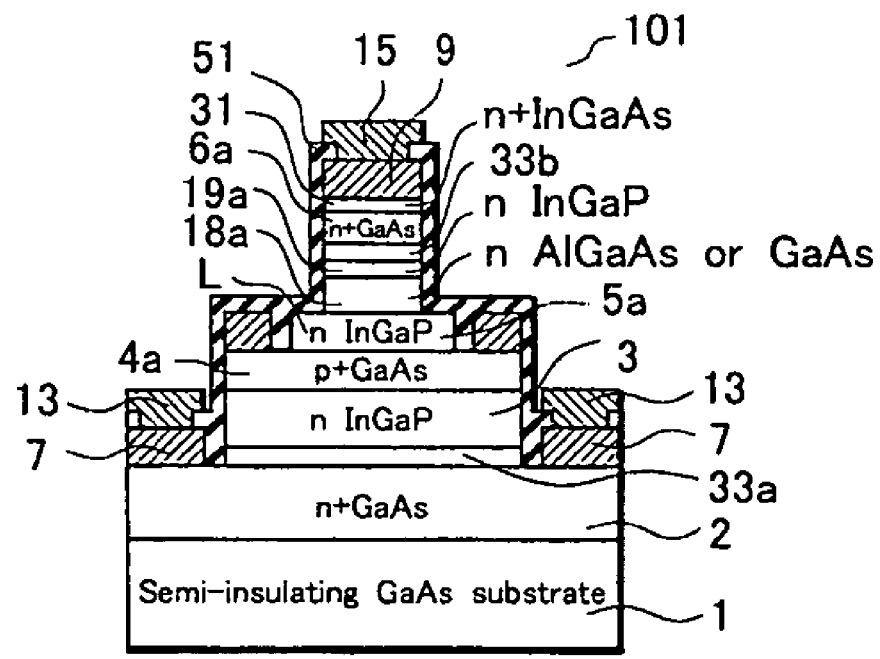

FIGS. 14A and 14B show cases in which non-alloy ohmic layers are added and the contact layer of the emitter electrode 9 serve as the non-alloy ohmic layer in the third embodiment. FIG. 14A is a case in which the non-alloy ohmic layer is formed in the unit HBT 101 of FIG. 10 and FIG. 14B is a case in which the non-alloy ohmic layer is further formed in the structure having the ballast resistor layer of FIG. 13. It is noted that FIG. 14 shows only a cross-sectional view (corresponding to the cross section taken along the line b-b of FIG. 2) of the unit HBT 101. A non-alloy ohmic layer 31 is formed on an emitter contact layer 6a in order to reduce the contact resistance of the emitter contact layer 6a. The non-alloy ohmic layer 31 is an n+ type InGaAs layer. In this case, the emitter contact layer 6a is the n+ type GaAs layer and other semiconductor layers are the same as those of FIG. 10B. Although not illustrated, at this time, the non-alloy ohmic layer 31 is also concurrently formed on contact layers 6bs and 6bd in the unit FET 102.

In the present embodiment, the symmetrical HBT is used as the unit HBT 101 to form the switching circuit device. This implements the switching circuit where a consumption current between a collector and an emitter is 0 A. Moreover, in the symmetrical HBT, since an on-resistance Ron at a forward transistor operation time and an on-resistance Ron' at a reverse transistor operation time is almost equal to each other, it is possible to obtain the switch circuit having a good linearity at a switching point for a portion where a collector-emitter voltage $V_{CE}$ is positive and a portion where the collector-emitter voltage $V_{CE}$ is negative in connection with an amplitude of a high frequency signal.

In the switch circuit of a GaAs MESFET or an MEMT, since a bias between the drain and the source is 0 V, the consumption current between a drain and a source is 0 A, and the good linearity is obtained at a switching point for a portion where a drain-source voltage $V_{DS}$ is positive and the portion where the drain-source voltage $V_{DS}$ is negative in connection with the amplitude of the high frequency signal. Namely, the switching circuit device 220 of the present embodiment has the same advantage as that of the switch circuit of the GaAs MESFET or MEMT. Moreover, the on-resistance of the HBT of a bipolar device is overwhelmingly lower than that of the FET of a unipolar device. Since the switching element of the present embodiment includes the unit element 100 in which the unit FET 102 is connected to the unit HBT 101, the characteristic of the HBT can be obtained in connection with the on-resistance. Namely, in the switching circuit device 220, the high frequency characteristic can be largely improved and a chip size can be largely miniaturized.

The following will explain a fifth embodiment of the present invention with reference to FIGS. 15A to 17. The fifth embodiment is a switching circuit device in which a logic circuit and a switching circuit such as the third embodiment are integrated to make it possible to perform an operation by one control terminal.

Figure 15A:
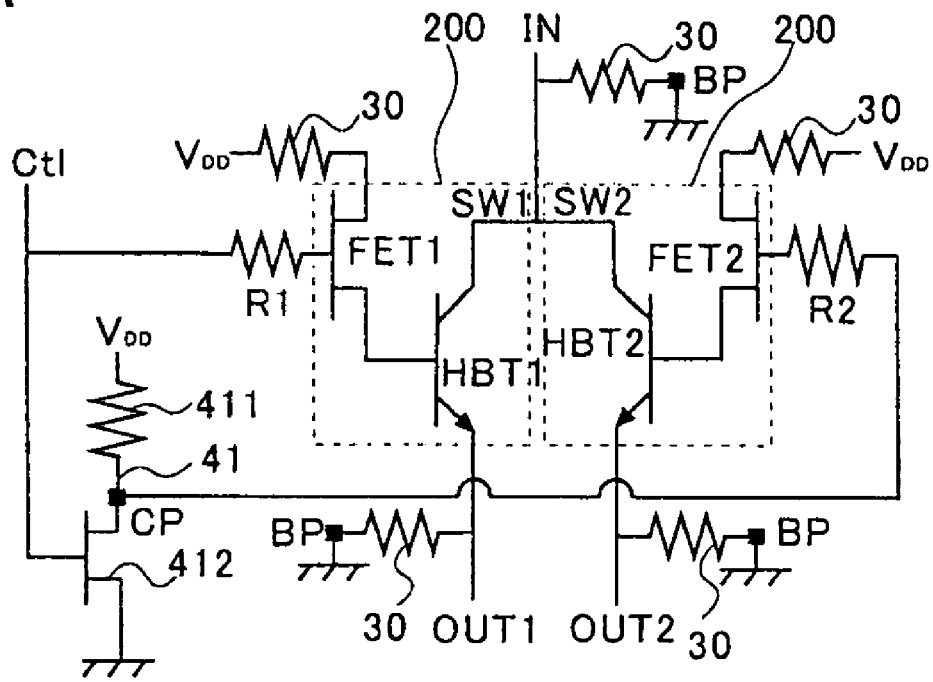
FIGS. 15A and 15B are circuit schematic diagrams for explaining a fifth embodiment of the present invention.
Figure 15B:
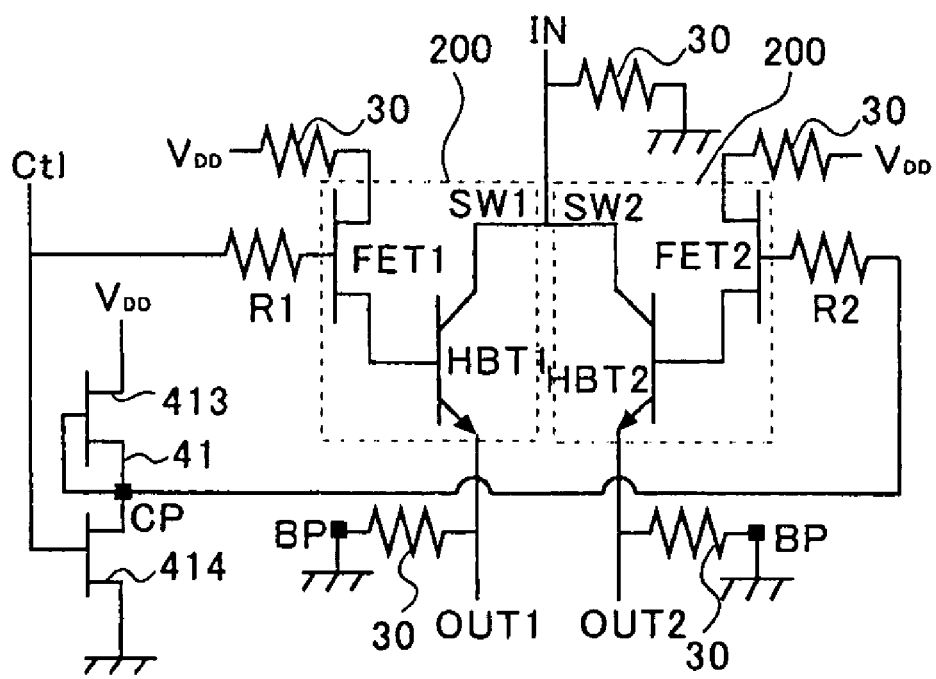

FIGS. 15A and 15B are circuit diagrams. Additionally, FIGS. 15A and 15B show the same circuit schematic diagram as that of FIG. 8A, and first and second switching elements SW1 and SW2 actually correspond to the structure shown in FIG. 8B.

FIG. 15A shows a case in which an inverter circuit 41 with a load resistance is connected as a logic circuit. In other words, a load resistance 411 and a GaAs MESFET 412 (pinch-off voltage Vp=0.25 V: enhancement type) are connected in series to each other at a connection point CP, and the connection point CP and, for example, a gate of an FET2 of the second switching element SW2 are connected to each other through a control resistor R2. A gate of the MESFET 412 is connected to one control terminal Ctl.

FIG. 15B shows a case in which the inverter circuit 41 of an enhancement/depletion DCFL (Direct Coupled FET Logic) is connected as the logic circuit. In other words, a source and a gate of a depletion type MESFET 413 (pinch-off voltage Vp=–0.4 V) and a drain of an enhancement type MESFET 414 (pinch-off voltage Vp=0.25 V) are connected to each other at the connection point CP, and the connection point CP and, for example, the gate of the FET2 are connected to each other through the control resistor R2. Moreover, a gate of the enhancement type MESFET 414 is connected to one control terminal Ctl. In both FIGS. 15A and 15B, the other structural components are the same as those of the third embodiment and the explanation is omitted.

As mentioned above, the inverter circuit 41 is connected, a control signal applied to a control terminal Ctl is applied to a gate of an FET1 of the first switching element SW1 and a complementary signal of the control signal is applied to the gate of the FET2 of the second switching element SW2. Namely, the number of control terminals can be set to one by the SPDT switch MMIC.

The logic circuit 41 can be also formed of the resistor and/or the MESFET. In other words, the switching circuit and the logic circuit can be integrated one chip of the GaAs Switch MMIC.

Figure 16A:
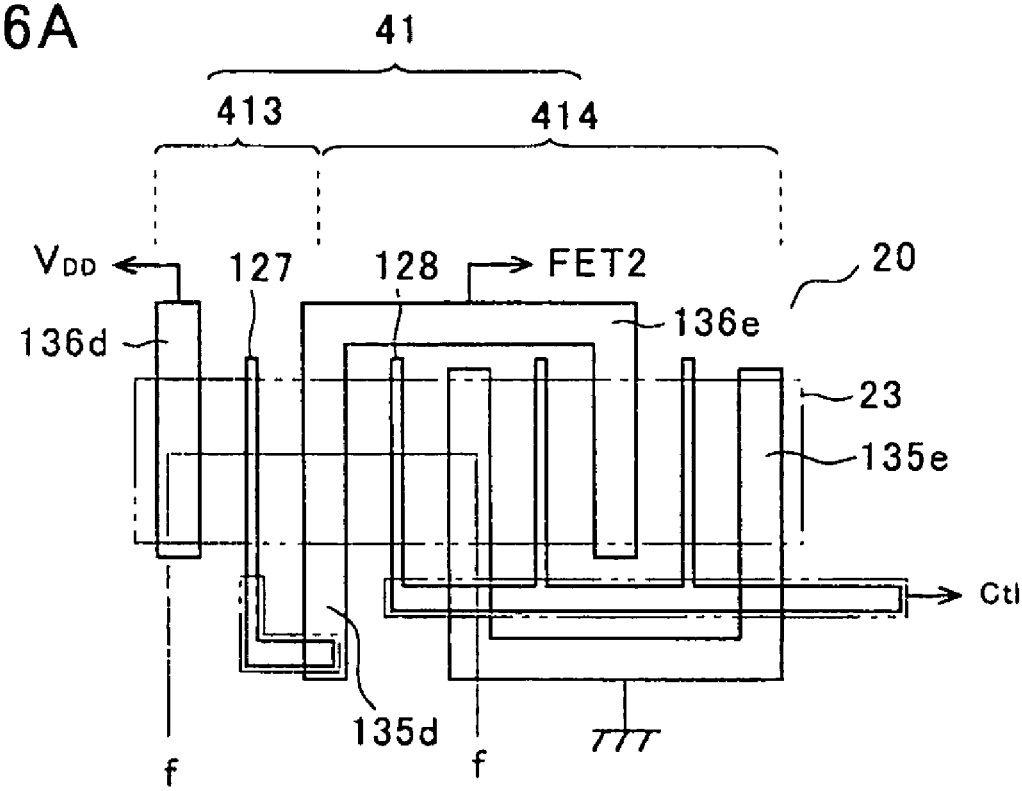
FIG. 16A is a plane view for explaining the fifth embodiment of the present invention.
Figure 16B:
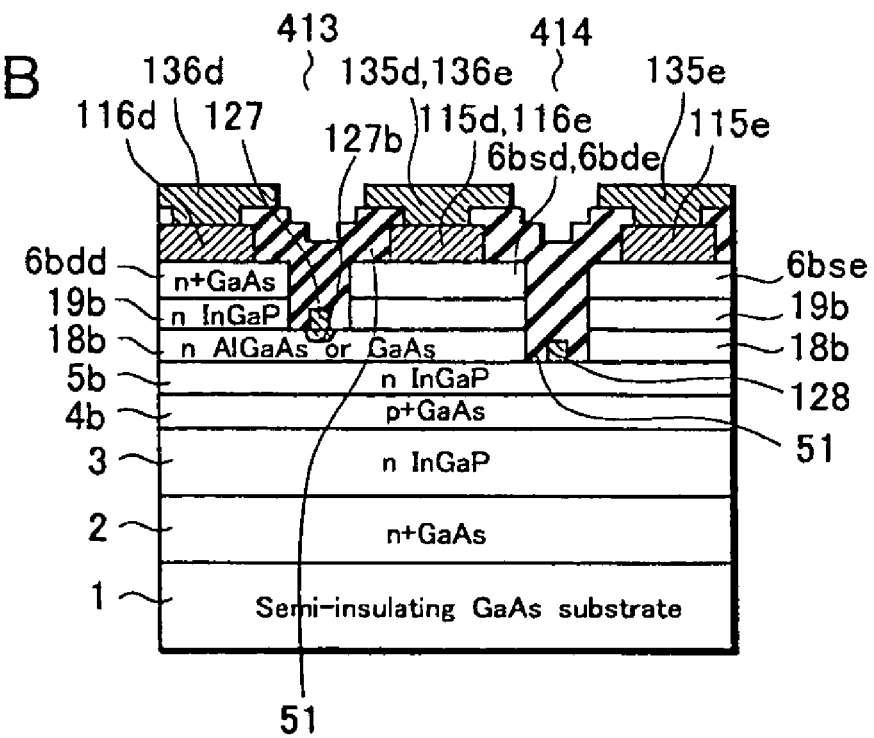
FIG. 16B is a cross-sectional view for explaining the same.

FIGS. 16A and 16B show the inverter circuit 41 of the enhancement/depletion DCFL illustrated in FIG. 15B. FIG. 16A is a plane pattern view and FIG. 16B is a cross-sectional view taken along the line f-f of FIG. 16A.

The D-type FET 413 is the same as the unit FET 102 shown in FIGS. 10A and 10D. In other words, a first gate electrode 127 is formed between a source electrode 135*d* and a drain electrode 136*d* of a second metal layer both which are formed of a wiring metal layer. A source electrode 115*d* and a drain electrode 116*d* of the first metal layer, both which are formed of ohmic metal layers, are provided at a lower portion of the source electrode 135*d* and the drain electrode 136*d*, and an operation region is isolated by an isolation region 20 shown by a chain double-dashed line. The source electrode 115*d* and the drain electrode 116*d* are connected to contact layers 6*bsd* and 6*bdd*, respectively.

The first gate electrode 127 is formed between the source electrode and the drain electrode and is connected to the source electrode 135*d* of the second metal layer out of the operation region. Moreover, the first gate electrode 127 is formed on a surface of an n type AlGaAs layer 18*b* and a buried portion 127*b* is placed in the n type AlGaAs layer 18*b*. Then, a channel layer of the D-type FET 413 is formed of a channel lower layer (n type InGaP layer) 5*b* and the channel upper layer (n type AlGaAs layer) 18*b*, similar to the channel layer of the unit FET 102.

On the other hand, a channel layer of the E-type FET 414 is formed of only the channel lower layer (n type InGaP layer) 5*b*. Then, in the E-type FET 414, a source electrode 135*e* and a drain electrode 136*e* of the second metal layer, both which are formed of the wiring metal layers, are alternately provided and a second gate electrode 128 is formed on the surface of the channel lower layer (n type InGaP layer) 5*b* therebetween. The gate metal layer of the second gate electrode 128 is, for example, Ti/Pt/Au and has no buried gate electrode structure unlike the first gate electrode 127.

A source electrode 115*e* and a drain electrode 116*e* of the first metal layer, both which are formed of the ohmic metal layer, are provided at the lower portion of the source electrode 135*e* and the drain electrode 136*e*. The source electrode 115*e* and the drain electrode 116*e* are connected to contact layers 6*bse* and 6*bde*, respectively.

The drain electrode 136*e* of the second metal layer at an end portion of the E-type FET 414 (the same holds true for the drain electrode 116*e* of the first metal layer) is shared with the source electrode 135*d* of the second metal layer of the D-type FET 413 (the same holds true for the source electrode 115*d* of the first metal layer). Similarly, the drain contact layer 6*bde* at the end portion of the E-type FET 414 is shared with the source contact layer 6*bsd* of the D-type FET 413.

As mentioned above, the D-type FET 413 and the E-type FET 414 are made different in the semiconductor layers on which the first and second gate electrodes 127 and 128 are formed. Accordingly, each predetermined pinch-off voltage Vp is implemented by setting a distance between a bottom portion (bottom portion of the buried portion 127*b*) of the first gate electrode 127 and a bottom portion of the channel lower layer 5*b* and a distance between a bottom portion of the second gate electrode 128 and a bottom portion of the channel lower layer 5*b*.

For forming the logic circuit, the second electrode 128 of the E-type FET 414 does not have the buried gate electrode structure and only the first gate electrode 127 has the buried gate electrode structure. As mentioned above, since the buried portion 127*b* of the first electrode 127 is positioned in the n type AlGaAs layer 18*b*, it is possible to prevent Pt from being abnormally diffused on the surface of the InGaP layer. On the other hand, since the E-type FET 414 does not need a large breakdown voltage, a predetermined breakdown voltage can be sufficiently ensured even if no buried gate electrode structure is provided.

Further, the first gate electrode 127 and the second gate electrode 128 are formed on the surface of the channel upper layer (n type AlGaAs layer) 18*b* and the surface of the channel lower layer (n type InGaP layer) 5*b*, respectively. In this case, a recess etching for exposing a surface on which the first gate electrode 127 can be executed with a good reproducibility by a selection etching of an n type InGaP layer 19*b* and the channel upper layer (n type AlGaAs layer) 18*b*. Furthermore, the recess etching for exposing a surface on which the second gate electrode 128 is formed can be executed with a good reproducibility by the selection etching of the channel upper layer (n type AlGaAs layer) 18*b* and the channel lower layer (n type InGaP layer) 5*b*.

As mentioned above, the n type InGaP layer 19b and the channel upper layer (n type AlGaAs layer) 18b are formed between the channel lower layer (n type InGaP layer) 5b and the n+ type GaAs layer 6, and thereby it is possible that the recess etching for exposing the surface on which each of the first gate electrode 127 and the second gate electrode 128 is formed by the selection etching in connection with each of the D-type FET 413 and the E-type FET 414.

Additionally, in the case of the logic circuit shown in FIG. 15A, the E-type FET 412 is needed. On the other hand, the unit FET 102, which forms the first switching element SW1 (the same holds true for the second switching element SW2), is the D-type FET. Namely, in the case of FIG. 15A, the E-type FET 412 of the logic circuit and the D-type FET of the unit FET 102 must be formed on the same substrate (the same semiconductor layers). In this case, the cross-sectional view of each of the unit FET 102 (D-type FET) and the E-type FET 412 of the logic circuit are the same as that of FIG. 16B although the D-type FET and the E-type FET are not adjacent to each other in view of the pattern. That is, the recess etching for exposing the surface on which each of the first gate electrode 127 of the unit FET 102 (D-type FET) and the second gate electrode 128 of the E-type FET 412 of the logic circuit is formed can be executed by the selection etching.

Figure 17:
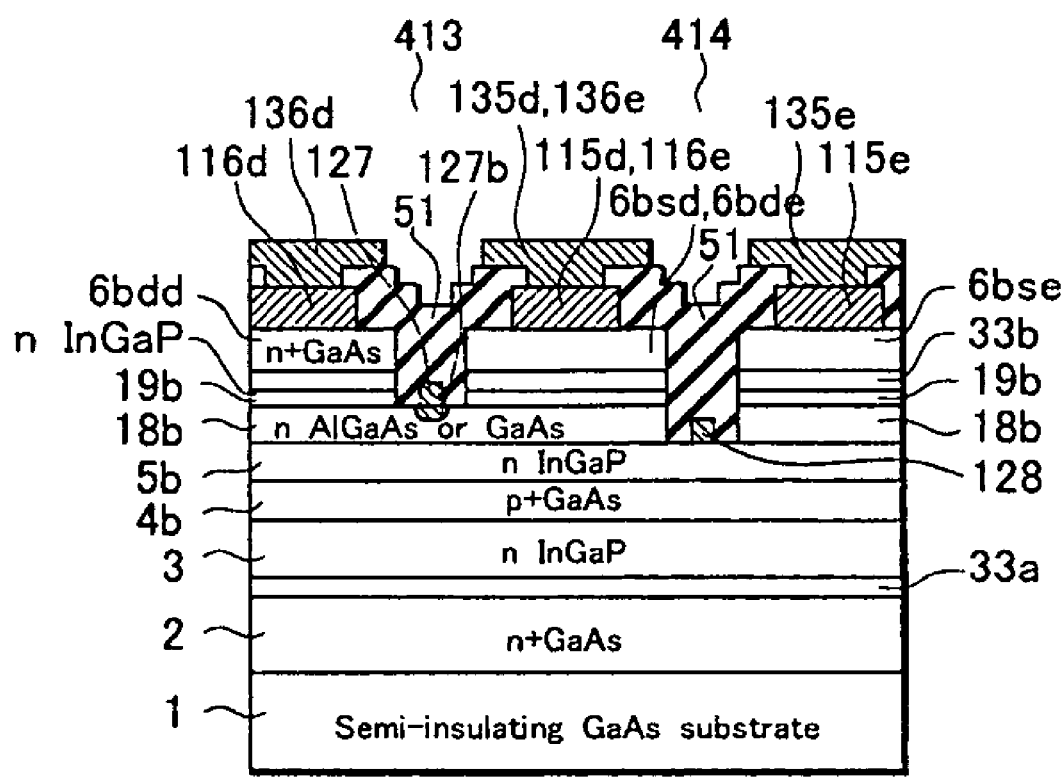
FIG. 17 is a cross-sectional view for explaining the fifth embodiment of the present invention.

FIG. 17 is a cross-sectional view, which shows the D-type FET413 and the E-type FET 414, corresponding to FIG. 16B when ballast resistor layers are formed as illustrated in FIG. 13B in the switch circuit device including the logic circuit.

The unit HBT 101 is similarly the symmetrical HBT and ballast resistor layers 33a and 33b are similarly formed in the D-type FET 413 and the E-type FET 414 which are integrated on the same substrate.

Since an operating current of the logic circuit is small, the ballast resistor layers 33a and 33b do not affect the operation of the logic circuit in this case. Moreover, even when these ballast resistor layers 33a and 33b are formed, the recess etching for exposing the surfaces on which the first gate electrode 127 and the second gate electrode 128 are formed can be executed by the selection etching. Furthermore, although not adjacent to each other, the E-type FET 412 of the logic circuit of FIG. 15A and the unit FET 102 (D-type FET) are the same as those of FIG. 17. In other words, the recess etching for the first gate electrode 127 and the second gate electrode 128 can be executed by the selection etching.

Figure 18:
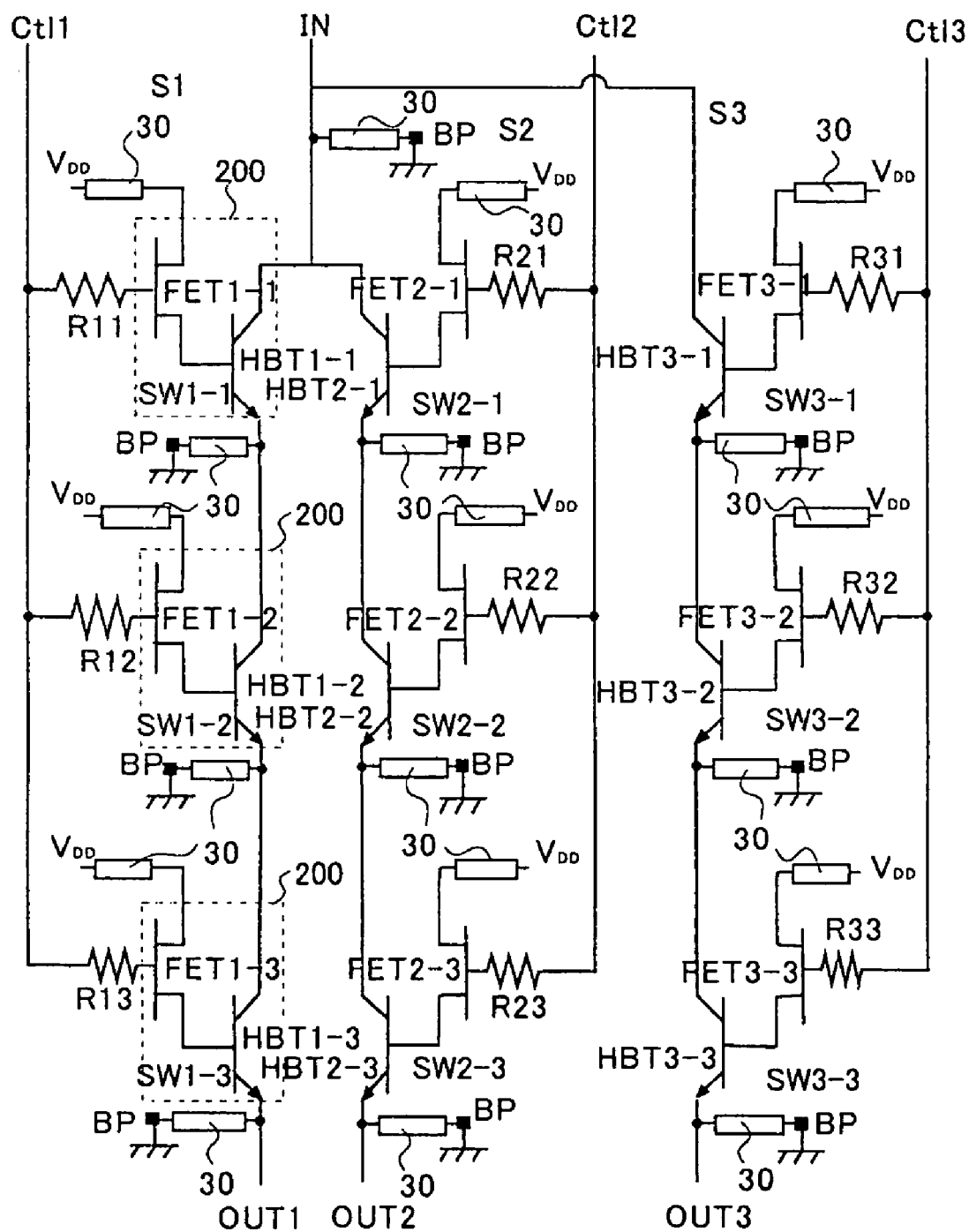
FIG. 18 is a circuit schematic diagram for explaining a sixth embodiment of the present invention.

FIG. 18 is a circuit schematic diagram showing a sixth embodiment.

The sixth embodiment is a SP3T (Single Pole Three Throw) switch MMIC. Similar to the third embodiment, FIG. 18 shows the circuit schematic diagram corresponding to FIG. 8A, and the respective switching elements SW1 and SW2 actually correspond to the structure shown in FIG. 8B.

The SP3T includes a first switching group S1, a second switching group S2, and a third switching group S3, each having switching elements SW which are multistage connected in series. The collector of one end of the first switching element group S1, that of the second switching element group S2 and that of the third switching element group S3 are connected to a first RF port in common. The first RF port is, for example, a common input terminal IN.

The first switching element group S1 is one in which switching elements SW1-1, SW1-2, and SW1-3 are connected in series. Each of the switching elements SW1-1, SW1-2 and SW1-3 is formed by connecting plurality of unit elements 100 in parallel each which is formed by connecting a source of a unit FET 102 to a base of a unit HBT 101, similar to FIG. 8B. The cross-sectional view and the perspective view of the unit element 100 are the same as those of FIGS. 10A to 10D, and the unit HBTs 101 of the respective active elements 200, serving as first switching elements SW1-1, SW1-2, and SW1-3, are collectively illustrated by an HBT1-1, an HBT1-2, and an HBT1-3, respectively, and the unit FETs of the respective active elements 200 are collectively illustrated by an FET1-1, an FET1-2, and an FET1-3, respectively.

The FET1-1, the FET1-2, and the FET1-3 are MESFETs, and the source is connected to the base of each of the HBT1-1, the HBT1-2, and the HBT1-3. Then, gates of the FET1-1, the FET1-2, and the FET1-3 are connected to a first control terminal Ctl1 through control resistors R11, R12, R13, respectively.

Moreover, the second switching element group S2 is one in which switching elements SW2-1, SW2-2, and SW2-3 are connected in series. The bases of HBT2-1, HBT2-2, and HBT2-3, which form the switching elements SW2-1, SW2-2, and SW2-3, respectively, are connected to the sources of FET2-1, FET2-2, and FET2-3, respectively, and the gates are connected to the second control terminal Ctl2 through control resistors R21, R22, and R23, respectively. The other structures are the same as those of the first switching element SW1.

The third switching element group S3 is one in which switching elements SW3-1, SW3-2, and SW3-3 are connected in series. The bases of HBT3-1, HBT3-2, and HBT3-3, which form the switching elements SW3-1, SW3-2, and SW3-3, respectively, are connected to the sources of FET3-1, FET3-2, and FET3-3, respectively, and the gates are connected to the second control terminal Ctl3 through control resistors R31, R32, and R33, respectively.

Furthermore, each emitter of the other end of the first switching element group S1, that of the second switching element group S2 and that of the third switching element group S3 is connected to a first output terminal OUT1, a second output terminal OUT2, and a third output terminal OUT3, each serving as a second RF port.

Control signals applied to the first to third control terminals Ctl1, Ctl2, and Ctl3 are H levels or L levels, and the FET to which the H level signal is applied is turned on to supply the current to the base of the corresponding HBT. As a result, the switching element to which a base current is supplied is turned on to form a signal path in the HBT, and a high frequency analog signal input to the common input terminal IN is transmitted to the output terminal corresponding to an on-state switching element. The resistors are provided for the purpose of preventing the high frequency signals from being leaked through the gate electrodes with respect to direct current potentials of the control terminals Ctl1, Ctl2 and Ctl3 each serving as the AC ground. An inductor is used as an isolation element 30 between the collector or the emitter and the GND of each HBT and the isolation element 30 between the drain and VDD of each FET. The other structural components are the same as those of the third embodiment and the explanation is omitted.

In the switching circuit device of FIG. 18, since an on-state voltage (base-emitter voltage) $V_{BE}$ of the HBT is, for example, 2.0 V and a pinch-off voltage Vp of the FET is −0.4 V, both the FET and the HBT are started to be turned on at the time when a potential of the control terminal is higher by 1.6 V and more than the potential of the emitter and that of the collector of the HBT. Accordingly, in the switching element which is turned on by applying 3 V to the control terminal, a voltage drop, which is caused by a base current flowing to the inductor, which is the isolation element 30, is 0 V, the HBT and the FET are sufficiently turned on, and ON-side switching element is driven into conduction between the emitter and collector. On the other hand, an OFF-side can be kept turned off against a power having an amplitude of 1.6 V since 0 V is applied to the control terminal. At this time, since the SP3T has a three-stage structure, the amplitude of 1.6 V corresponds to a power of 29.6 dBm and can be fully used for a CDMA cellular phone. Moreover, both the emitter and the collector of each HBT are connected to a GND potential and this is used for drawing the base current of each HBT. Additionally, in a high power use such as the switching circuit device for the CDMA cellular phone, since the base current by which the HBT is driven is large, the inductor, which has no voltage drop caused when the base current flows, is used as the isolation element 30.

Figure 19:
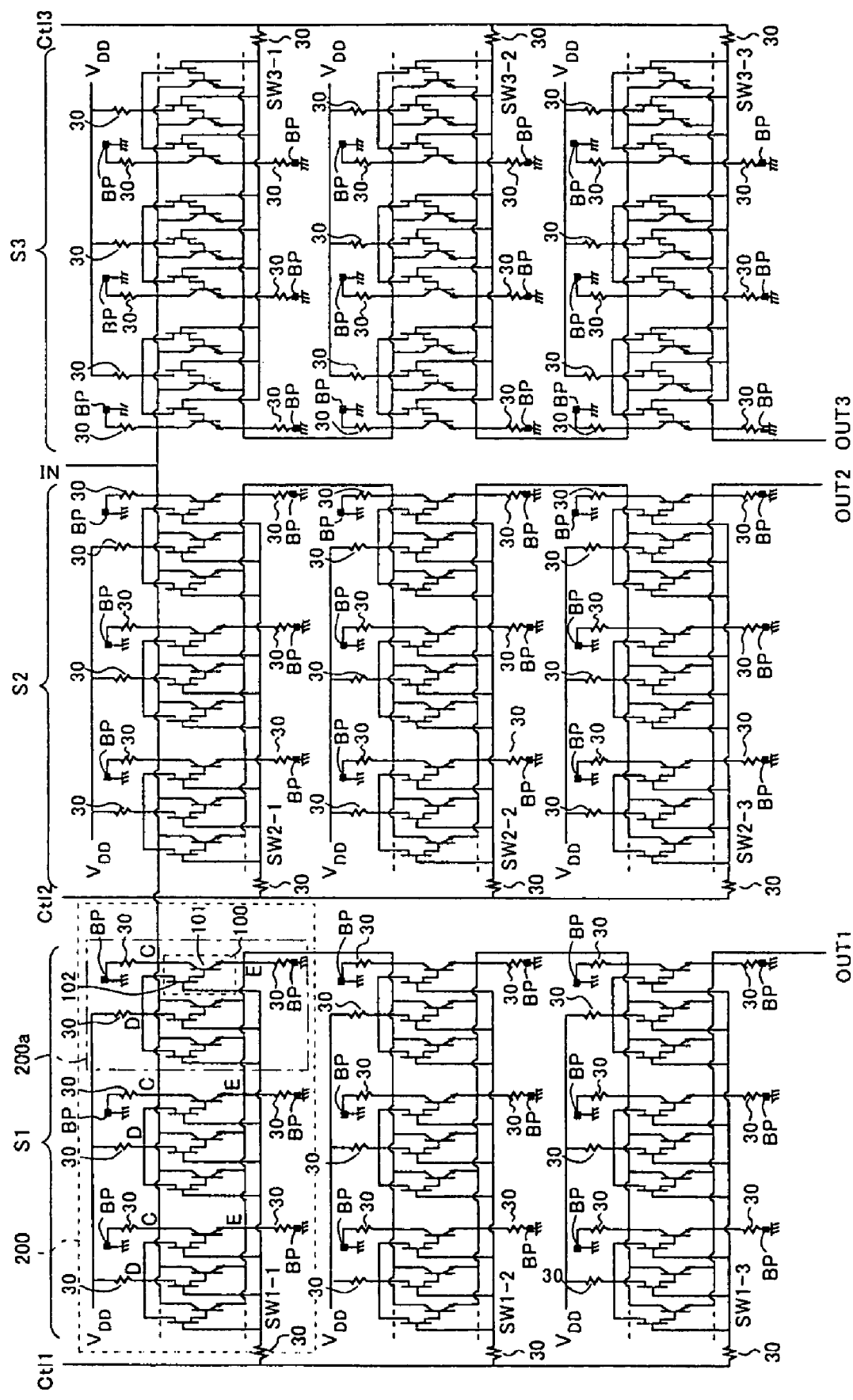
FIG. 19 is a circuit schematic diagram for explaining a seventh embodiment of the present invention.

FIG. 19 is a circuit diagram showing a seventh embodiment. The seventh embodiment is a SP3T (Single Pole Three Throw) switch MMIC.

The SP3T includes a first switching group S1, a second switching group S2, and a third switching group S3, each of having switching elements SW which are multistage connected in series. A collector of one end of the first switching element group S1, that of the second switching element group S2 and that of the third switching element group S3 are connected to a common input terminal IN.

The first switching element group S1 is one in which switching elements SW1-1, SW1-2, and SW1-3 are connected in series. In each of the switching elements SW1-1, SW1-2, and SW1-3, a plurality of unit elements 100, each of which is formed by connecting a unit FET 102 to a unit HBT 101, are connected to form an assembly element 200*a* as illustrated by alternate long and short dash lines, and plurality of assembly elements 200*a* are connected in parallel to form an active element 200 as illustrated by a broken line.

The unit FET 102 is a driving transistor for supplying a base current to the unit HBT 101. Moreover, a cross-sectional view and a perspective view of the unit element 100 are the same as those of FIG. 10A to 10D.

A source of the unit FET 102 is connected to a base of the unit HBT 101 and a drain is connected to a power supply terminal $V_{DD}$. Then, the unit element 100 connects an emitter and a collector of the unit HBT 101 to an emitter and a collector of other unit HBT 101 and the drain and a gate of the unit FET 102 to a drain and a gate of other unit FET 102 in common, respectively.

As mentioned above, according to the present embodiment, plurality of unit elements 100 are connected in parallel to form the assembly element 200*a*, and plurality of assembly elements 200*a* are connected in parallel to form each switching element as the active element 200.

One assembly element 200*a* connects three unit elements 100 in FIG. 19. In other words, the emitters of three unit HBTs 101 are common-connected to serve as a common emitter E for the assembly element 200*a* and the collectors of the unit HBTs 101 are common-connected to server as a common collector C for the assembly element 200*a*. Moreover, the drains of three unit FETs 102 are common-connected to serve as a common drain D for the assembly element 200*a*. Similarly, the gates of unit FETs 102 are common-connected each other.

Then, the common emitters E and the common collectors C of the respective assembly elements 200*a* and the gates of the unit FETs 102 are common-connected, respectively, to form the switching element SW1-1 of a first stage, which is the active element 200. The same holds true for the switching element SW1-2 of a second stage and the switching element SW1-3 of a third stage.

Moreover, the second switching element group S2 is one in which switching elements SW2-1, SW2-2, and SW2-3 are connected in series, similar to the first switching element group S1. The third switching element group S3 is one in which switching elements SW3-1, SW3-2, and SW3-3 are connected in series, similar to the first switching element group S1.

The collector of one end of the first switching element group S1, that of the second switching group S2 and that of the third switching group S3, that is, the collectors of the unit HBTs 101, which form the switching element of the first stage, are connected to a first RF port in common. The first RF port is, for example, a common input terminal IN.

The emitter of the other end of the first switching element group S1, that of the second switching group S2 and that of the third switching group S3, that is, the emitters of the unit HBTs 101, which form the switching element of the third stage, are connected to a first output terminal OUT1, a second output terminal OUT2, and a third output terminal OUT3, those which are second RF ports, respectively.

The base of the unit HBT 101 is connected to the source of the unit FET 102, and the gates of the unit FETs 102 of the respective stages are connected to a first control terminal Ctl1, a second control terminal Ctl2 and a third control terminal Ctl3 through an isolation element 30 for a high frequency signal, respectively.

The isolation element 30 is a resistor, which is provided for the purpose of preventing the high frequency signal from being leaked through the gate with respect to each of direct current potentials of the first control terminal Ctl1, the second control terminal Ctl2, and the third control terminal Ctl3 each serving as an AC ground. A resistance value of the isolation element 30 is about 5 KΩ to 10 KΩ.

There is a case in which any one of control signals applied to the first, the second and the third control terminals Ctl1, Ctl2, and Ctl3 is an H level and the other signals are L level, or a case in which all control signals are L levels, and the unit FET 102 to which the H level signal is applied is turned on to supply the current to the base of the corresponding HBT 101. As a result, the switching element group to which a base current is supplied is turned on to form one signal path in the unit HBT 101, and the high frequency analog signal input to the common input terminal IN is transmitted to any one of the output terminals.

Furthermore, when all of the control signals applied to the first, the second and the third control terminals Ctl1, Ctl2, and Ctl3 are L levels, all of the first switching element group S1, the second switching element group S2, and the third switching element group S3 are cut off.

Since the structures of the first switching element group S1, the second switching element group S2, and the third switching element group S3 are the same, the following will explain the first switching element group S1.

A bias point BP is connected to the emitter and the collector of each of the switching elements SW1-1, SW1-2, and SW1-3 of the respective stages of the first switching group S1. For example, the bias point BP is connected for each assembly element 200*a*. In other words, one of the bias point BP is connected to the common emitter E of one of the assembly element 200*a* and one of the bias point BP is connected to one of the common collector C. Then, an equal DC bias potential (for example, GND potential) is applied to each bias point BP.

Then, one isolation element 30 for the high frequency signal is connected between the common emitter E of one assembly element 200*a* and the bias point BP and between the common collector C of one assembly element 200*a* and the bias point BP, respectively. When the switching element is formed of the unit HBT 101, a current amplification factor $h_{FE}$ is below 1000, so that an extremely large base current is required. Accordingly, in the structure in which the emitter and the collector of the unit HBT 101 are common-connected for each switching element, respectively, and the connection to the bias point BP is made through the isolation element 30 for each switching element at only one pass, the voltage drop caused by the base current flowing through the isolation element (resistor) 30 is increased. As a result, a sufficient bias cannot be applied to the unit HBT 101, making it impossible to sufficiently operate the unit HBT 101.

Even if the current amplification factor $h_{FE}$ is extremely high, for example, 1000 or more, the total amount of necessary base current is increased in the case of the switching circuit connected in a multi-stage fashion as mentioned in the present embodiment. This is because the base current is supplied to the entire unit HBTs 101 of the respective stages of the port to be turned on. Then, the necessary base current is increased by the square of the number of stages and not by the times of the number of stages from the base current in the case of one stage.

The reason is as follows. Namely, in the case of, for example, three stages, since three switching elements SW1-1, SW1-2 and SW1-3 are connected in series, the total on-resistance of the series-connected first switching element group S1 is not equal to that of one stage unless the size of each unit HBT 101 is trebled.

More specifically, in the case of three stages, since each unit HBT size is three times as large as that of one stage and the number of stages of the switching element SW is three, the total base current is nine times (3×3=9) as large as that of one stage.

Accordingly, the total amount of base current, which is necessary for driving the switch circuit device where three stages of the switching elements SW1-1, SW1-2, and SW1-3 are connected, is increased by about an order of magnitude as compared with the case of one stage. As mentioned above, when the amount of base current is extremely increased, two problems occur.

A first problem is that a voltage drop caused by the base current flowing to the isolation element 30 is increased to make it impossible to sufficiently operate the unit HBT 101. A second problem is that the unit HBT 101 cannot be driven in a base band LSI of a cellular phone.

Therefore, according to the present invention, as measures against the first problem, the assembly element 200a is formed of plurality of unit elements 100 connected in parallel in a comb-tooth shape and the common emitter E and the common collector C of the assembly element 200a are connected to the bias point BP through the isolation element 30 for each assembly element 200a. The DC bias (for example, GND potential) is applied to the bias point BP.

The resistance value of the isolation element 30 is generally 5 to 10 KΩ. When the base current flows through the isolation element 30, the voltage drop, which is proportional to a magnitude of the base current, occurs across the resistor. The plurality of unit HBTs 101 connected in parallel are divided into groups and each of the group as the assembly element 200a is connected to the bias point BP through one isolation element 30, respectively, and thereby it is possible to reduce the voltage drop to a degree that does not affect the operation of the unit HBT 101.

Namely, since the base current can be diffused by the group division, the base current flowing through the isolation element 30 of 5 to 10 KΩ, which is to be connected to each assembly element 200a, is reduced to lessen the voltage drop. Moreover, the isolation element 30 can be integrated on one chip since the resistor and not an inductor is used.

Since the unit FET 102 supplies the base current to the unit HBT 101, a drain current of the unit FET 102 supplied from the power supply terminal $V_{DD}$ serves as the base current of the unit HBT 101. Then, the same holds true for the base current flowing between the unit FET 102 and the power supply terminal $V_{DD}$.

Namely, in the unit FET 102, the drains are connected in common to serve as the common drain D for each assembly element 200a, and each common drain D is connected to the power supply terminal $V_{DD}$ through the isolation element 30, respectively. One isolation element 30 is connected for each assembly element 200a.

When the voltage drop, which is caused by the base current flowing through the resistor 30 to which the unit FET 102 is connected, is increased, the drain potential of the unit FET 102 is reduced to make it impossible to sufficiently ensure the voltage between the source and the drain of the unit FET 102. This reduces the current flowing between the source and drain of the unit FET 102, with the result that the base current of the unit HBT 101 becomes insufficient.

For this reason, since the voltage drop between the source and the drain caused by the resistor 30 is also reduced by dividing the unit FETs 102 into groups, the unit HBT 101 can be sufficiently operated.

Since all structural components of the switch circuit device can be integrated on one chip since the isolation element 30 is the resistor and not the inductor. Moreover, both the emitter and the collector of each of the unit HBT 101 are connected to the GND potential and they are used to apply the DC bias potential to the emitter and the collector and draw the base current of each of the unit HBT 101.

As measures against the second problem, there is used the temperature-compensation unit element 100 in which each of the unit FET 102 is made to correspond to each of the unit HBT 101 and the unit HBT 101 and the unit FET 102 is arranged to be adjacent to each other. More specifically, the unit element 100 supplies the base current of the unit HBT 101 by the unit FET 102 and supplies the current to the unit FET 102 from the power supply terminal $V_{DD}$. This makes it possible to sufficiently supply the base current to the unit HBT 101 and operate the unit HBT 101.

An example of a circuit operation of FIG. 19 will be explained.

[Case where an H level signal is applied to the first control terminal Ctl1 and an L level signal is applied to the second control terminal Ctl2 and the third control terminal Ctl3]

An on-state voltage of the unit HBT 101 is 2.0 V and a pinch-off voltage Vp of the unit FET 102 is −0.4 V. In this case, the unit FET 102 and the unit HBT 101 are turned on when a potential of the first control terminal Ctl1 is higher by 1.6 V (2.0 V−0.4 V) and more than a potential of the emitter of the unit HBT 101 and that of the collector thereof. Here, the potential of the emitter of the unit HBT 101 and that of the collector thereof are set to a GND potential (0 V).

Since 3 V is applied to the ON-side first control terminal Ctl1, the potential of the first control terminal Ctl1 reaches 3 V (3 V−0 V), which is sufficiently higher than 1.6 V. Moreover, since the voltage drop, which is caused by the base current flowing through the resistor serving as the isolation element 30, is sufficiently small as mentioned above, the unit FET 102 and the unit HBT 101 are sufficiently turned on to drive the ON-side unit HBT 101 into conduction between the emitter and the collector.

On the other hand, on an OFF-side, the potential of the second control terminal Ctl2 and that of the third control terminal Ctl3 are 0 V with respect to the potential 0 V (GND) of the emitter of the unit HBT 101 and that of the collector thereof. Since the unit FET 102 and the unit HBT 101 are turned on when the potential of the second control terminal Ctl2 and that of the third control terminal Ctl3 are higher by 1.6 V and more than the potential of the emitter of the HBT 101 and that of the collector thereof, the OFF-side can be kept turned off against a power of an amplitude of 1.6 V. At this time, since SP3T has the three-stage structure, the amplitude of 1.6 V corresponds to a power of 29.6 dBm and can be sufficiently used for a CDMA cellular phone.

[Case where the L level signal is applied to all of the first control terminal Ctl1, the second control terminal Ctl2, and the third control terminal Ctl3]

When the L level signal is applied to all of the first control terminal Ctl1, the second control terminal Ctl2, and the third control terminal Ctl3, 0 V is applied to all of the first control terminal Ctl1, the second control terminal Ctl2, and the third control terminal Ctl3 and all switching elements SW can be kept turned off against the power of the amplitude of 1.6 V, similar to the above. Furthermore, here, the common input terminal IN, the first output terminal OUT1, the second output terminal OUT2 and the third output terminal OUT3 of the RF port are set to the GND potential.

Supposing that the RF port is set to the GND potential, the switch circuit device using a MESFET as the switching element cannot cut off the MESFET channel because of a depletion type even if 0 V is applied to the gate which is connected to the control terminal, so that the switching circuit device cannot be turned off by the application of 0 V. Accordingly, the switching circuit device using the MESFET as the switching element cannot set the RF port to the GND potential, so that the RF port must be limited to a plus potential. Then, since an external high frequency signal line is the GND potential and different from the RF port in the potential, the external high frequency signal line and the RF port cannot be directly connected to each other. Namely, in order to DC-isolate between the external high frequency signal line and the RF port, a capacitance must be externally connected therebetween.

However, in the present embodiment, the switching element is formed of the unit HBT and the unit FET, the RF port is set to the GND potential, and 0 V is applied to the control terminal, the switching element can be turned off by the application of 0 V. This eliminates the need for connecting a capacitance externally to make it possible to reduce a mounting area as compared with the switching circuit device using the FET as the switching element. Additionally, the OFF-side can be kept turned off against the power of the amplitude of 1.6 V, however, the amplitude of 1.6 V corresponds to the power of 29.6 dBm because of the three-stage connection. Namely, this can be fully used for the CDMA cellular phone.

Although both the sixth and seventh embodiments use the SP3T with three stages, the number of stages is not limited to three. Moreover, the circuit is not limited to SP3T and any number of output terminals such as SP4T, SP5T, . . . SPnT may be possible. Furthermore, any number of input terminals such as DPDT (Double Pole Double Throw) may be possible, and the logic circuit may be provided as described in the fifth embodiment.

The following will explain cases as an eighth embodiment to a tenth embodiment in which an n type AlGaAs layer 18a and an n type InGaP layer 19a are not formed in a unit element 100 with reference to FIGS. 20 to 25.

The eighth embodiment and the ninth embodiment show a case of the unit elements 100 that form an active element 200 for the amplifier, and the tenth embodiment shows a case of the unit elements 100 that form the active element 200 for the switching element.

The following will explain the other embodiment of the unit elements 100 for the amplifier as an eighth embodiment with reference to FIGS. 20 to 22. The eighth embodiment shows the case in which the n type AlGaAs layer 18a and the n type InGaP layer 19a are not formed in the unit element 100 of the first embodiment. In this case, a ledge L is formed by an emitter mesa EM of an emitter layer 5a.

Figure 20A:
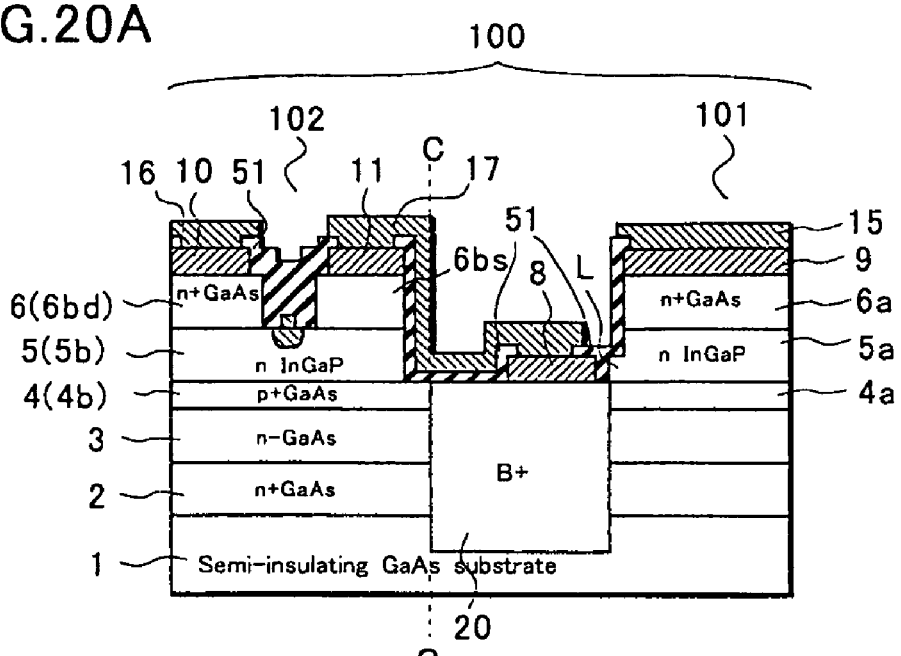
FIG. 20A is a cross-sectional view for explaining an eighth embodiment of the present invention.
Figure 20B:
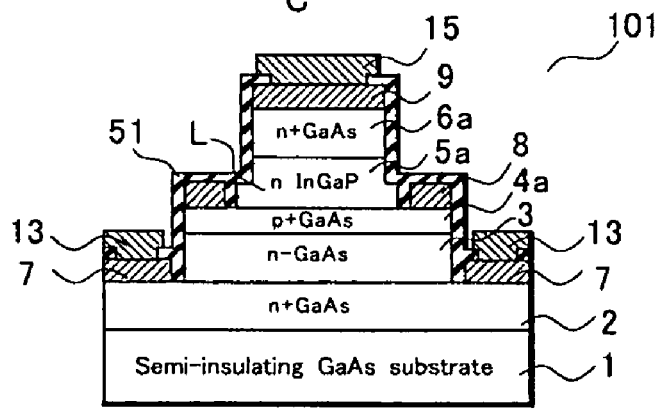
FIG. 20B is a cross-sectional view for explaining the same.
Figure 20C:
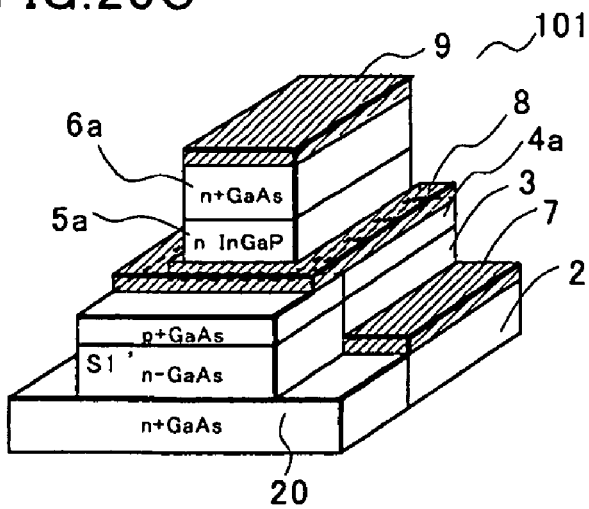
FIG. 20C is a perspective view for explaining the same.
Figure 20D:
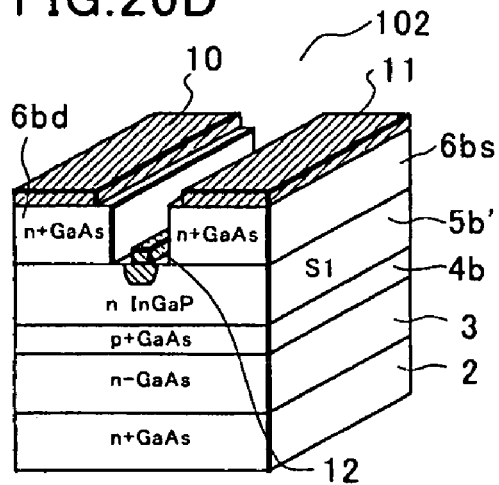
FIG. 20D is a perspective view for explaining the same.

FIG. 20A is a cross-sectional view taken along the line a-a of FIG. 2 and FIG. 20B is a cross-sectional view of a unit HBT 101 taken along the line b-b of FIG. 2. Moreover, FIG. 20C is a perspective view of the unit HBT 101 when the unit element 100 is cut into the above two regions at a cross section shown by the line c-c of FIG. 20A, and FIG. 20D is a perspective view of a unit FET 102. It is noted that a connection electrode 17 is omitted in FIGS. 20B, 20C, and 20D. Also, electrodes of second or more layers are omitted in FIGS. 20C and 20D.

As illustrated in FIG. 20A, the substrate is the compound semiconductor substrate where a plurality of semiconductor layers, that is, an n+ type GaAs layer 2, an n− type GaAs layer 3, an p+ type GaAs layer 4, an n type InGaP layer 5, and an n+ type GaAs layer 6 are grown on a semi-insulating GaAs substrate 1. Some of the semiconductor layers are removed by etching and formed in a mesa shape. Moreover, an isolation region 20, which reaches the GaAs substrate 1, is formed. The isolation region 20 is an insulating region by an ion implantation such as B+ and the like as mentioned above.

The unit element 100 is isolated into two regions by the mesa-shaped semiconductor layer and the insulating region 20, and the unit HBT 101 is formed in one region and the unit FET 102 is formed in the other region.

As illustrated in FIGS. 20B and 20C, the subcollector layer 2 of the unit HBT 101 is an n+ type GaAs layer, which is formed on the GaAs substrate 1 by the epitaxial growth method and silicon (Si)-doped to a relatively high impurity concentration of $3E18$ $cm^{-3}$ to $6E18$ $cm^{-3}$. The thickness is several thousands Å. The collector layer 3 is the n− type GaAs layer, which is formed on a partial region of the subcollector layer 2 and silicon-doped to an impurity concentration of about $1E16$ $cm^{-3}$ to $10E16$ $cm^{-3}$. The thickness is several thousands Å. A base layer 4a is the p+ type GaAs layer, which is formed on the collector layer 3 and carbon (C)-doped to an impurity concentration of about $1E18$ $cm^{-3}$ to $50E18$ $cm^{-3}$. The thickness is several hundreds Å to 2000 Å. An emitter layer 5a is an n type InGaP layer, which is formed on the partial region of the base layer 4a and silicon-doped to an impurity concentration of about $1E17$-$cm^{-3}$ to $10E17$ $cm^{-3}$. The thickness is 1000 Å to 5000 Å. The emitter layer 5a is lattice matched to GaAs layers of upper and lower layers. An emitter contact layer 6a is an n+ type GaAs layer, which is formed on the emitter layer 5a and silicon-doped to an impurity concentration of about $3E18$ $cm^{-3}$ to $6E18$ $cm^{-3}$ and its thickness is several thousands Å.

The unit HBT 101 of the present embodiment forms an InGaP/GaAs heterojunction with the emitter layer 5a and the base layer 4a. Additionally, the semiconductor layer, serving as the emitter layer 5a, may be an AlGaAs layer in place of an InGaP layer, in which case the semiconductor layer is also lattice matched to the GaAs layers of the upper and lower layers. The insulating region 20 for isolation is formed in the vicinity of a surface S1' at lower layers than the emitter layer 5a with refer to FIG. 20B. Moreover, as illustrated in FIG. 20B, the lower portion of the emitter layer 5a has a ledge L, which is shaped to project to a base electrode 8 provided at both sides.

In other words, the emitter layer 5a is photo-etched in the vicinity of a side surface until a predetermined thickness, where the ledge L is completely depleted, is obtained. Accordingly, a part of the emitter 5a is used to form the ledge L at the lower portion thereof. More specifically, the n+ type GaAs layer 6 is mesa etched by a photo-etching process and subsequently the InGaP layer 5 is mesa etched halfway. After removing a resist, a residual n type InGaP layer 5 is mesa etched by a new photo-etching process to remove the resist. As a result, the emitter contact layer 6a and the emitter layer 5a are formed in a mesa shape (emitter mesa EM) and a part of the emitter layer 5a is used to form the ledge L at the lower portion thereof. The ledge L is depleted to prevent the flow of a recombination current between the emitter and the base on the surface of the base layer 4a of the lower portion of the ledge L. Although the thickness of the ledge L cannot be easily controlled without using the selection etching like the first to seventh embodiments, the thickness of the ledge L may be controlled with an accuracy of ±a hundred to several hundreds Å, and the thickness of the ledge L can be controlled using a etching solution with low etching rate.

On the surface of the subcollector layer 2; there is formed a collector electrode 7 of a first metal layer of an ohmic metal layer (AuGe/Ni/Au) at a position where the collector layer 3 is sandwiched therebetween. On the surface of the base layer 4a, there is formed a base electrode 8 of an ohmic metal layer (Pt/Ti/Pt/Au) with a pattern that surrounds the emitter layer 5a. On the upper portion of the emitter contact layer 6a, there is formed an emitter electrode 9 of the first metal layer of an ohmic metal layer (AuGe/Ni/Au).

FIG. 20D is a perspective view of the unit FET 102 when the unit element 100 is cut at a cross section shown by the line c-c of FIG. 20A. The n type InGaP layer 5 serves as a channel layer 5b' in the unit FET 102. Also, the n+ type GaAs layer 6 of the uppermost layer is used as contact layers 6bs and 6bd. The contact layers 6bd and 6bs serve as a drain region and a source region of the unit FET 102. The contact layers 6bd and 6bs are also formed in a mesa shape and the gate electrode 12 is formed on the channel layer 5b' exposed therebetween. In the case of a buried gate electrode where Pt of the undermost layer metal of the gate metal layer is buried to the InGaP layer, Pt is not abnormally diffused on the surface of the InGaP layer in a horizontal direction if a crystal of the surface of the InGaP layer is good. On the contact layers 6bd and 6bs, there are formed a drain electrode 10 and a source electrode 11 of the first metal layer, both which are made of the ohmic metal layers.

Here, the channel layer 5b' of the unit FET 102 is the same InGaP layer as the emitter layer 5a of the unit HBT 101. This makes it possible to achieve a high breakdown voltage of the unit FET 102 and a stabilization of the surface of the channel layer 5b'.

Furthermore, a p+ type GaAs layer 4b is formed on the lower layer of the channel layer 5b'. This layer can prevent a carrier from being leaked to the GaAs substrate 1 from the channel.

Additionally, the lower layers than the p+ type GaAs layer 4b may be designed in such a way that the characteristic of the unit HBT 101 is optimized since they have no influence upon the operation as the unit FET 102.

Referring to FIG. 20A again, the unit element 100 is a structure in which a surface S1' of the unit HBT 101 shown in FIG. 20C is abutted to a surface S1 of the unit FET 102 shown in FIG. 20D. An abutted surface is a surface taken along the line c-c of FIG. 20A. Then, on the source electrode 11 of the unit FET 102, the connection wiring 17 is formed of the wiring metal layer (Ti/Pt/Au). The connection wiring 17 passes the insulating region 20 along the mesa of the unit FET 102 and extends up to the base electrode 8 of the unit HBT 101.

The following will explain the other embodiment of the unit element 100 as the eighth embodiment with reference to FIGS. 21A and 21B, FIGS. 22A and 22B. Additionally, a cross-sectional view corresponds to a cross section taken along the line b-b of FIG. 2, but is an outline for explaining an epitaxial layer and the connection electrode 17 is omitted.

Figure 21A:
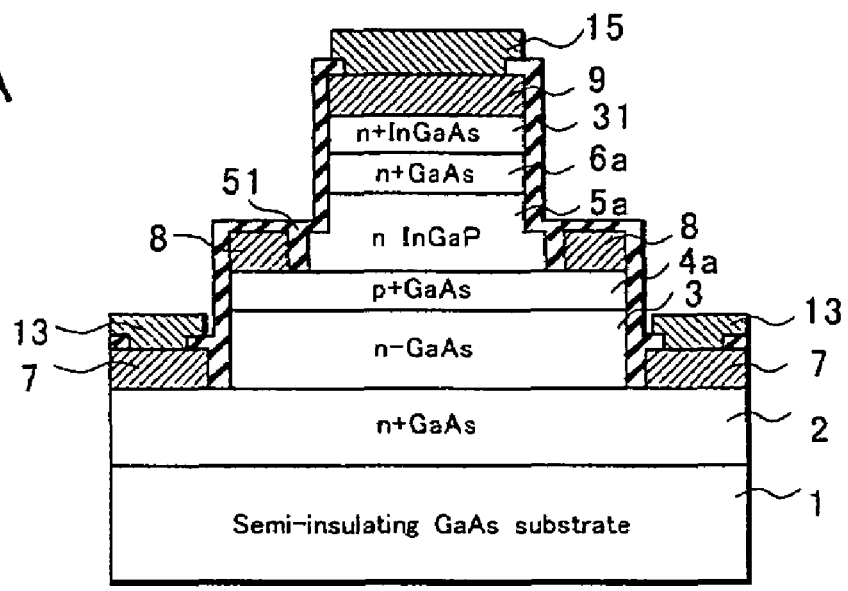
FIGS. 21A and 21B are cross-sectional views for explaining the eighth embodiment of the present invention.

FIG. 21A shows a case in which a non-alloy ohmic layer is formed in the eighth embodiment and the emitter contact layer 6a is used as the non-alloy ohmic layer.

There is a case in which the non-alloy ohmic layer 31 is formed on the emitter contact layer 6a in order to reduce the contact resistance of the emitter contact layer 6a. The non-alloy ohmic layer 31 is an n+ type InGaAs layer. In this case, the emitter contact layer 6a is an n+ type GaAs layer and the other semiconductor layers are the same as those of FIG. 20B.

Figure 21B:
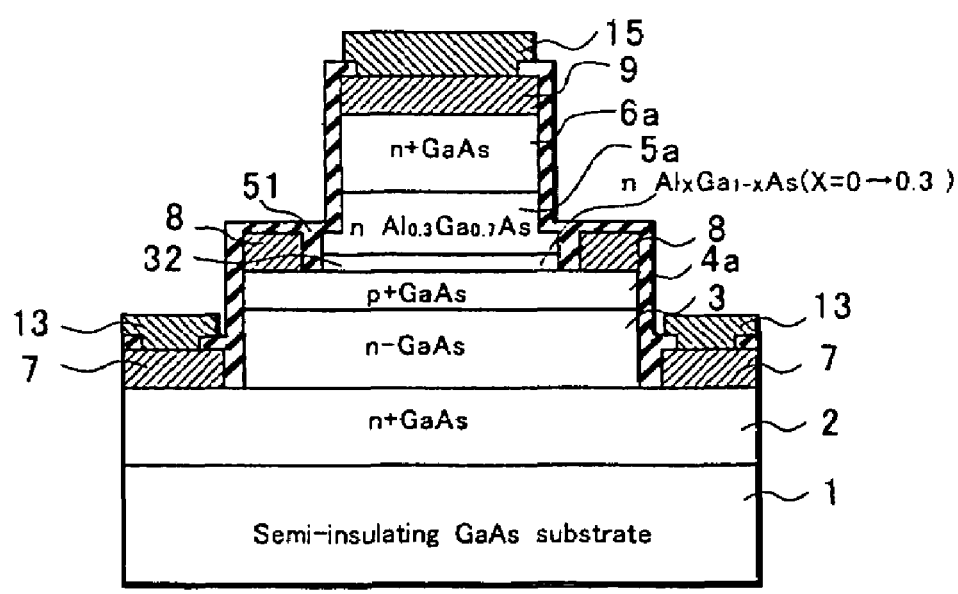

FIG. 21B shows a case in which a grading layer is formed.

There is a case in which an $Al_{0.3}Ga_{0.7}As$ layer is used as the emitter layer 5a to form a heterojunction between the GaAs layer of the base layer 4a and the emitter layer 5a. This heterojunction has a band spike at a bottom of a conduction band and the band spike is one of factors that generate an offset voltage. In order to eliminate the band spike, there is a case in which a grading layer 32 for a gradual transition from GaAs to AlGaAs is formed to reduce the offset voltage.

The grading layer 32 is, for example, an n type $Al_xGa_{1-x}As$ (X=0→0.3) layer by which GaAs is gradually changed to $Al_{0.3}Ga_{0.7}As$ between the base and the emitter. The structures of other semiconductor layers are the same as those of FIG. 20B.

Figure 22A:
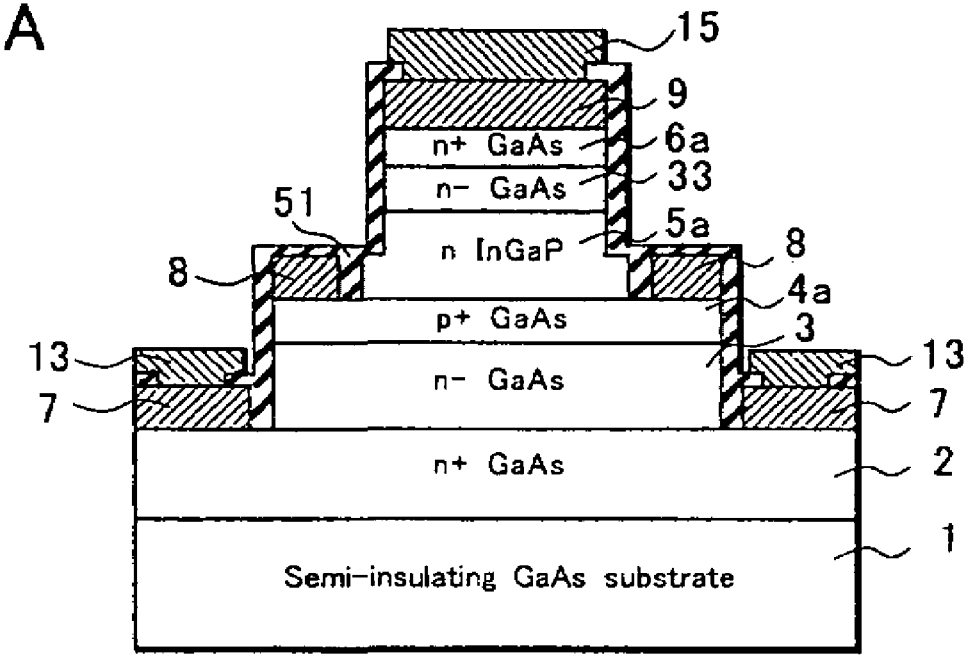
FIGS. 22A and 22B are cross-sectional views for explaining the eighth embodiment of the present invention.

FIG. 22A shows a case in which a ballast resistor layer is formed in the eighth embodiment. There is a case in which a secondary breakdown cannot be fully prevented depending on the design of the unit FET 102 and the unit HBT 101 that form the unit element 100. Moreover, there is a difficulty in completely preventing the secondary breakdown from occurring when an extremely large current is made to flow to the unit HBT 101. In such a case, the ballast resistor layer is added to an epitaxial structure of the unit HBT 101, thereby measures against the secondary breakdown may be taken again.

In other words, an n− type GaAs layer 33, serving as the ballast resistor layer, is formed on the emitter layer 5a. The n− type GaAs layer 33 having a predetermined resistance value serves as the ballast resistor layer, and thereby it is possible to prevent the secondary breakdown from occurring by the concentration of the current on one of the unit elements 100.

The ballast resistor layer 33 may be formed of an undoped GaAs layer, and the ballast resistor layer 33 may be formed of an n− type InGaP layer or an undoped InGaP layer when the emitter layer 5a is an InGaP layer. Moreover, when the emitter layer 5a is an AlGaAs layer, the ballast resistor layer 33 may be formed of an n− type AlGaAs layer or an undoped AlGaAs layer. The other semiconductor layers are the same as those of FIG. 20B.

Figure 22B:
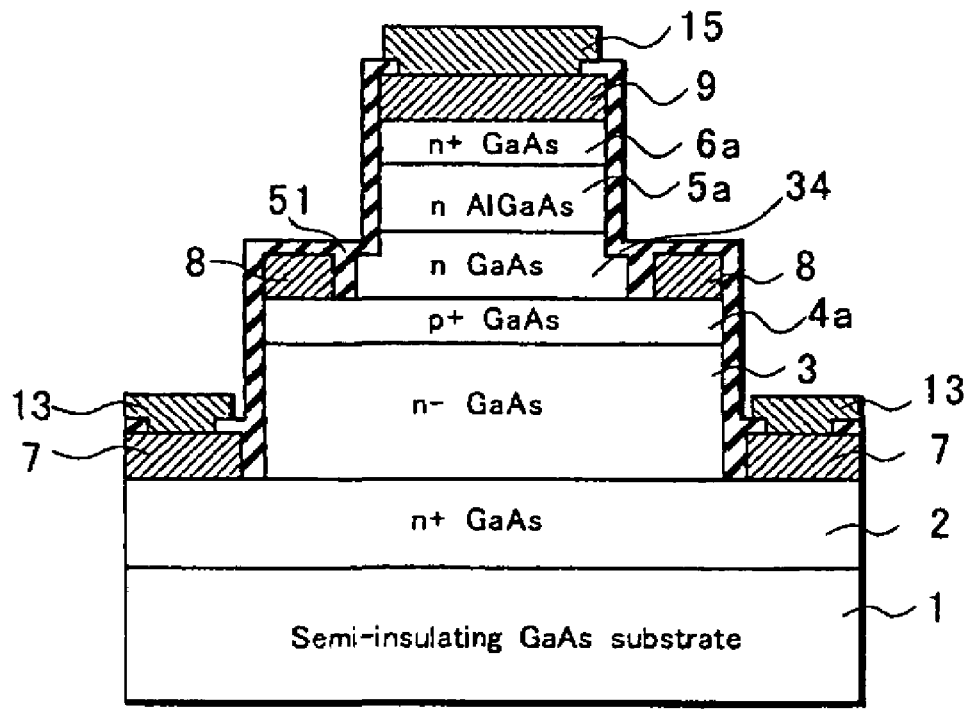

FIG. 22B shows a case in which a position of the heterojunction is shifted from a position of a pn junction between the emitter and the base and the emitter layer 5a is the n type AlGaAs layer in the eighth embodiment.

According to the general HBT structure, in a junction where the pn junction between the emitter and the base, that is, between the n type AlGaAs layer of the emitter layer 5a and the p+ type GaAs layer of the base layer 4a conforms to the heterojunction, the band spike exists at the bottom of the conduction band and the band spike is one of the factors that generate an offset voltage. In order to prevent the offset voltage from being generated by the band spike, an n type GaAs layer 34 is added between the p+ type GaAs layer and the n type AlGaAs layer of the emitter layer 5a, so that the heterojunction position may be shifted from the pn junction between the base and the emitter. In this case, since the heterojunction position does not conform to the pn junction between the emitter and the base, the offset voltage can be extremely reduced.

As a principle of HBT, in order to prevent holes of base from being injected to the emitter, an AlGaAs layer having a band gap larger than that of the GaAs layer serving as the base layer 4a is formed as the emitter layer 5a. In the case of this structure, a junction between the added n type GaAs layer 34 and the n type AlGaAs layer 5a of the emitter layer placed thereon forms the heterojunction.

Figure 23A:
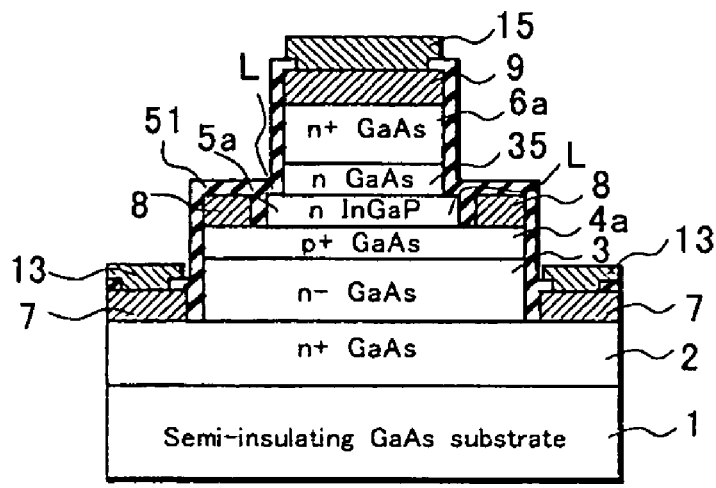
FIGS. 23A to 23C are cross-sectional views for explaining a ninth embodiment of the present invention.
Figure 23B:
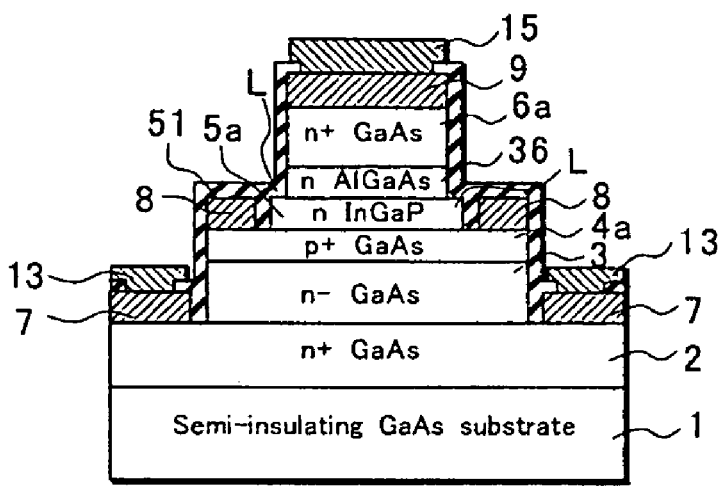
Figure 23C:
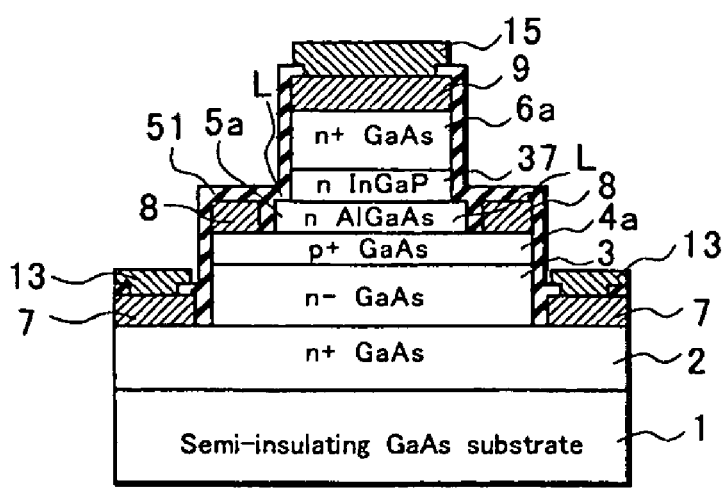

FIGS. 23A to 23C show a ninth embodiment and are cases in which other semiconductor layers, which can be subjected to a selection etching, are formed on an emitter layer 5a of a unit HBT 101 in a unit element 100 for an amplifier shown in the eighth embodiment. Namely, in the ninth embodiment, the emitter layer 5a, an n type AlGaAs layer 18a, and an n type InGaP layer 19a of the unit element 100 of the first to seventh embodiments are changed to the other semiconductor layers and the thickness of the emitter layer 5a is set to the same as the thickness of a ledge L, and the selection etching is used to form the ledge L. Additionally, a cross-sectional view corresponds to a cross section taken along the line b-b of FIG. 2, but is an outline for explaining an epitaxial layer and a connection electrode 17 is omitted.

For example, in FIG. 23A, an n type GaAs layer 35 is added onto the emitter layer (n type InGaP layer) 5a to form the ledge L by the selection etching of GaAs/InGaP. A gate electrode of a unit FET 102 is formed on the n type GaAs layer 35. In this case, although the selection etching cannot be used, control can be performed by measures such as a decrease in the film thickness of an n+ type GaAs layer 6a or a reduction in an etching rate.

In FIG. 23B, an n type AlGaAs layer 36 is added onto the emitter layer (n type InGaP layer) 5a to form the ledge L by the selection etching of AlGaAs/InGaP. The gate electrode of the unit FET 102 is formed on the n type AlGaAs layer 36. In this case, although the selection etching cannot be used, control can be performed by measures such as the decrease in the film thickness of the n+ type GaAs layer 6a or the reduction in the etching rate.

In FIG. 23C, an n type InGaP layer 37 is added on the emitter layer (n type AlGaAs layer) 5a to form the ledge L by the selection etching of InGaP/AlGaAs. In exposing a surface of a base layer 4a to form a base electrode, the selection etching cannot be used. However, it is possible to check whether the base layer 4a is exposed by probing an etched surface directly. Accordingly, control of etching for exposing the surface of the base layer 4a can be performed. In other words, when the emitter layer 5a is still left due to an insufficient etching, a contact resistance is extremely high because of a low impurity concentration of the emitter layer 5a even if a direct probing is performed, and a measured resistance value is considerably high. On the other hand, since the base layer 4a has an extremely high impurity concentration, when the direct probing to base layer 4a is performed to measure the resistance value, the contact resistance is low, and a measured resistance value becomes low.

In FIGS. 23A to 23C, the selection etching is used to form the ledge L. Accordingly, in integrating a logic circuit, a surface on which an E-type FET gate electrode is formed can be exposed using the selection etching, similar to the fifth embodiment.

In FIGS. 23A to 23C, the other semiconductor layers are the same as those of FIG. 20B.

Figure 24A:
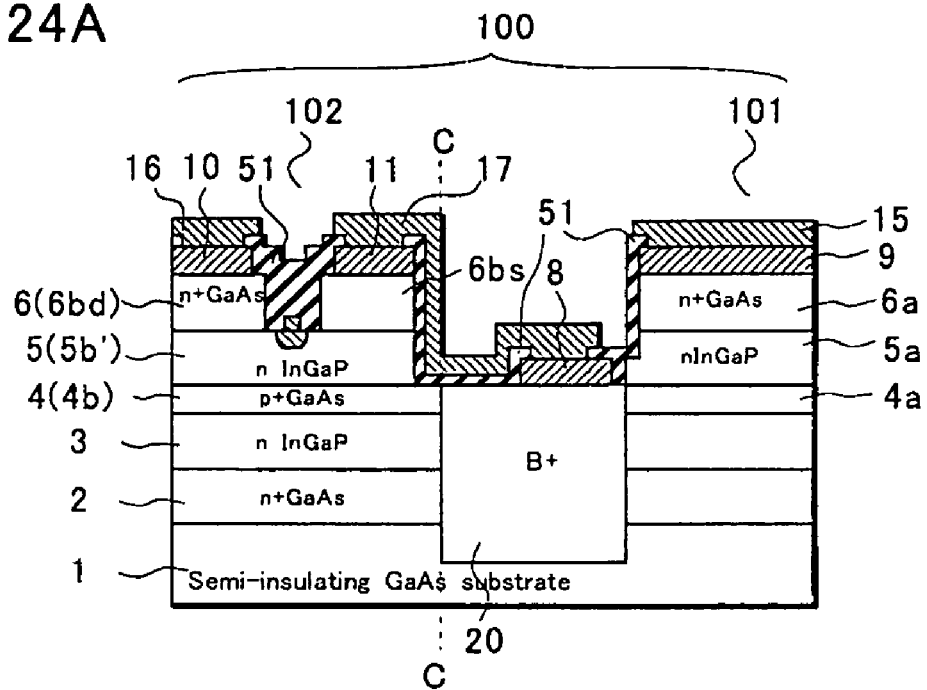
FIG. 24A is a cross-sectional view for explaining a tenth embodiment of the present invention.

The following will explain the other embodiment of an unit elements 100 for the switching element as a tenth embodiment with reference to FIGS. 24A to 25B. FIG. 24A is a cross-sectional view taken along the line a-a of FIG. 2 and FIG. 24B is a cross-sectional view of a unit HBT 101, and FIG. 24C is a perspective view of a unit FET 102. Additionally, in FIGS. 24A to 24C, electrodes of second or more layers excepting a connection wiring 17 are omitted.

As illustrated in FIG. 24A, the substrate is the compound semiconductor substrate where a plurality of semiconductor layers, that is, an n+ type GaAs layer 2, an n– type GaAs layer 3, an p+ type GaAs layer 4, an n type InGaP layer 5, and an n+ type GaAs layer 6 are grown on a semi-insulating GaAs substrate 1. Some of the semiconductor layers are removed by etching and formed in a mesa shape. Moreover, an isolation region 20, which reaches the GaAs substrate 1, is formed. An isolation region is the insulating region 20 by an ion implantation such as B+ and the like.

The unit element 100 is isolated into two regions by the mesa-shaped semiconductor layer and the insulating region 20, and the unit HBT 101 is formed in one region and the unit FET 102 is formed in another region.

Figure 24B:
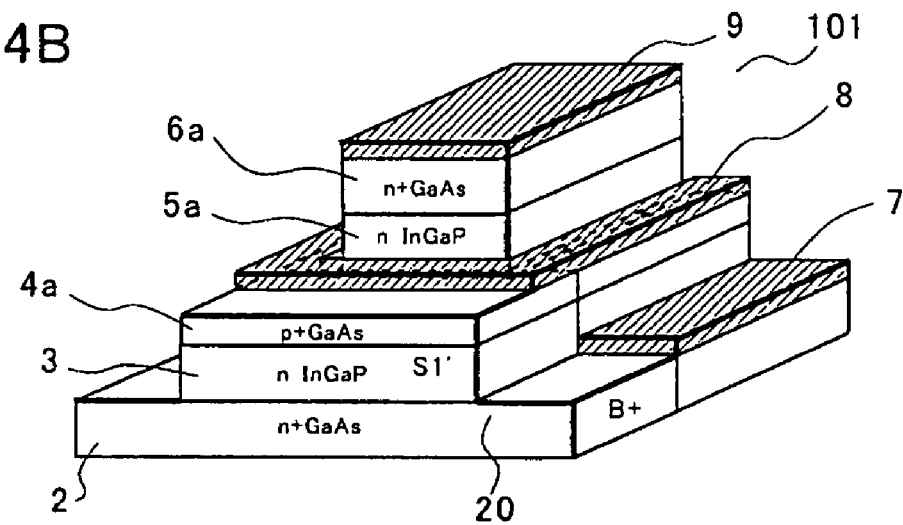
FIG. 24B is a perspective view for explaining the same.

FIG. 24B is a perspective view of the unit HBT 101 when the unit element 100 is cut at the cross section shown by the line c-c of FIG. 24A. Additionally, the connection electrode 17 is here omitted. The subcollector layer 2 of the unit HBT 101 is the n+ type GaAs layer, which is formed on the GaAs substrate 1 by an epitaxial growth method and silicon (Si)-doped to a relatively high impurity concentration of 3E18 $cm^{-3}$ to 6E18 $cm^{-3}$. The thickness is several thousands Å. The collector layer 3 is the n type GaAs layer, which is formed on a partial region of the subcollector layer 2 and silicon-doped to an impurity concentration of about 1E17 $cm^{-3}$ to 5E17 $cm^{-3}$. The thickness is 1000 Å to 5000 Å. The base layer 4a is a p+ type GaAs layer, which is formed on the collector layer 3 and carbon (C)-doped to an impurity concentration of about 1E18 $cm^{-3}$ to 50E18 $cm^{-3}$. The thickness is several hundreds to 2000 Å. The emitter layer 5a is the n type InGaP layer, which is formed on the partial region of the base layer 4a and silicon-doped to the impurity concentration of about 1E17 $cm^{-3}$ to 5E17 $cm^{-3}$. The thickness is 1000 Å to 5000 Å. The emitter layer 5a is lattice matched to the GaAs layers of the upper and lower layers. An emitter contact layer 6a is the n+ type GaAs layer, which is formed on the emitter layer 5a and silicon-doped to the impurity concentration of about 3E18 $cm^{-3}$ to 6E18 $cm^{-3}$ and its thickness is several thousands Å.

The unit HBT 101 of the present embodiment forms the InGaP/GaAs heterojunction with the collector layer 3 and the base layer 4a in addition to the InGaP/GaAs heterojunction with the emitter layer 5a and the base layer 4a. Namely, the unit HBT 101 is the symmetrical HBT.

Additionally, the semiconductor layers, serving as the emitter layer 5a and the collector layer 3, may be the AlGaAs layers in place of the InGaP layers, in which case the semiconductor layer is also lattice matched to the GaAs layer of the base layer 4a.

The insulating region 20 for isolation is formed in the vicinity of the surface S1' at the lower layers than the base layer 4a.

On a surface of the subcollector layer 2, there is formed a collector electrode 7 of a first metal layer of an ohmic metal layer (AuGe/Ni/Au) at a position where the collector layer 3 is sandwiched therebetween. On the surface of the base layer 4a, there is formed a base electrode 8 of an ohmic metal layer (Pt/Ti/Pt/Au) with a pattern that surrounds the emitter layer 5a. On the upper portion of the emitter contact layer 6a, there is formed an emitter electrode 9 of the first metal layer of an ohmic metal layer (AuGe/Ni/Au).

Figure 24C:
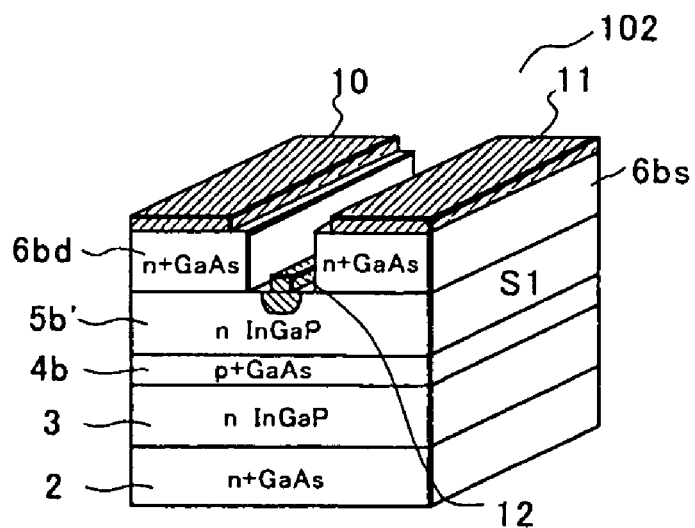
FIG. 24C is a perspective view for explaining the same.

FIG. 24C is a perspective view of the unit FET 102 when the unit element 100 is cut at a cross section shown by the line c-c of FIG. 24A. The n type InGaP layer 5 serves as a channel layer 5b' in the unit FET 102. Also, the n+ type GaAs layers 6 of the uppermost layers are used as contact layers 6bs and 6bd. The contact layers 6bd and 6bs serve as a drain region and a source region of the unit FET 102, respectively. The contact layers 6bd and 6bs are also formed in a mesa shape and the gate electrode 12 is formed on the channel layer 5b' exposed therebetween. On the contact layers 6bd and 6bs, there are formed a drain electrode 10 and a source electrode 11 of the first metal layer, both which are made of the ohmic metal layer, respectively.

Moreover, a p+ type buffer layer 4b is formed on the lower layer of the channel layer 5b'. The p+ type buffer layer 4b is a p+ type GaAs layer and this layer can prevent a carrier from being leaked to the GaAs substrate 1 from the channel.

Additionally, the lower layers than the p+ type GaAs layer 4 may be designed in such a way that the characteristic of the unit HBT 101 is optimized since they have no influence upon the operation as the FET (the unit FET 102).

The unit element 100 shown in FIG. 24A is a structure in a surface S1' of the unit HBT 101 shown in FIG. 24B is abutted to a surface S1 of the unit FET 102 shown in FIG. 24C. An abutted surface is a surface taken along the line c-c of FIG. 24A. Then, on the source electrode 11 of the unit FET 102, the connection wiring 17 is formed of the wiring metal layer (Ti/Pt/Au). The connection wiring 17 passes the insulating region 20 along the mesa of the unit FET 102 and extends up to the base electrode 8 of the unit HBT 101.

Figure 25A:
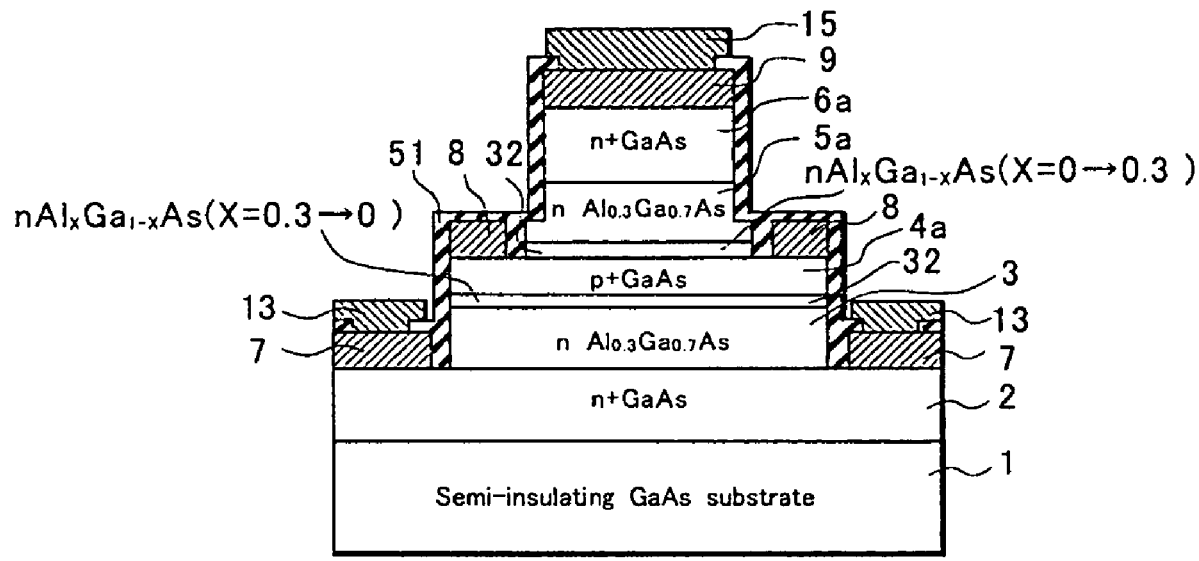
FIGS. 25A to 25B are cross-sectional views for explaining the tenth embodiment of the present invention.
Figure 25B:
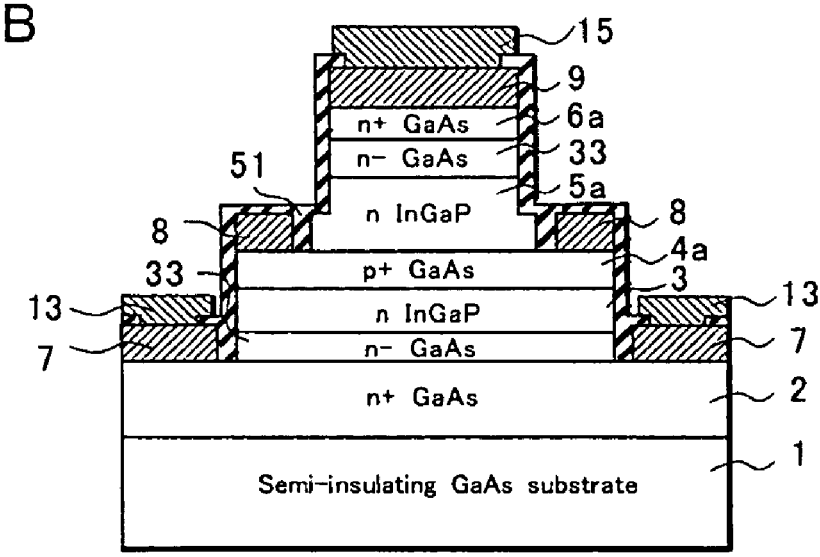

FIGS. 25A to 25C are cross-sectional views explaining the other embodiments of the unit element 100 as the tenth embodiment, and shows only a cross section (corresponding to the line b-b of FIG. 2) of the unit HBT 101.

FIG. 25A is a structure having a grading layer for eliminating a band spike.

For example, an $Al_{0.2}Ga_{0.7}As$ layer is used as the emitter layer 5a and the collector layer 3. Then, a grading layer 32 is formed between the base and the emitter and between the base and the collector. Namely, there is formed an n type $Al_xGa_{1-x}As$ (X=0→0.3) layer in which GaAs is gradually changed to $Al_{0.3}Ga_{0.7}As$ between the base and the emitter and there is formed the n type $Al_xGa_{1-x}As$ (X=0.3→0) layer in which $Al_{0.3}Ga_{0.7}As$ is gradually changed to GaAs between the base and the collector. This makes it possible to more extremely reduce an offset voltage.

FIG. 25B shows a case in which a ballast resistor layer is formed. There is a case in which a secondary breakdown cannot be fully prevented depending on the design of the unit FET 102 and the unit HBT 101 that form the unit element 100. Moreover, the occurrence of the secondary breakdown is not always completely prevented when the extremely large current is made to flow to the unit HBT 101. In such a case, the ballast resistor layer is added to an epitaxial structure of the unit HBT 101, thereby measures against the secondary breakdown may be taken again.

Namely, since the symmetrical HBT is used, an n− type GaAs layer 33, serving as the ballast resistor layer, is formed to the side of the emitter layer 5a and the side of the collector layer 3. The n− type GaAs layer 33 having a predetermined resistance value serves as the ballast resistor layer, and thereby it is possible to prevent the occurrence of the secondary breakdown caused by a current concentration on one of the unit element 100.

The ballast resistor layer 33 may be formed of an undoped GaAs layer, and when the emitter layer 5a and the collector layer 3 are InGaP layers, the ballast resistor layer 33 may be formed of an n− type InGaP layer or an undoped InGaP layer. Moreover, when the emitter layer 5a and the collector layer 3 are AlGaAs layers, the ballast resistor layer 33 may be formed of an n− type AlGaAs layer or an undoped AlGaAs layer. The other semiconductor layers are the same as those of FIG. 24B.

Additionally, in the third, the fourth, the fifth, the sixth, the seventh, and the tenth embodiments, since the unit HBTs 101 used for the switching element are all symmetrical HBTs, the emitters and the collectors of the unit HBTs 101 may be exchanged with each other.

Moreover, although not illustrated, the bias circuit such as a resistance division for adding direct current potential to the emitters and the collectors of the HBTs may be provided in the third, the fourth, the fifth, the sixth, the seventh, and the tenth embodiments, thereby it is possible to freely set the potentials of the emitters and the collectors of the HBTs without limiting to the GND potential.

EFFECT OF THE INVENTION

According to the present embodiments, the HBT and the FET are formed to be adjacent to each other through the isolation region and the source electrode of the MESFET is connected to the base electrode of HBT to form the unit element, and plurality of unit elements are connected to form the switching element to implement the switch circuit device. Namely, in the unit element, MESFET is connected for each base electrode of the comb-tooth like HBT, and HBT and MESFET are formed to be adjacent to each other through the isolation region. Then, in the switching element, the drain electrode of MESFET is connected to the power supply terminal $V_{DD}$ and the current between the collector and the emitter of HBT is changed by the voltage signal input to the gate electrode of MESFET. Since the distance between HBT and MESFET is close to each other, the heat generated by the operation of HBT is transmitted to the MESFET. However, since the drain current of MESFET has the negative temperature coefficient, the base current of HBT of the present embodiments also has the negative temperature coefficient. In other words, the heat generated by HBT reduces the collector current of HBT in the present embodiments.

Accordingly, in the switching element in which plurality of unit elements are connected in parallel, even if the operation current becomes unequal for each unit element, no current concentrates on one unit element, and no destruction is generated by the secondary breakdown. That is, as compared with the conventional HBT, it is possible to largely improve the current density to perform the operation.

Moreover, although the buried gate electrode structure is used to ensure the breakdown voltage in the unit FET, the buried portion is structured not to be diffused to the InGaP layer, and thereby it is possible to prevent Pt from being abnormally diffused. Furthermore, the selection etching can be used for the formation of the emitter mesa, that of the base mesa, that of the ledge in the unit HBT, and the gate recess etching in the unit FET, and a good reproducibility can be obtained.

What is claimed is:

1. An active element comprising:
a compound semiconductor substrate;
a stack of first, second and third semiconductor layers disposed on the substrate; and
a plurality of unit elements connected in parallel, each of the unit elements comprising a first transistor and a second transistor, the first transistor comprising a collector formed of the first semiconductor layer, a base formed of the second semiconductor layer and an emitter formed of the third semiconductor layer, the second and third semiconductor layers forming a heterojunction, the second transistor formed of the semiconductor layers and comprising a gate, a source and a drain, the first and second transistors being isolated by a isolation region, the base of the first transistor being connected with the source of the second transistor, and the drain of the second transistor being connected with a power supply potential, and the isolation region comprising an impurity region formed at least in the first and second semiconductor layers between the first and second transistors, and a wiring being disposed on the isolation region and connecting the base of the first transistor and the source of the second transistor, wherein electrodes of the bases, emitters and collectors are arranged to form a comb-like structure, and a longitudinal direction of teeth of the comb-like structure is different from a longitudinal direction of electrodes of the gates so that the wiring crosses neither an electrode of a collector nor an electrode of an emitter, and the electrodes of the emitters are connected by an emitter wiring running in the longitudinal direction of the electrodes of the gates.

2. The active element of claim 1, further comprising a fourth semiconductor layer disposed on the third semiconductor layer and a fifth semiconductor layer disposed on the fourth semiconductor layer and having an etching rate higher than the fourth semiconductor layer.

3. The active element of claim 1, wherein the drains are connected together, the gates are connected together, the emitters are connected together, and the collectors are connected together.

4. The active element of claim 1, wherein, in each of the unit elements, a channel layer of the second transistor comprises part of the third semiconductor layer.

5. The active element of claim 1, wherein, in each of the unit elements, the first semiconductor layer is at least partially geometrically continuous between the first and second transistors.

6. The active element of claim 1, wherein the second semiconductor layer comprises a p+ type GaAs layer.

7. The active element of claim 1, wherein the third semiconductor layer comprises an InGaP layer.

8. The active element of claim 1, wherein a collector current of the first transistors has a negative temperature coefficient.

9. An active element comprising:
a compound semiconductor substrate;
a stack of first, second and third semiconductor layers disposed on the substrate;
a plurality of unit elements connected in parallel, each of the unit elements comprising a first transistor and a second transistor, the first transistor comprising a collector formed of the first semiconductor layer, a base formed of the second semiconductor layer and an emitter formed of the third semiconductor layer, the second and third semiconductor layers forming a heterojunction, the second transistor formed of the semiconductor layers and comprising a gate, a source and a drain, the first and second transistors being isolated by a isolation region, the base of the first transistor being connected with the source of the second transistor, and the drain of the second transistor being connected with a power supply potential, and the isolation region comprising an impurity region formed at least in the first and second semiconductor layers between the first and second transistors, and a wiring being disposed on the isolation region and connecting the base of the first transistor and the source of the second transistor;

a fourth semiconductor layer disposed on the third semiconductor layer and a fifth semiconductor layer disposed on the fourth semiconductor layer and having an etching rate higher than the fourth semiconductor layer, and wherein electrodes of the bases, emitters and collectors are arranged to form a comb-like structure, and a longitudinal direction of teeth of the comb-like structure is different from a longitudinal direction of electrodes of the gates so that the wiring crosses neither an electrode of a collector nor an electrode of an emitter, and the electrodes of the gates of the second transistors are disposed on the fourth semiconductor layer.

10. The active element of claim 2, wherein electrodes of the gates of the second transistors are partially buried into the fourth semiconductor layer.

11. The active element of claim 1, wherein the gate is disposed between the source and drain.

12. The active element of claim 1, wherein the longitudinal direction of the teeth of the comb-like structure is normal to the longitudinal direction of the electrodes of the gates.

* * * * *